United States Patent
Nosaka

(10) Patent No.: US 10,979,020 B2
(45) Date of Patent: Apr. 13, 2021

(54) ACOUSTIC WAVE FILTER DEVICE, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/412,491

(22) Filed: May 15, 2019

(65) Prior Publication Data

US 2019/0267970 A1   Aug. 29, 2019

Related U.S. Application Data

(63) Continuation of application No. PCT/JP2017/042080, filed on Nov. 22, 2017.

(30) Foreign Application Priority Data

Nov. 25, 2016 (JP) .............................. JP2016-229324

(51) Int. Cl.
*H03H 9/64* (2006.01)
*H03H 9/72* (2006.01)
(Continued)

(52) U.S. Cl.
CPC .......... *H03H 9/54* (2013.01); *H03H 9/02007* (2013.01); *H03H 9/145* (2013.01);
(Continued)

(58) Field of Classification Search
CPC ................................................ H03H 9/54–76
See application file for complete search history.

(56) References Cited

U.S. PATENT DOCUMENTS 6,472,953 B1   10/2002   Sakuragawa et al.
6,909,338 B2 *  6/2005   Omote ................... H03H 9/542
                                                   333/133
(Continued)

FOREIGN PATENT DOCUMENTS

JP   2000-323961 A   11/2000
JP   2008-067289 A    3/2008
(Continued)

OTHER PUBLICATIONS

Official Communication issued in International Patent Application No. PCT/JP2017/042080, dated Feb. 13, 2018.

*Primary Examiner* — Dean O Takaoka
*Assistant Examiner* — Alan Wong
(74) *Attorney, Agent, or Firm* — Keating & Bennett, LLP

(57) ABSTRACT

An acoustic wave filter includes series arm resonators, and a parallel arm resonator provided in a second path connecting a ground and a node connecting the series arm resonators. Each of the series arm resonators includes a piezoelectric body and an interdigital transducer electrode. One of the series arm resonators includes a second adjusting film that adjusts Ksaw. An anti-resonant frequency of the other one of the series arm resonators is higher than an anti-resonant frequency of the one of series arm resonators. An adjusting film that adjusts Ksaw is not provided in the other one of series arm resonators, or when a first adjusting film that adjusts Ksaw is provided in the other one of the series arm resonators, the first adjusting film is thinner than the second adjusting film.

10 Claims, 31 Drawing Sheets

(51) Int. Cl.
*H03H 9/54* (2006.01)
*H03H 9/02* (2006.01)
*H03H 9/205* (2006.01)
*H03H 9/70* (2006.01)
*H03H 9/145* (2006.01)
*H04B 1/58* (2006.01)
*H04B 1/52* (2015.01)
*H04B 1/00* (2006.01)

(52) U.S. Cl.
CPC .............. *H03H 9/205* (2013.01); *H03H 9/64* (2013.01); *H03H 9/706* (2013.01); *H03H 9/72* (2013.01); *H03H 9/725* (2013.01); *H04B 1/00* (2013.01); *H04B 1/52* (2013.01); *H04B 1/58* (2013.01)

(56) References Cited

U.S. PATENT DOCUMENTS

| | | | | |
|---|---|---|---|---|
| 7,564,174 | B2* | 7/2009 | Matsuda | H03H 9/0038 310/313 R |
| 7,688,161 | B2* | 3/2010 | Miura | H03H 9/6483 310/313 B |
| 8,242,861 | B2* | 8/2012 | Yata | H03H 9/6483 333/193 |
| 8,773,221 | B2* | 7/2014 | Nakahashi | H03H 9/14594 333/195 |
| 9,124,240 | B2* | 9/2015 | Shimizu | H03H 9/14594 |
| 9,197,194 | B2* | 11/2015 | Reedy | H03K 17/102 |
| 9,300,038 | B2* | 3/2016 | Burgener | H03H 7/40 |
| 10,249,812 | B2* | 4/2019 | Satoh | H01L 41/107 |
| 10,566,951 | B2* | 2/2020 | Nosaka | H03F 3/19 |
| 2008/0061657 | A1 | 3/2008 | Matsuda et al. | |
| 2010/0207707 | A1 | 8/2010 | Yata | |
| 2012/0032753 | A1 | 2/2012 | Nishimura et al. | |
| 2017/0012651 | A1* | 1/2017 | Ella | H04B 1/0064 |

FOREIGN PATENT DOCUMENTS

| | | |
|---|---|---|
| JP | 2008-271187 A | 11/2008 |
| JP | 2013-168996 A | 8/2013 |
| JP | 2015-041909 A | 3/2015 |
| WO | 2009/119007 A1 | 10/2009 |
| WO | 2015/128005 A1 | 9/2015 |

* cited by examiner fas1 > fas2
Ksaw ADJUSTING FILM THICKNESS (s1) < Ksaw ADJUSTING FILM THICKNESS (s2)
frp1 < frp2
Ksaw ADJUSTING FILM THICKNESS (p1) < Ksaw ADJUSTING FILM THICKNESS (p2)

frp1 > frp2
Ksaw ADJUSTING FILM THICKNESS (p1) < Ksaw ADJUSTING FILM THICKNESS (p2)

Ksaw ADJUSTING FILM THICKNESS $t_{p1}$ < Ksaw ADJUSTING FILM THICKNESS $t_{p2}$

ELECTRODE FINGER CROSS SECTION OF PARALLEL ARM RESONATOR p1
ELECTRODE FINGER CROSS SECTION OF PARALLEL ARM RESONATOR p2

ELECTROSTATIC CAPACITY (s1) < ELECTROSTATIC CAPACITY (s2)
fas1 > fas2
Ksaw ADJUSTING FILM THICKNESS (s1) < Ksaw ADJUSTING FILM THICKNESS (s2)

ELECTROSTATIC CAPACITY (s1h) < ELECTROSTATIC CAPACITY (s2h)
ELECTROSTATIC CAPACITY (s1) < ELECTROSTATIC CAPACITY (s2)

ACOUSTIC WAVE FILTER DEVICE, MULTIPLEXER, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-229324 filed on Nov. 25, 2016 and is a Continuation Application of PCT Application No. PCT/JP2017/042080 filed on Nov. 22, 2017. The entire contents of each of these applications are hereby incorporated herein by reference.

BACKGROUND OF THE INVENTION

1. Field of the Invention

The present invention relates to an acoustic wave filter device, a multiplexer, a radio-frequency front-end circuit, and a communication device that include acoustic wave resonators.

2. Description of the Related Art

Acoustic wave filters that use acoustic waves are widely used as band pass filters that are disposed at the front-end portions of mobile communication devices, or other filters. To support multifunctionality, such as multiband/multimode functionality, radio-frequency front-end circuits each including a plurality of acoustic wave filters are in actual use.

Acoustic wave filters that support multiband functionality are required to have a wide band and high steepness. Japanese Unexamined Patent Application Publication No. 2013-168996 describes the configuration of an acoustic wave filter that is a component of an antenna duplexer that has a small loss over a wide band and steep attenuation characteristics. More specifically, the frequency relationship between the resonant frequencies of two series resonators of the acoustic wave filter, the frequency relationship between the anti-resonant frequencies of the two series resonators, and the magnitude relationship between the electromechanical coupling coefficients of the two series resonators are determined.

However, in the acoustic wave filter described in Japanese Unexamined Patent Application Publication No. 2013-168996, adjustment of the electromechanical coupling coefficients of the two series arm resonators (series resonators) is made with a method of adding a capacitor to acoustic wave resonators by thinning or weighting interdigital transducer electrodes, so the adjustable ranges of the electromechanical coupling coefficient are narrow, and the quality factors at the anti-resonant frequencies decrease.

When the adjustable ranges of the electromechanical coupling coefficients of the two series arm resonators are narrow, the difference between the frequencies of two attenuation poles respectively formed by the two series arm resonators is not increased very much, such that a stop band width on the higher side of a pass band is not widened very much, with the result that attenuation is insufficient. In addition, when the quality factors at the anti-resonant frequencies are low, a loss in the pass band gets worse. On the other hand, when the adjustable ranges of the electromechanical coupling coefficients of two parallel arm resonators are narrow, the difference between the frequencies of two attenuation poles that are respectively formed by the two parallel arm resonators is not increased very much, such that a stop band width on the lower side of the pass band is not widened very much, with the result that attenuation is insufficient.

SUMMARY OF THE INVENTION

Preferred embodiments of the present invention provide acoustic wave filter devices, multiplexers, radio-frequency front-end circuits, and communication devices that are each able to improve attenuation with an increased stop band width on the higher side or lower side of a pass band and are each able to reduce a loss in the pass band.

An acoustic wave filter device according to a preferred embodiment of the present invention includes a first input/output terminal, a second input/output terminal, a first series arm resonator, a second series arm resonator, and a first parallel arm resonator. The first series arm resonator and the second series arm resonator are provided in a first path connecting the first input/output terminal and the second input/output terminal, and are acoustic wave resonators. The first parallel arm resonator is provided in a second path connecting a ground and a first node. The first node connects the first series arm resonator and the second series arm resonator. Each of the first series arm resonator and the second series arm resonator includes at least a piezoelectric body and an interdigital transducer electrode. Of the first series arm resonator and the second series arm resonator, at least the second series arm resonator includes a second adjusting film between the piezoelectric body and the interdigital transducer electrode. The second adjusting film adjusts an electromechanical coupling coefficient. An anti-resonant frequency of the first series arm resonator is higher than an anti-resonant frequency of the second series arm resonator. An adjusting film that adjusts an electromechanical coupling coefficient is not provided between the piezoelectric body and interdigital transducer electrode of the first series arm resonator, or, when a first adjusting film that adjusts an electromechanical coupling coefficient is provided between the piezoelectric body and interdigital transducer electrode of the first series arm resonator, the first adjusting film is thinner than the second adjusting film.

The resonant frequency of a series arm resonator determines bandpass characteristics in a filter pass band, and the anti-resonant frequency determines attenuation characteristics on the higher side of the filter pass band. From this viewpoint, in filter characteristics having a reduced electromechanical coupling coefficient due to thickening of the adjusting film of any of the series arm resonators, steepness (crispness) on the higher side of the pass band is ensured. However, sufficient attenuation is not obtained because of a rebound at higher frequencies than an attenuation pole on the higher frequency side of the pass band. On the other hand, in filter characteristics having an increased electromechanical coupling coefficient due to reducing the thickness (or omission) of the adjusting film of any of the series arm resonators, the pass band width of the filter is wide and the steepness (crispness) is low, and sufficient attenuation is not obtained in a stop band.

In contrast, with the above-described configuration, the electromechanical coupling coefficients of the two series arm resonators are varied with the adjusting films having different film thicknesses. Therefore, when the resonant frequencies of the two series arm resonators are substantially coincident with each other to ensure the bandpass characteristics, the anti-resonant frequency of the first series arm resonator is able to be made higher than the anti-resonant frequency of the second series arm resonator. Thus, since two attenuation poles, that is, the attenuation pole that is provided by the first series arm resonator (on the higher frequency side near a stop band) and the attenuation pole that is provided by the second series arm resonator (on the lower frequency side near the stop band), are around the stop band on the higher side of the pass band, a wide stop band on the higher side of the pass band is ensured while steepness on the higher side of the pass band is ensured by the attenuation pole of the second series arm resonator, and sufficient attenuation is obtained.

An acoustic wave filter device according to a preferred embodiment of the present invention may further include a second parallel arm resonator provided in a third path connecting the ground and a second node in the first path. Each of the first parallel arm resonator and the second parallel arm resonator may include at least a piezoelectric body and an interdigital transducer electrode. At least one of the first parallel arm resonator and the second parallel arm resonator may include a fourth adjusting film between the piezoelectric body and the interdigital transducer electrode. The fourth adjusting film adjusts an electromechanical coupling coefficient. A resonant frequency of another one of the first parallel arm resonator and the second parallel arm resonator may be lower than a resonant frequency of the one of the first parallel arm resonator and the second parallel arm resonator. An adjusting film that adjusts an electromechanical coupling coefficient need not be provided between the piezoelectric body and interdigital transducer electrode of the another one of the first parallel arm resonator and the second parallel arm resonator, or, when a third adjusting film that adjusts an electromechanical coupling coefficient is provided between the piezoelectric body and interdigital transducer electrode of the another one of the first parallel arm resonator and the second parallel arm resonator, the third adjusting film may be thinner than the fourth adjusting film.

The anti-resonant frequency of a parallel arm resonator determines bandpass characteristics within a filter pass band, and the resonant frequency determines attenuation characteristics on the lower side of the filter pass band. From this viewpoint, in filter characteristics having a reduced electromechanical coupling coefficient due to thickening of the adjusting film of any of the parallel arm resonators, steepness (crispness) on the lower side of the pass band is ensured. However, sufficient attenuation is not obtained because of a rebound at lower frequencies than an attenuation pole on the lower side of the pass band. On the other hand, in filter characteristics having an increased electromechanical coupling coefficient due to reducing the thickness (omission) of the adjusting film of any of the parallel arm resonators, the pass band width of the filter is wide and the steepness (crispness) is low, and sufficient attenuation is not obtained in a stop band.

In contrast, with the above-described configuration, the electromechanical coupling coefficients of the two parallel arm resonators are varied by the adjusting films of the two parallel arm resonators, having different film thicknesses. Therefore, when the anti-resonant frequencies of the two parallel arm resonators are substantially coincident with each other to ensure the bandpass characteristics, the resonant frequency of the first parallel arm resonator and the resonant frequency of the second parallel arm resonator are able to be varied. Thus, since two attenuation poles, that is, the attenuation pole that is provided by the one of the first parallel arm resonator and the second parallel arm resonator (on the higher side near a stop band) and the attenuation pole that is provided by the another one of the first parallel arm resonator and the second parallel arm resonator (on the lower side near the stop band), are around the stop band on the lower side of the pass band, a wide stop band on the higher side of the pass band and a wide stop band on the lower side of the pass band are ensured, and sufficient attenuation is obtained.

The first series arm resonator or the second series arm resonator may be disposed between the first node and the second node.

With this configuration, the two parallel arm resonators are connected to each other via the series arm resonator, so the resonant characteristics of the two parallel arm resonators are able to be effectively varied. Thus, a wider stop band on the lower side of the pass band is ensured, and sufficient attenuation is obtained.

A film thickness of the second adjusting film may be equal or substantially equal to a film thickness of the fourth adjusting film, and the adjusting film need not be provided in any of the first series arm resonator and the another one of the first parallel arm resonator and the second parallel arm resonator, or a film thickness of the first adjusting film may be equal or substantially equal to a film thickness of the third adjusting film.

With this configuration, adjusting films that are respectively provided in the two series arm resonators and the two parallel arm resonators have film thicknesses of less than or equal to two types, so manufacturing process is simplified.

An acoustic wave filter device according to a preferred embodiment of the present invention includes a first input/output terminal, a second input/output terminal, a first series arm resonator, a first parallel arm resonator, and a second parallel arm resonator. The first series arm resonator is provided in a first path connecting the first input/output terminal and the second input/output terminal, and is an acoustic wave resonator. The first parallel arm resonator is provided in a second path connecting a ground and a first node in the first path. The second parallel arm resonator is provided in a third path connecting the ground and a second node in the first path. Each of the first parallel arm resonator and the second parallel arm resonator includes at least a piezoelectric body and an interdigital transducer electrode. At least one of the first parallel arm resonator and the second parallel arm resonator includes a fourth adjusting film between the piezoelectric body and the interdigital transducer electrode. The fourth adjusting film adjusts an electromechanical coupling coefficient. A resonant frequency of another one of the first parallel arm resonator and the second parallel arm resonator is lower than a resonant frequency of the one of the first parallel arm resonator and the second parallel arm resonator. An adjusting film that adjusts an electromechanical coupling coefficient is not provided between the piezoelectric body and interdigital transducer electrode of the another one of the first parallel arm resonator and the second parallel arm resonator, or, when a third adjusting film that adjusts an electromechanical coupling coefficient is provided between the piezoelectric body and interdigital transducer electrode of the other one of the first parallel arm resonator and the second parallel arm resonator, the third adjusting film is thinner than the fourth adjusting film.

The anti-resonant frequency of a parallel arm resonator determines bandpass characteristics within a filter pass band, and the resonant frequency determines attenuation characteristics on the lower side of the filter pass band. From this viewpoint, in filter characteristics having a reduced electromechanical coupling coefficient due to thickening of the adjusting film of any of the parallel arm resonators, steepness (crispness) on the lower side of the pass band is ensured. However, sufficient attenuation is not obtained because of a rebound at lower frequencies than an attenuation pole on the lower side of the pass band. On the other hand, in filter characteristics having an increased electromechanical coupling coefficient due to reducing the thickness (omission) of the adjusting film of any of the parallel arm resonators, the pass band width of the filter is wide and the steepness (crispness) is low, and sufficient attenuation is not obtained in a stop band.

In contrast, with the above-described configuration, the electromechanical coupling coefficients of the two parallel arm resonators are varied by the adjusting films having different film thicknesses. Therefore, when the anti-resonant frequencies of the two parallel arm resonators are substantially coincident with each other to ensure the bandpass characteristics, the resonant frequency of the another one of the first parallel arm resonator and the second parallel arm resonator is able to be made lower than the resonant frequency of the one of the first parallel arm resonator and the second parallel arm resonator. Thus, since two attenuation poles, that is, the attenuation pole that is provided by the another one of the first parallel arm resonator and the second parallel arm resonator (on the lower side near a stop band) and the attenuation pole that is provided by the one of the first parallel arm resonator and the second parallel arm resonator (on the higher side near the stop band), are around the stop band on the lower side of the pass band, a wide stop band on the lower side of the pass band is ensured by the attenuation pole of the another one of the first parallel arm resonator and the second parallel arm resonator while steepness on the lower side of the pass band is ensured by the attenuation pole of the one of the first parallel arm resonator and the second parallel arm resonator, and sufficient attenuation is obtained.

The first series arm resonator may be disposed between the first node and the second node.

With this configuration, the two parallel arm resonators are connected to each other via the first series arm resonator, such the resonant characteristics of the two parallel arm resonators are able to be effectively varied. Thus, an even wider stop band on the lower side of the pass band is ensured, and sufficient attenuation is obtained.

An acoustic wave filter device according to a preferred embodiment of the present invention may further include a variable frequency circuit connected to the first parallel arm resonator and configured to change a pass band provided by at least the first series arm resonator and the first parallel arm resonator. The variable frequency circuit may be connected in series with the first parallel arm resonator. The variable frequency circuit may include an impedance element connected to the first parallel arm resonator, and a switch element configured to switch a conduction path of the variable frequency circuit.

With this configuration, a tunable filter that ensures a wide stop band on the higher side of the pass band and that has a variable pass band is obtained.

When the resonant band width of the first parallel arm resonator is widened by omitting the adjusting film of the first parallel arm resonator or reducing the thickness of the adjusting film of the first parallel arm resonator as compared to the thickness of the adjusting film of the second parallel arm resonator, the variable frequency circuit has a wide variable frequency width.

A multiplexer according to a preferred embodiment of the present invention includes a common terminal, an acoustic wave filter device according to a preferred embodiment of the present invention, and a second filter whose pass band is at higher frequencies than a pass band of the acoustic wave filter device. The first input/output terminal and the other filter circuit are connected to the common terminal. The first series arm resonator is connected to the first input/output terminal. An electrostatic capacitance of the first series arm resonator is less than an electrostatic capacitance of the second series arm resonator.

With this configuration, while a bulk wave loss that arises in the acoustic wave filter device is reduced, a loss in the pass band of the second filter is effectively reduced.

The second filter may include a third input/output terminal, a fourth input/output terminal, a third series arm resonator, and a fourth series arm resonator. The third series arm resonator and the fourth series arm resonator may be provided in a fourth path connecting the third input/output terminal and the fourth input/output terminal, and may be acoustic wave resonators. The third input/output terminal may be connected to the common terminal. The third series arm resonator may be connected to the third input/output terminal. An electrostatic capacitance of the third series arm resonator may be less than an electrostatic capacitance of the fourth series arm resonator.

With this configuration, since the impedance of the third series arm resonator disposed closest to the common terminal is higher than the fourth series arm resonator in the second filter, a reflection coefficient in the pass band of the acoustic wave filter device increases in the second filter. Thus, an insertion loss in the pass band of the acoustic wave filter device is reduced.

A radio-frequency front-end circuit according to a preferred embodiment of the present invention includes an acoustic wave filter device according to a preferred embodiment of the present invention and an amplifier circuit connected to the acoustic wave filter device.

With this configuration, a radio-frequency front-end circuit including an acoustic wave filter device having a wide stop band and sufficient attenuation is provided.

A communication device according to a preferred embodiment of the present invention includes an RF signal processing circuit configured to process a radio-frequency signal that is transmitted or received by an antenna element, and a radio-frequency front-end circuit according to a preferred embodiment of the present invention configured to transfer the radio-frequency signal between the antenna element and the RF signal processing circuit.

With this configuration, a communication device including an acoustic wave filter device having a wide stop band and sufficient attenuation is provided.

According to preferred embodiments of the present invention, it is possible to provide acoustic wave filter devices, multiplexers, radio-frequency front-end circuits, and communication devices that are each able to obtain sufficient attenuation while ensuring high steepness at a lower-frequency edge or higher-frequency edge of a pass band and a wide stop band width near the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
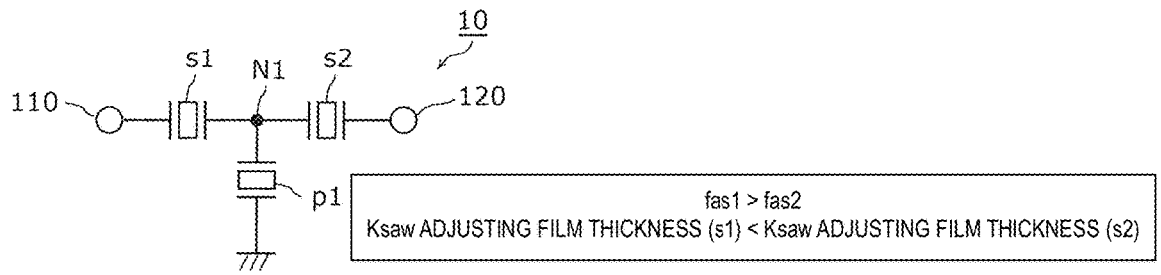
FIG. 1A is a basic circuit configuration diagram of an acoustic wave filter according to a first preferred embodiment of the present invention.

Preferred embodiments of the present invention will be described in detail with reference to Examples and the drawings. Each of the preferred embodiments that will be described below is a comprehensive or specific example. Numeric values, shapes, materials, elements, disposition and connection structures of the elements, and other elements and features, that will be described below are illustrative, and are not intended to limit the scope of the present invention. Of the elements in the following preferred embodiments, the elements not included in the independent claims will be described as optional elements. In addition, the size or size ratio of elements shown in the drawings is not necessarily strict. In the drawings, like reference signs denote the same or substantially the same components, and the overlapping description may be omitted or simplified.

In the following description, the term "lower edge of a pass band" means the lowest frequency in a pass band. The term "higher edge of a pass band" means the highest frequency in a pass band. In the following description, the term "lower side of a pass band" means frequencies outside a pass band and lower than the pass band. The term "higher side of a pass band" means frequencies outside a pass band and higher than the pass band. In the following description, the lower frequency side may be referred to as lower side, and the higher frequency side may be referred to as higher side.

In the following preferred embodiments, a parallel arm circuit is defined as follows. A parallel arm circuit is a circuit disposed between a ground and a node in a path that connects a first input/output terminal and a second input/output terminal.

First Preferred Embodiment

FIG. 1A is a basic circuit configuration diagram of an acoustic wave filter 10 according to a first preferred embodiment of the present invention. The acoustic wave filter 10 is preferably, for example, a radio-frequency filter circuit that is disposed at a front-end portion of a cellular phone that supports multiband/multimode functionality. The acoustic wave filter 10 is preferably, for example, provided in a front-end circuit of a cellular phone or other devices that support LTE (Long Term Evolution). The acoustic wave filter 10 allows radio-frequency signals of a Band (frequency band) regulated by 3GPP (Third Generation Partnership Project), and filters (attenuates) unnecessary radio-frequency signals that affect communication. The acoustic wave filter 10 filters unnecessary radio-frequency signals that affect communication with the use of acoustic wave resonators.

As shown in FIG. 1A, the acoustic wave filter 10 includes series arm resonators s1, s2, a parallel arm resonator p1, and input/output terminals 110, 120.

The series arm resonators s1, s2 are respectively a first series arm resonator and a second series arm resonator, each of which is an acoustic wave resonator and provided in a first path that connects the input/output terminals 110, 120.

The parallel arm resonator p1 is a first parallel arm resonator provided in a second path that connects a ground and a node N1 (first node). The node N1 connects the series arm resonators s1, s2.

Figure 1B:
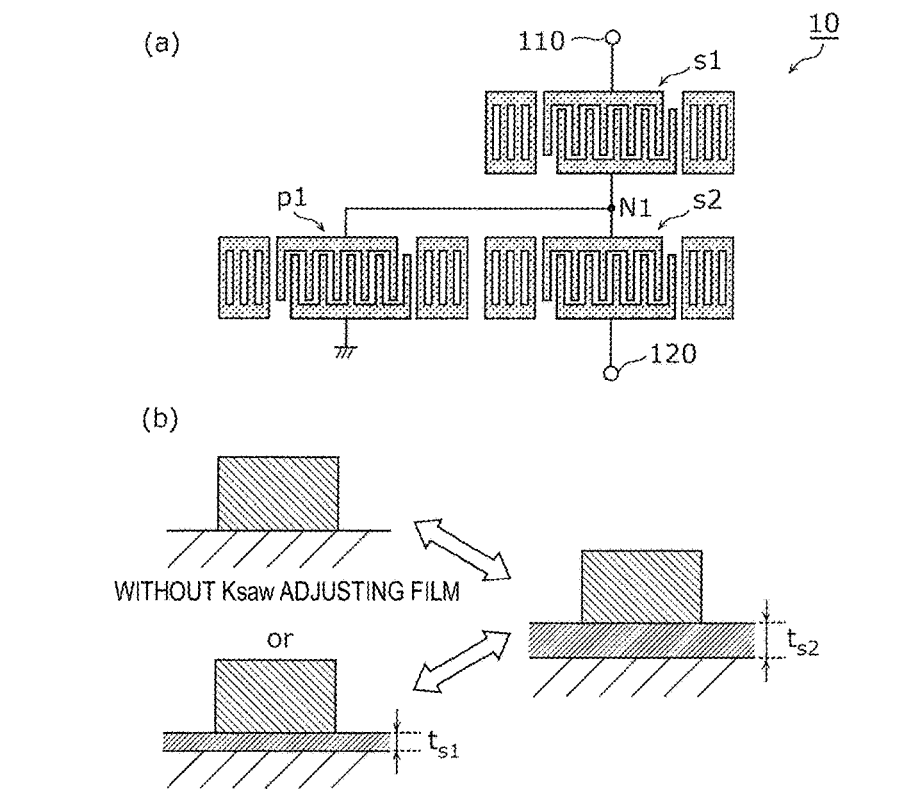
FIG. 1B shows a plan view of the electrode layout of the acoustic wave filter and an interdigital transducer electrode cross-sectional view according to the first preferred embodiment of the present invention.

FIG. 1B shows a plan view of the electrode layout of the acoustic wave filter 10 and an IDT (interdigital transducer) electrode cross section. Part (a) of FIG. 1B is a schematic plan view of an interdigital transducer electrode and reflectors of each of the resonators of the acoustic wave filter 10. Part (b) of FIG. 1B shows the schematic cross-sectional views of the series arm resonators s1, s2.

The series arm resonator s2 includes a second adjusting film between a piezoelectric body and the interdigital transducer electrode. The second adjusting film adjusts an electromechanical coupling coefficient (hereinafter, referred to as Ksaw). The anti-resonant frequency (fas1) of the series arm resonator s1 is higher than the anti-resonant frequency (fas2) of the series arm resonator s2 (fas1>fas2). In addition, as shown in part (b) of FIG. 1B, an adjusting film that adjusts Ksaw is not provided between the piezoelectric body and interdigital transducer electrode of the series arm resonator s1 (without a Ksaw adjusting film), or, when a first adjusting film that adjusts Ksaw is provided between the piezoelectric body and interdigital transducer electrode of the series arm resonator s1, the first adjusting film is thinner than the second adjusting film (the film thickness $t_{s1}$ of the first adjusting film is less than the film thickness $t_{s2}$ of the second adjusting film). In the present preferred embodiment, the fact that the first adjusting film is thinner than the second adjusting film means that, for example, in consideration of about 4.0 nm that is the processing accuracy of an adjusting film, the film thickness of the first adjusting film is preferably less by about 4.0 nm or more than the second adjusting film.

The resonant frequency of a resonator is a frequency at a resonant point that is a singular point at which the impedance of the resonator is a local minimum (ideally, a point at which the impedance is zero). The anti-resonant frequency of a resonator is a frequency at an anti-resonant point that is a singular point at which the impedance of the resonator is a local maximum (ideally, a point at which the impedance is infinite). In the following description, not only for a single resonator, but also for a plurality of resonators or a circuit including a resonator and an impedance element, for the sake of convenience, a singular point at which the impedance is a local minimum (ideally, a point at which the impedance is zero) is referred to as resonant point, and the frequency at the resonant point is referred to as resonant frequency. A singular point at which the impedance is a local maximum (ideally, a point at which the impedance is infinite) is referred to as anti-resonant point, and the frequency at the anti-resonant point is referred to as anti-resonant frequency.

With this configuration, while steepness on the higher side of a pass band is ensured by the attenuation pole of the series arm resonator s2, a wide stop band on the higher side of the pass band is ensured, and sufficient attenuation is obtained in the stop band.

Figure 2A:
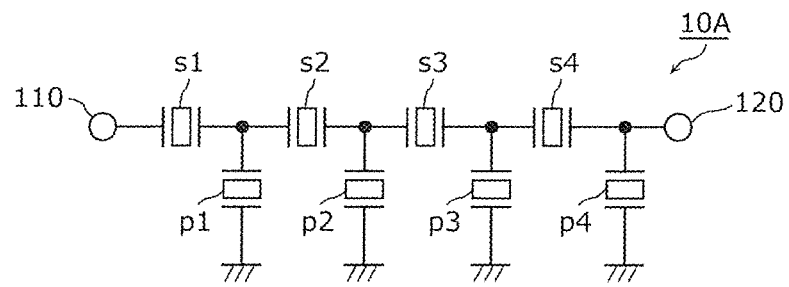
FIG. 2A is a circuit configuration diagram of an acoustic wave filter according to a first modification of the first preferred embodiment of the present invention.

FIG. 2A is a circuit configuration diagram of an acoustic wave filter 10A according to a first modification of the first preferred embodiment. As shown in FIG. 2A, the acoustic wave filter 10A includes the series arm resonators s1, s2, series arm resonators s3, s4, the parallel arm resonator p1, parallel arm resonators p2 to p4, and the input/output terminals 110, 120. The acoustic wave filter device according to the present modification, as in the case of the acoustic wave filter 10A, may preferably be, for example, a ladder acoustic wave filter including three or more series arm resonators and two or more parallel arm resonators.

Figure 2B:
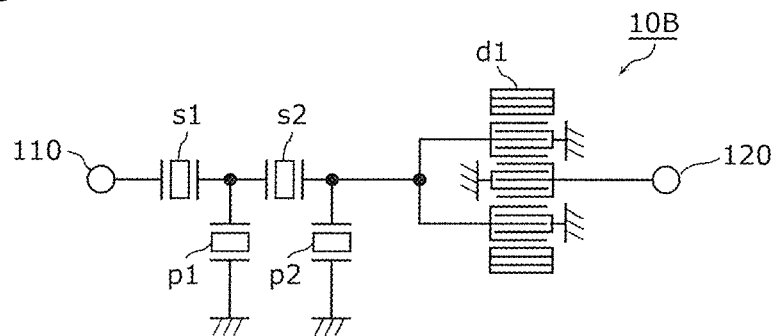
FIG. 2B is a circuit configuration diagram of an acoustic wave filter according to a second modification of the first preferred embodiment of the present invention.

FIG. 2B is a circuit configuration diagram of an acoustic wave filter 10B according to a second modification of the first preferred embodiment. As shown in the diagram, the acoustic wave filter 10B includes the series arm resonators s1, s2, the parallel arm resonators p1, p2, a longitudinally-coupled resonator d1, and the input/output terminals 110, 120. The acoustic wave filter device according to the present modification, as in the case of the acoustic wave filter 10B, may preferably include, for example, the longitudinally-coupled resonator d1 including a plurality of acoustic wave resonators disposed side by side in an acoustic wave propagation direction. Furthermore, the series arm resonator s2 and the longitudinally-coupled resonator d1 may be directly connected without the series arm resonator s2 and the parallel arm resonator p2. In this case, any one of the plurality of acoustic wave resonators of the longitudinally-coupled resonator d1 defines and functions as the series arm resonator s2 shown in FIG. 1A. In this case, the input/output terminal 120 may be a balanced terminal.

In the acoustic wave filters shown in FIG. 1A, FIGS. 2A, and 2B, each of the series arm resonators and the parallel arm resonators may include two or more serially-divided acoustic wave resonators. In this case, the above-described relationships in the Ksaw adjusting film and the anti-resonant frequency are applied on the assumption that the two or more serially-divided acoustic wave resonators are regarded as a single series arm resonator or a single parallel arm resonator.

Figure 3:
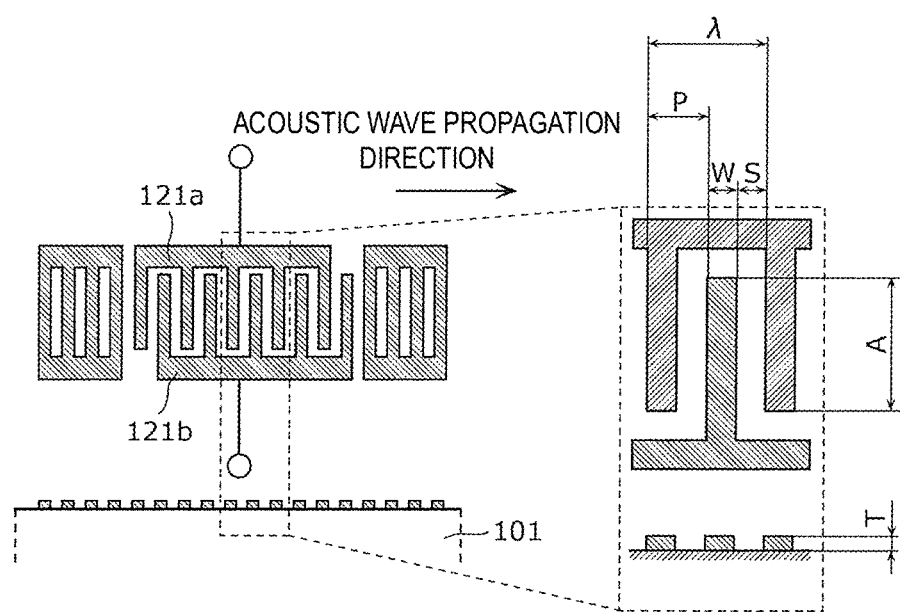
FIG. 3 shows a plan view and cross-sectional view of the electrode configuration of the acoustic wave filter according to the first preferred embodiment of the present invention.

FIG. 3 shows a plan view and cross-sectional view of the electrode configuration of the acoustic wave filter 10 according to the first preferred embodiment. FIG. 3 illustrates the schematic plan view and schematic cross-sectional view of the structure of each of the resonators of the acoustic wave filter 10. The resonator shown in FIG. 3 is for illustrating a typical structure of each of the plurality of resonators. The number, length, and other parameters of electrode fingers of the electrode are not limited thereto. The interdigital transducer electrode shown in FIG. 3 includes a pair of comb electrodes 121a, 121b facing each other. Each of the comb electrodes 121a, 121b includes a plurality of electrode fingers parallel or substantially parallel to one another, and a busbar connecting the plurality of electrode fingers. The plurality of electrode fingers extend along a direction perpendicular or substantially perpendicular to the propagation direction. A reflector is provided on each side of the interdigital transducer electrode. The reflector may include weights or the reflector need not be provided.

Figure 4A:
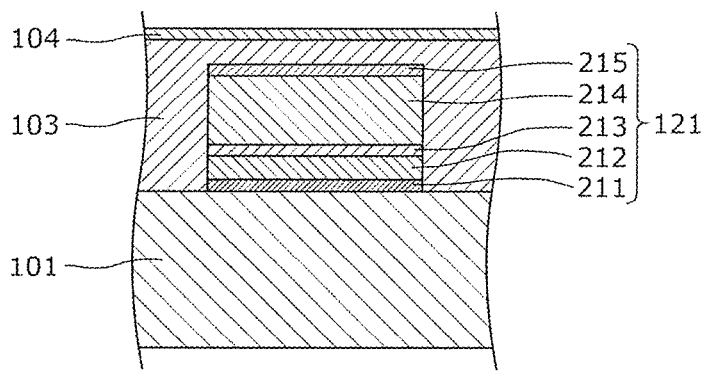
FIG. 4A is a cross-sectional view showing a first example of the cross-sectional structure of an interdigital transducer electrode in the first preferred embodiment of the present invention.

FIG. 4A is a cross-sectional view showing a first example of the cross-sectional structure of an interdigital transducer electrode 121 in the first preferred embodiment.

As shown in FIG. 4A, in the present preferred embodiment, the interdigital transducer electrode 121 preferably includes, for example, in order from a substrate 101 side, a metal film 211 made of NiCr, a metal film 212 made of Pt, a metal film 213 made of Ti, a metal film 214 made of AlCu, and a metal film 215 made of Ti that are laminated.

At this time, the substrate 101 is preferably made of piezoelectric monocrystal, for example. The substrate 101 only needs to be a substrate, at least a portion of which has piezoelectricity. The substrate having piezoelectricity is a substrate, at least the surface of which has piezoelectricity. The substrate may preferably be, for example, a multilayer body including a piezoelectric thin film at its surface, a film having an acoustic velocity different from that of the piezoelectric thin film, a support substrate, and other suitable structure. The substrate may be, for example, (1) a multilayer body including a high acoustic velocity support substrate, and a piezoelectric thin film provided on the high acoustic velocity support substrate, (2) a multilayer body including a high acoustic velocity support substrate, a low acoustic velocity film provided on the high acoustic velocity support substrate, and a piezoelectric thin film provided on the low acoustic velocity film, or (3) a multilayer body including a support substrate, a high acoustic velocity film provided on the support substrate, a low acoustic velocity film provided on the high acoustic velocity film, and a piezoelectric thin film provided on the low acoustic velocity film. The entire substrate may have piezoelectricity.

The interdigital transducer electrode 121 may be covered with a Ksaw adjusting film that protects the interdigital transducer electrode 121 from external environments and that adjusts the band width ratio (electromechanical coupling coefficient) of the resonator. In the present preferred embodiment, the Ksaw adjusting film is preferably provided, for example, such that, in order from the substrate 101 side, a protective layer 103 made of $SiO_2$ and a protective layer 104 made of SiN are laminated. The Ksaw adjusting film also has the function of, for example, adjusting frequency-temperature characteristics and improving moisture resistance.

Figure 4B:
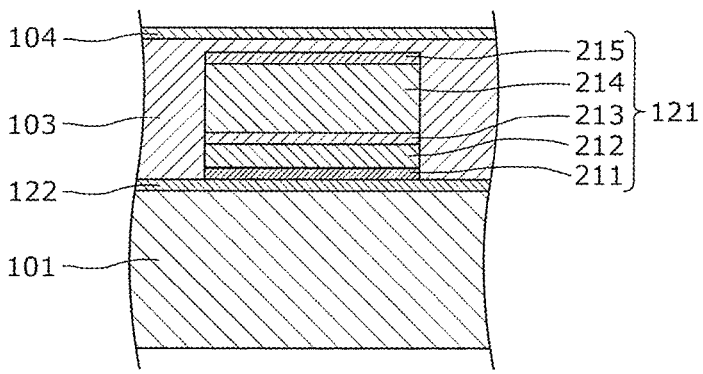
FIG. 4B is a cross-sectional view showing a second example of the cross-sectional structure of the interdigital transducer electrode in the first preferred embodiment of the present invention.

FIG. 4B is a cross-sectional view showing a second example of the cross-sectional structure of the interdigital transducer electrode 121 in the first preferred embodiment. As shown in FIG. 4B, a Ksaw adjusting film 122 that adjusts the band width ratio (electromechanical coupling coefficient) of the resonator is provided between the interdigital transducer electrode 121 and the substrate 101. The Ksaw adjusting film 122 is preferably made of, for example, $SiO_2$.

In the interdigital transducer electrode structure shown in FIG. 4A and FIG. 4B, as the film thickness of the Ksaw adjusting film 122 is increased, the band width ratio (electromechanical coupling coefficient) of the resonator is reduced. As the film thickness of the Ksaw adjusting film (the protective layer 103 and the protective layer 104) is increased, the band width ratio (electromechanical coupling coefficient) of the resonator is reduced.

The structure of the interdigital transducer electrode 121 is not limited to the structures of FIG. 4A and FIG. 4B. The structure of the interdigital transducer electrode 121 may be the structure of FIG. 4C. The interdigital transducer electrode 121 shown in FIG. 4C includes the metal film 213 and metal film 214.

The substrate 101 is preferably made of, for example, piezoelectric monocrystal. A protective layer 123 having a film thickness less than that of the protective layer 103 is provided.

These configurations are examples, and the configuration of the interdigital transducer electrode 121 is not limited thereto. For example, the interdigital transducer electrode 121 may not have a multilayer structure of metal films, but instead, may include a monolayer of a metal film. The materials of the metal films and protective layers are not limited to the above-described materials. The interdigital transducer electrode 121 may preferably be made of, for example, a metal, such as Ti, Al, Cu, Pt, Au, Ag, and Pd, or an alloy of the metal, or may include a plurality of multilayer bodies made of the above-described metal or alloy. The substrate 101 may preferably be made of, for example, $KNbO_3$ piezoelectric monocrystal, crystal, or piezoelectric ceramics. The configurations of the protective layer and the adjusting film to adjust the band width ratio (electromechanical coupling coefficient) are not limited to the above-described configurations. The protective layer and the adjusting film may be made of, for example, a dielectric or insulator such as $SiO_2$, SiN, AlN, polyimide, and a multilayer body including some of these substances. The protective layers 103, 104 need not be included.

Figure 4C:
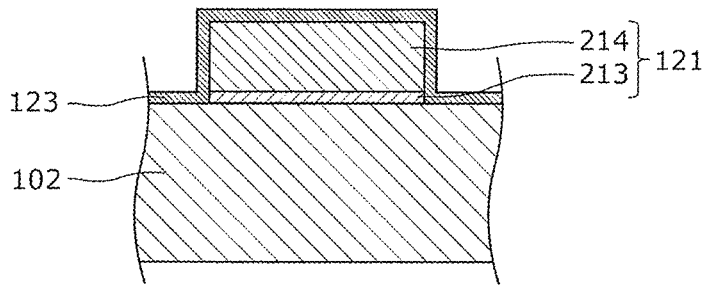
FIG. 4C is a cross-sectional view showing a third example of the cross-sectional structure of the interdigital transducer electrode in the first preferred embodiment of the present invention.

Each of the series arm resonators s1, s2 of the acoustic wave filter 10 according to the first preferred embodiment includes any one of the structures shown in FIG. 4A to FIG. 4C.

For example, as shown in FIG. 4B, the series arm resonator s2 includes the substrate 101, the Ksaw adjusting film 122, the interdigital transducer electrode 121, the protective layer 103, and the protective layer 104.

The substrate 101 is preferably made of, for example, –10-degree Y-cut X-propagation $LiNbO_3$ piezoelectric monocrystal.

The Ksaw adjusting film 122 is the second adjusting film between the substrate 101 and the interdigital transducer electrode 121. The second adjusting film adjusts the electromechanical coupling coefficient. The Ksaw adjusting film 122 is preferably made of, for example, $SiO_2$.

The metal film 212 made of Pt is a metal film having the highest density among the plurality of metal films 211 to 215 of the multilayer body. The metal films 211, 213, 214, 215 are metal films other than the highest density metal film 212.

For example, other than the cross-sectional structure shown in FIG. 4B, as in the case of the cross-sectional structure shown in FIG. 4A, the series arm resonator s1 includes the substrate 101, the interdigital transducer electrode 121, the protective layer 103, and the protective layer 104. For example, other than the cross-sectional structure shown in FIG. 4B, as in the case of the cross-sectional structure shown in FIG. 4C, the series arm resonator s1 includes the substrate 101, the interdigital transducer electrode 121, and the protective layer 123. That is, the Ksaw adjusting film 122 may be provided with the interdigital transducer electrode 121 that is a component of the series arm resonator s1, or the Ksaw adjusting film 122 need not be formed.

As described above, the electromechanical coupling coefficient varies with not only the thickness of the Ksaw adjusting film 122, but also the thicknesses of the protective layers 103, 104, and the electromechanical coupling coefficient reduces as the thicknesses of the protective layers 103, 104 increase. The degree of change in electromechanical coupling coefficient due to a change in the thicknesses of the protective layers 103, 104 is lower than the degree of change in electromechanical coupling coefficient due to a change in the thickness of the Ksaw adjusting film 122. For this reason, in each of the resonators, the electromechanical coupling coefficient is adjusted with the use of the Ksaw adjusting film 122 while the thicknesses of the protective layers 103, 104 remain unchanged, or the thicknesses of the protective layers 103, 104 may be changed in each resonator.

The configurations of the interdigital transducer electrodes 121 shown in FIGS. 4A to 4C are examples, and are not limited thereto. As described above, the interdigital transducer electrode 121 may not have not a multilayer structure including metal films but may have a monolayer of a metal film. The materials of the metal films and protective layers are not limited to the above-described materials. The interdigital transducer electrode 121 may be made of, for example, a metal, such as Ti, Al, Cu, Pt, Au, Ag, and Pd, or an alloy of the metal, or may be made of a plurality of multilayer bodies made of the above-described metal or alloy. The substrate 101 may be made of, for example, $LiTaO_3$ piezoelectric monocrystal, $KNbO_3$ piezoelectric monocrystal, crystal, or piezoelectric ceramics. The configurations of the protective layers 103, 104 and Ksaw adjusting film 122 are not limited to the above-described configurations. The protective layers 103, 104 and the Ksaw adjusting film 122 each may be made of, for example, a dielectric or insulator such as $SiO_2$, SiN, AlN, polyimide, and a multilayer body of some of these substances. The protective layers 103, 104 need not be provided.

For the above-described series arm resonators s1, s2 and parallel arm resonator p1, the wavelength of acoustic waves to be excited is determined by design parameters of the interdigital transducer electrode, or other parameters. Hereinafter, the design parameters of the interdigital transducer electrode 121 will be described by taking the series arm resonator s2 as an example.

The wavelength of acoustic waves is determined by a cycle period $\lambda$ of the electrode fingers connected to one busbar electrode among the plurality of electrode fingers. An electrode finger pitch (the pitch of the plurality of electrode fingers, that is, an electrode finger period) P is half of the cycle period $\lambda$. The electrode finger pitch is defined as $P=(W+S)$, where the line width of each electrode finger is W and the space width between any adjacent electrode fingers is S. The overlap width A of the interdigital transducer electrode 121 is an electrode finger length by which the electrode fingers connected to one of the pair of busbar electrodes and the electrode fingers connected to the other one of the pair of busbar electrodes overlap each other when viewed in the propagation direction of acoustic waves. An electrode duty (duty ratio) is the occupancy of the line widths of the plurality of electrode fingers, and is the proportion of the line width to an added value of the line width of each of the plurality of electrode fingers and the space width between any adjacent two of the plurality of electrode fingers, that is, the electrode duty is defined as W/(W+S). That is, the electrode duty is the ratio of the width of each of the plurality of electrode fingers to the electrode finger pitch (the pitch of the plurality of electrode fingers). That is, the electrode duty is defined as W/P. The number of pairs is the number of paired electrode fingers, and is defined as ((Total number of electrode fingers)−1)/2. The film thickness of the interdigital transducer electrode 121 is a total film thickness T of the metal films 211 to 215.

Next, the relationship between the film thickness of the Ksaw adjusting film and the characteristics of an acoustic wave resonator will be described.

As Ksaw (electromechanical coupling coefficient) increases in a surface acoustic wave resonator, a resonant band width (fa−fr) that is the difference between the frequency at an anti-resonant frequency fa and the frequency at a resonant frequency fr increases.

Figure 5A:
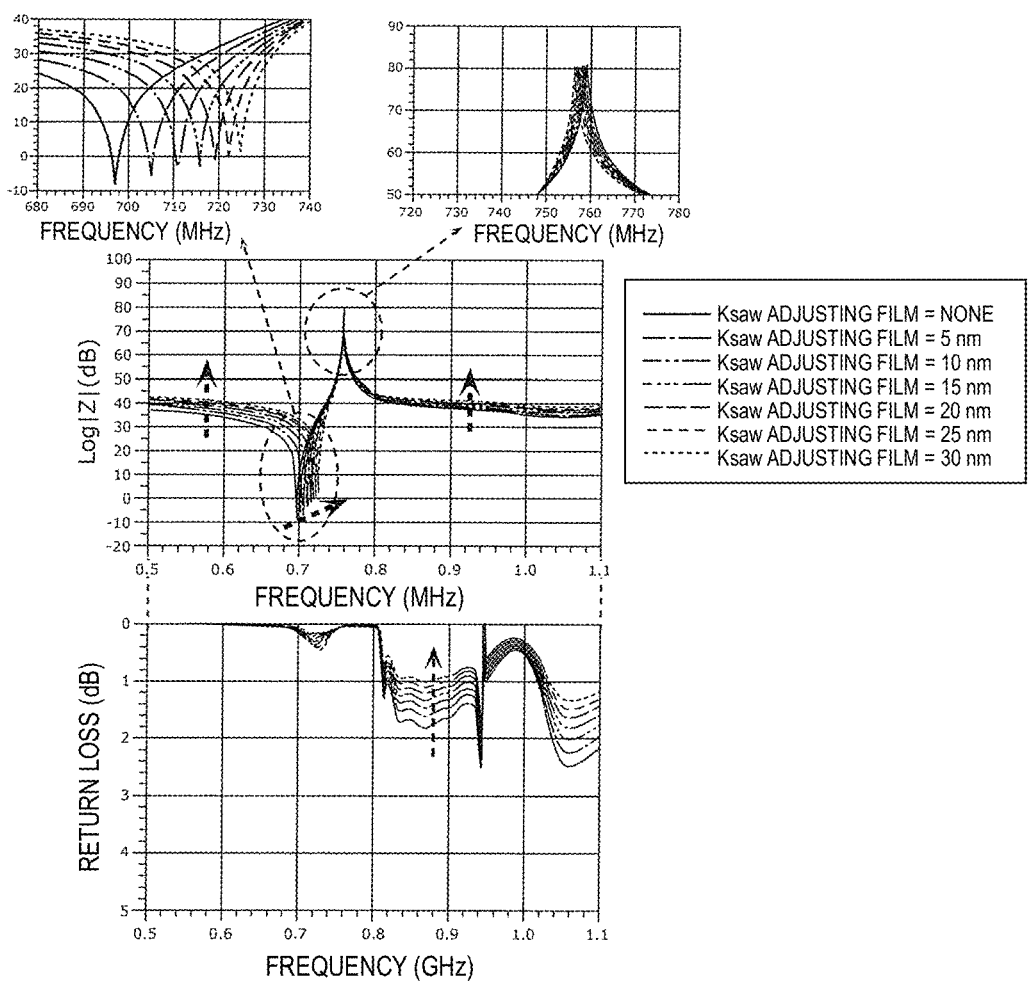
FIG. 5A shows a graph of the relationship between the film thickness of a Ksaw adjusting film and the impedance of an acoustic wave resonator and a graph of the relationship between the film thickness of the Ksaw adjusting film and the return loss of the acoustic wave resonator.
Figure 5B:
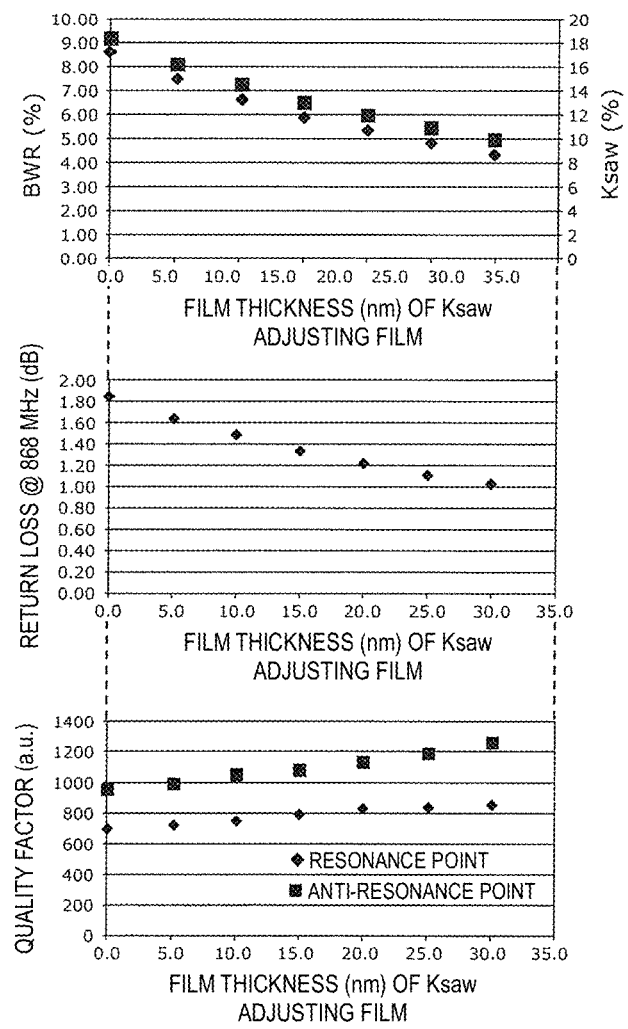
FIG. 5B shows a graph of the relationship between the film thickness of the Ksaw adjusting film and the resonant band width ratio of the acoustic wave resonator, the relationship between the film thickness of the Ksaw adjusting film and the return loss of the acoustic wave resonator, and the relationship between the film thickness of the Ksaw adjusting film and the quality factor of the acoustic wave resonator.

FIG. 5A shows a graph of the relationship between the film thickness of the Ksaw adjusting film and the impedance of the acoustic wave resonator and a graph of the relationship between the film thickness of the Ksaw adjusting film and the return loss of the acoustic wave resonator. FIG. 5B shows a graph of the relationship between the film thickness of the Ksaw adjusting film and Ksaw of the acoustic wave resonator, a graph of the relationship between the film thickness of the Ksaw adjusting film and the resonant band width ratio of the acoustic wave resonator, a graph of the relationship between the film thickness of the Ksaw adjusting film and the return loss of the acoustic wave resonator, and a graph of the relationship between the film thickness of the Ksaw adjusting film and the quality factor of the acoustic wave resonator. The top and middle graphs of FIG. 5A show the frequency characteristics of the resonant impedance of the acoustic wave resonator when the film thickness of the Ksaw adjusting film is changed. The bottom graph of FIG. 5A shows the frequency characteristics of the return loss of the acoustic wave resonator when the film thickness of the Ksaw adjusting film is changed. Table 1 shows the design parameters of the surface acoustic wave resonators by which the characteristics shown in FIG. 5A are obtained. The top graph of FIG. 5B shows the relationship between the film thickness of the Ksaw adjusting film and a resonant band width ratio BWR. The middle graph of FIG. 5B shows the relationship between the film thickness of the Ksaw adjusting film and a return loss at about 868 MHz. The bottom graph of FIG. 5B shows the relationship between the film thickness of the Ksaw adjusting film and each of a resonant quality factor and an anti-resonant quality factor. The resonant band width ratio BWR is defined as a value ((fa−fr)/fr) obtained by dividing the difference (fa−fr) between the anti-resonant frequency fa and resonant frequency fr of a resonant circuit or resonator by the resonant frequency fr (or the percentage thereof).

TABLE 1

| SUBSTRATE | −10-DEGREE Y—LiNbO$_3$ |
|---|---|
| WAVELENGTH λ (μm) | 5.0 |
| FILM THICKNESS OF INTERDIGITAL TRANSDUCER ELECTRODE (nm) | 600 |
| DUTY | 0.5 |
| PROTECTIVE LAYERS 104, 103 (nm) | 1040 |
| Ksaw ADJUSTING FILM 122 (nm) | NONE OR 5 nm TO 30 nm |

When the film thickness of the Ksaw adjusting film is 0 nm (without the Ksaw adjusting film), Ksaw is about 18.4%. When the film thickness of the Ksaw adjusting film is about 30 nm, Ksaw is about 10.0%. Thus, Ksaw reduces as the film thickness of the Ksaw adjusting film is increased. As shown in the middle graph of FIG. 5A, as the film thickness of the Ksaw adjusting film is increased, the resonant band width ratio BWR reduces, and the impedance ratio between the anti-resonant frequency and the resonant frequency reduces. In addition, as the thickness of the Ksaw adjusting film is increased, the resonant frequency quality factor (Qr) and the anti-resonant frequency quality factor (Qa) both tend to improve.

Examples of the existing method of adjusting Ksaw include thinning or weighting using inversion of the polarities of a portion of the electrode fingers of comb electrodes that are components of an acoustic wave resonator, and connecting a comb capacitive element in parallel with an interdigital transducer electrode. Any of these existing methods is equivalent to a configuration in which a capacitor is connected in parallel with an acoustic wave resonator.

Figure 6:
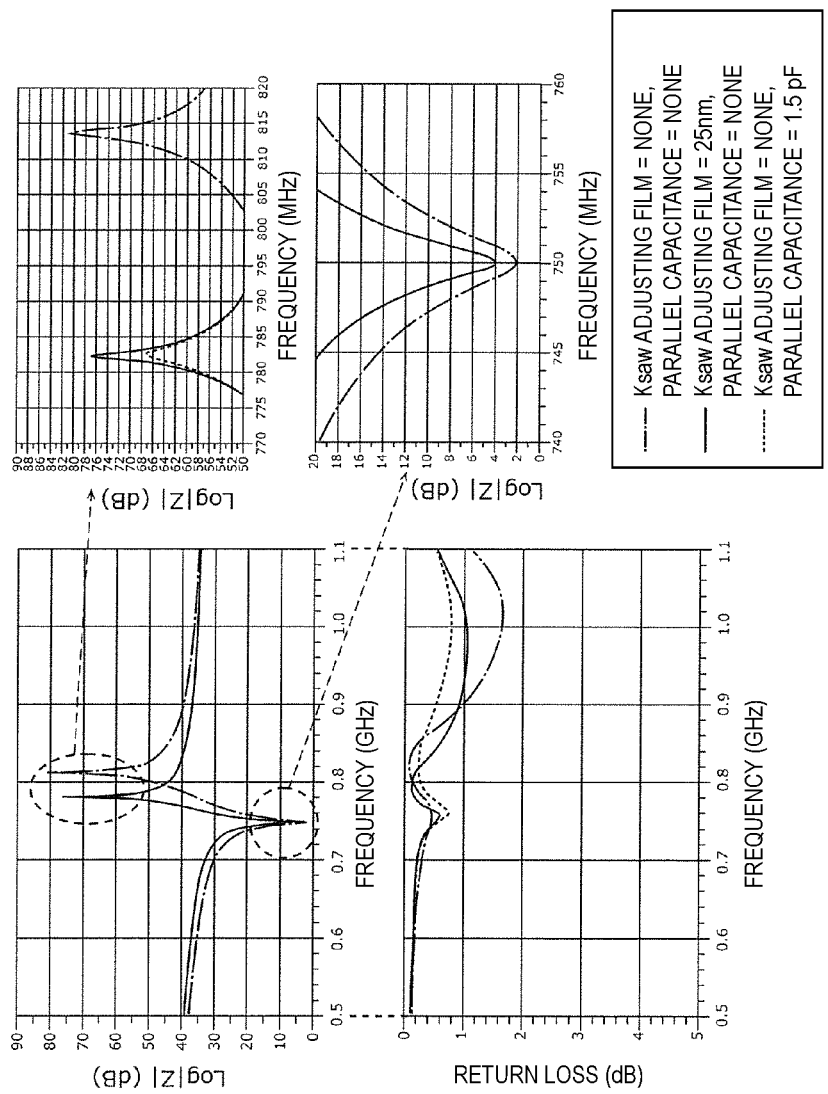
FIG. 6 shows comparison graphs of resonant characteristics among acoustic wave resonators by the film thickness of the Ksaw adjusting film or addition of parallel capacitance.

FIG. 6 shows comparison graphs of the resonant characteristics (impedance characteristics) among acoustic wave resonators by the film thickness of the Ksaw adjusting film or the addition of parallel capacitance. FIG. 6 shows a resonant impedance (top graph) and a return loss (bottom graph) (i) when no Ksaw adjusting film is provided (the alternate long and short dashed line in FIG. 6), (ii) when the film thickness of the Ksaw adjusting film is about 25 nm and no parallel capacitance is added (the solid line in FIG. 6), and (iii) when no Ksaw adjusting film is provided and a parallel capacitance of about 1.5 pF is added (the dashed line in FIG. 6).

In the case of (i), Qr (quality factor at the resonant frequency)=about 250 and Qa (quality factor at the anti-resonant frequency)=about 1162. In the case of (ii), Qr=about 500, and Qa=about 1303. Therefore, when the Ksaw adjusting film is included, Qr and Qa are both improved.

On the other hand, when narrow-band acoustic wave resonators are compared ((ii) and (iii) are compared), in the case of (iii), Qr=about 500, and Qa=about 390. Therefore, it is clear that Qr remains unchanged but Qa significantly deteriorates in the Ksaw adjusting method in which the parallel capacitor is provided.

Thus, it is clear that, from the viewpoint of the quality factor at the anti-resonant frequency (Qa), the existing example method of adding a parallel capacitor to an acoustic wave resonator is effective for a series arm resonator in which the resonant frequency is set within the pass band of a filter, but the existing example method is not effective for a parallel arm resonator in which the anti-resonant frequency is set within the pass band of a filter because a loss in the pass band of the filter is worsened.

Among the existing example methods of adding a parallel capacitor, a thinning method collapses the regularity of an interdigital transducer electrode, so unnecessary reflection occurs in propagation of acoustic waves, causing the occurrence of an unnecessary ripple at a specific frequency and deterioration of Qa. In a method of adding a comb capacitive element, wiring is complicated, such that the size increases, and there is inconvenience due to an increase in wiring resistance.

From the above viewpoints, that is, the viewpoints of the quality factor at the anti-resonant frequency (Qa) and miniaturization, a method of adjusting the film thickness of a Ksaw adjusting film is preferable over a method of adding a parallel capacitor to an acoustic wave resonator as a method of adjusting Ksaw.

Next, the filter characteristics of the acoustic wave filter 10 according to an Example of the present preferred embodiment will be described in comparison with the Comparative Example 1 and the Comparative Example 2.

First, for a ladder acoustic wave filter including a series arm resonator and a parallel arm resonator, the relationship between filter characteristics and each of the resonant frequency and the anti-resonant frequency will be described. The resonant frequency (frs) of the series arm resonator is set within a pass band or close to the pass band. The anti-resonant frequency (fas) of the series arm resonator determines the frequency of an attenuation pole on the higher side of the pass band. The resonant frequency (frp) of the parallel arm resonator determines the frequency of an attenuation pole on the lower side of the pass band. The anti-resonant frequency (fap) of the parallel arm resonator is set within the pass band or close to the pass band. The resonant frequency (frs) and the anti-resonant frequency (fap) determine a pass band width and a center frequency.

This Example shows the acoustic wave filter 10 that satisfies filter characteristics having a pass band of about 760 MHz to about 790 MHz and a stop band of about 810 MHz to about 830 MHz on the higher side of the pass band.

In the acoustic wave filter 10 according to this Example, the anti-resonant frequency (fas1) of the series arm resonator s1 is higher than the anti-resonant frequency (fas2) of the series arm resonator s2 (fas1>fas2). In addition, no Ksaw adjusting film is provided in the series arm resonator s1, and the film thickness of the Ksaw adjusting film (second adjusting film) of the series arm resonator s2 is about 25 nm.

Figure 7A:
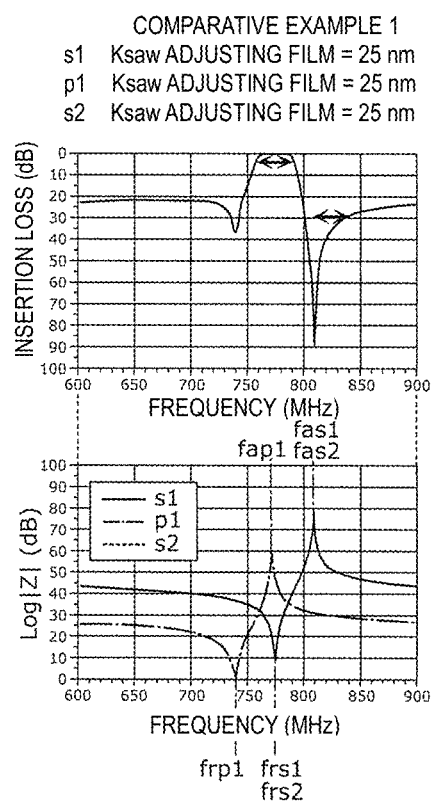
FIG. 7A shows graphs of the bandpass characteristics and resonant characteristics of an acoustic wave filter according to a Comparative Example 1.
Figure 7B:
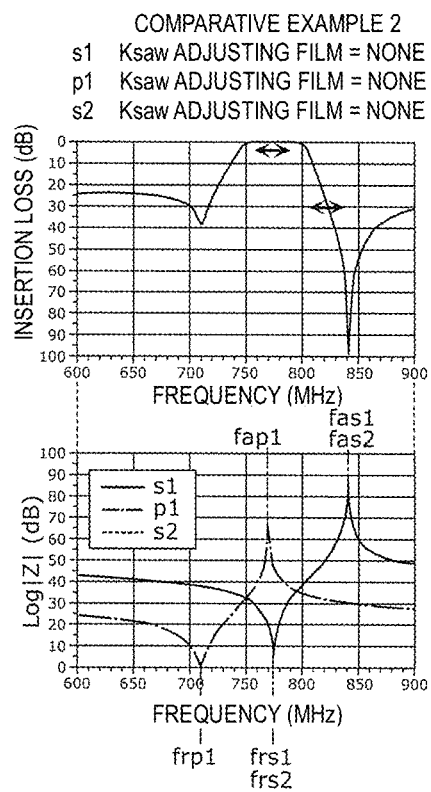
FIG. 7B shows graphs of the bandpass characteristics and resonant characteristics of an acoustic wave filter according to a Comparative Example 2.

FIG. 7A shows graphs of the bandpass characteristics and resonant characteristics of an acoustic wave filter according to the Comparative Example 1. FIG. 7B shows graphs of the bandpass characteristics and resonant characteristics of an acoustic wave filter according to the Comparative Example 2. On the other hand, FIG. 7C shows graphs of the bandpass characteristics and resonant characteristics of the acoustic wave filter 10 according to the first preferred embodiment.

In the acoustic wave filter according to the Comparative Example 1 shown in FIG. 7A, the film thicknesses of the Ksaw adjusting films of the series arm resonators s1, s2 and parallel arm resonator p1 all are set to about 25 nm. In the acoustic wave filter according to Comparative Example 2 shown in FIG. 7B, a Ksaw adjusting film is not provided in any of the series arm resonators s1, s2 and parallel arm resonator p1.

Figure 7C:
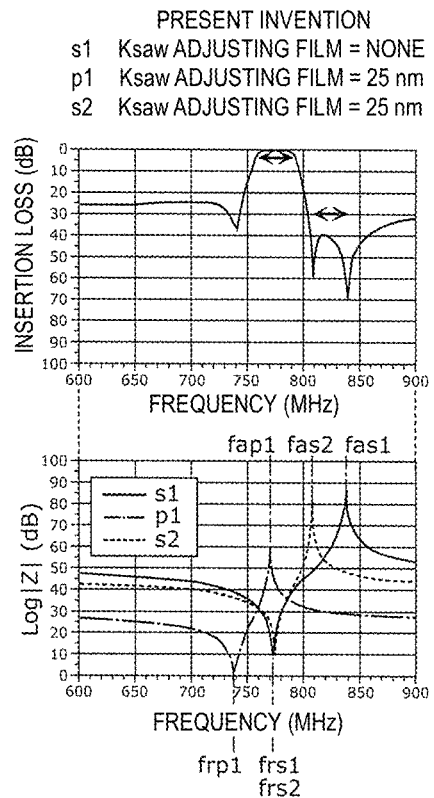
FIG. 7C shows graphs of the bandpass characteristics and resonant characteristics of the acoustic wave filter according to the first preferred embodiment of the present invention.

On the other hand, in the acoustic wave filter according to this Example shown in FIG. 7C, a Ksaw adjusting film is not provided in the series arm resonator s1 and the film thicknesses of the Ksaw adjusting films of the series arm resonator s2 and parallel arm resonator p1 are set to about 25 nm.

In the acoustic wave filter according to the Comparative Example 1, steepness (crispness) at the higher edge of the pass band is sufficiently ensured. However, there is a large rebound at frequencies higher than the attenuation pole on the higher side of the pass band, such that sufficient stop band width and attenuation are not obtained. More specifically, in the acoustic wave filter according to the Comparative Example 1, Ksaw of each of the series arm resonators s1, s2 and the parallel arm resonator p1 is about 9.8% to about 9.9% and is relative low, and the impedance ratio ($\Delta Z$) that is the ratio between the impedance (Zr) of the resonant frequency and the impedance (Za) of the anti-resonant frequency is small. Therefore, the Comparative Example 1 is advantageous in good steepness (crispness) at each edge of the pass band. However, attenuation on the outer side of each attenuation pole (which refers to a frequency band on a side across the attenuation pole from the pass band) is small, such that attenuation is small in stop bands near the pass band.

In the acoustic wave filter according to the Comparative Example 2, the pass band width of the filter, including the pass band, is wide, and steepness (crispness) at each edge of the pass band is low, and sufficient attenuation is not obtained in stop bands. More specifically, in the acoustic wave filter according to the Comparative Example 2, Ksaw of each of the series arm resonators s1, s2 and the parallel arm resonator p1 is about 17.8% to about 17.9% and is relatively high, and the impedance ratio ($\Delta Z$) is large. Thus, the Comparative Example 2 is advantageous in increasing the attenuation outside each attenuation pole. However, steepness (crispness) is poor and the resonant band width (fa−fr) is wide, such that it is difficult to bring each attenuation pole close to the pass band and attenuation is small in stop bands near the pass band.

In contrast to the Comparative Example 1 and the Comparative Example 2, in the acoustic wave filter 10 according to this Example, Ksaw of the series arm resonator s1 is greater than Ksaw of the series arm resonator s2 and, as shown in the bottom graph of FIG. 7C, the anti-resonant frequency (fas1) of the series arm resonator s1 is higher than the anti-resonant frequency (fas2) of the series arm resonator s2. Therefore, in a stop band on the higher side of the pass band, as shown in the top graph of FIG. 7C, by two attenuation poles, that is, the attenuation pole (higher side) that is determined by the anti-resonant frequency (fas1) of the series arm resonator s1 and the attenuation pole (lower side) that is determined by the anti-resonant frequency (fas2) of the series arm resonator s2, the stop band is widened, and sufficient attenuation is obtained. More specifically, in the acoustic wave filter 10 according to this Example, Ksaw of the series arm resonator s1 with no (thin) Ksaw adjusting film is about 17.7%, Ksaw of the series arm resonator s2 with a thick Ksaw adjusting film is about 9.7%, and the resonant band width ($\Delta f=fa-fr$) between the series arm resonators s1, s2 is different. On the other hand, as described above, as a basic design of a ladder filter, the resonant frequency fr of the series arm resonator needs to be set within the pass band or close to the pass band. Therefore, the stop band width is widened by increasing the difference between the frequencies of the attenuation poles on the higher side of the pass band, provided by the two series arm resonators having different Ksaw, steepness is ensured by the series arm resonator s2 having a smaller Ksaw, and, in addition, the stop band width and attenuation are improved by $\Delta f$ and $\Delta Z$ characteristics of the series arm resonator s1 having a larger Ksaw.

Thus, the stop band width on the higher side of the pass band is widened, and attenuation in the desired stop band (stop band on the higher side of the pass band) is improved.

Second Preferred Embodiment

In an acoustic wave filter device according to a second preferred embodiment of the present invention, as compared to the acoustic wave filter device according to the first preferred embodiment, not only the coefficients Ksaw of two series arm resonators are varied but also the coefficients Ksaw of two parallel arm resonators are varied. Thus, the acoustic wave filter device according to the present preferred embodiment improves not only attenuation characteristics on the higher side of a pass band but also attenuation characteristics on the lower side of the pass band.

Figure 8:
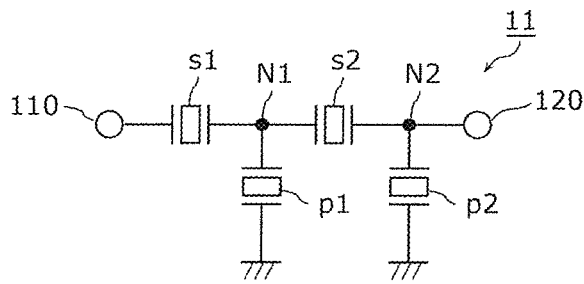
FIG. 8 is a basic circuit configuration diagram of an acoustic wave filter according to a second preferred embodiment of the present invention.

FIG. 8 is a basic circuit configuration diagram of an acoustic wave filter 11 according to the second preferred embodiment. As shown in FIG. 8, the acoustic wave filter 11 includes the series arm resonators s1, s2, the parallel arm resonators p1, p2, and the input/output terminals 110, 120. The acoustic wave filter 11 according to the present preferred embodiment differs from the acoustic wave filter 10 according to the first preferred embodiment in that the parallel arm resonator p2 is included and the coefficients Ksaw of the parallel arm resonators p1, p2 are also varied. Hereinafter, for the acoustic wave filter 11 according to the present preferred embodiment, the description of the same or similar points as those of the acoustic wave filter 10 according to the first preferred embodiment is omitted, and different points will be mainly described.

The parallel arm resonator p2 is a second parallel arm resonator provided in a third path that connects the ground and a node N2 (second node). The node N2 connects the series arm resonator s2 and the input/output terminal 120.

The series arm resonator s2 includes the second adjusting film that adjusts Ksaw and that is provided between the piezoelectric body and the interdigital transducer electrode. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided between the piezoelectric body and interdigital transducer electrode of the series arm resonator s1 or, when the first adjusting film that adjusts Ksaw is provided between the piezoelectric body and interdigital transducer electrode of the series arm resonator s1, the first adjusting film is thinner than the second adjusting film (the film thickness of the first adjusting film is less than the film thickness of the second adjusting film).

Furthermore, the parallel arm resonator p2 includes a fourth adjusting film that adjusts Ksaw and that is provided between the piezoelectric body and the interdigital transducer electrode. The resonant frequency (frp1) of the parallel arm resonator p1 is lower than the resonant frequency (frp2) of the parallel arm resonator p2 (frp1<frp2). In addition, an adjusting film that adjusts Ksaw is not provided between the piezoelectric body and interdigital transducer electrode of the parallel arm resonator p1, or, when a third adjusting film that adjusts Ksaw is provided between the piezoelectric body and interdigital transducer electrode of the parallel arm resonator p1, the third adjusting film is thinner than the fourth adjusting film (the film thickness of the third adjusting film is less than the film thickness of the fourth adjusting film).

With this configuration, a wide stop band on the higher side of a pass band is ensured while steepness on the higher side of the pass band is ensured by the attenuation pole of the series arm resonator s2, and sufficient attenuation is obtained in the stop band. In addition, a wide stop band on the lower side of the pass band is ensured while steepness on the lower side of the pass band is ensured by the attenuation pole of the parallel arm resonator p2, and sufficient attenuation is obtained in the stop band.

The relationship in Ksaw adjusting films between the parallel arm resonators p1, p2 and the relationship in anti-resonant frequency between the parallel arm resonators p1, p2 may be inverted. That is, the parallel arm resonator p1 includes the fourth adjusting film that adjusts Ksaw and that is provided between the piezoelectric body and the interdigital transducer electrode. The resonant frequency (frp2) of the parallel arm resonator p2 is lower than the resonant frequency (frp1) of the parallel arm resonator p1 (frp2<frp1). In addition, an adjusting film that adjusts Ksaw need not be provided between the piezoelectric body and interdigital transducer electrode of the parallel arm resonator p2, or, when the third adjusting film that adjusts Ksaw is provided between the piezoelectric body and interdigital transducer electrode of the parallel arm resonator p2, the third adjusting film may be thinner than the fourth adjusting film (the film thickness of the third adjusting film may be less than the film thickness of the fourth adjusting film).

In this case, a wide stop band on the higher side of a pass band is ensured while steepness on the higher side of the pass band is ensured by the attenuation pole of the series arm resonator s2, and sufficient attenuation is obtained in the stop band. In addition, a wide stop band on the lower side of the pass band is ensured while steepness on the lower side of the pass band is ensured by the attenuation pole of the parallel arm resonator p1, and sufficient attenuation is obtained in the stop band.

Next, the filter characteristics of the acoustic wave filter 11 according to an Example of the present preferred embodiment will be described in comparison with a Comparative Example 3 and a Comparative Example 4.

The Example shows the acoustic wave filter 11 that satisfies filter characteristics having a pass band of about 760 MHz to about 790 MHz, a stop band of about 810 MHz to about 830 MHz on the higher side of the pass band, and a stop band of about 710 MHz to about 740 MHz on the lower side of the pass band.

In the acoustic wave filter 11 according to this Example, the anti-resonant frequency (fas1) of the series arm resonator s1 is higher than the anti-resonant frequency (fas2) of the series arm resonator s2 (fas1>fas2). In addition, a Ksaw adjusting film is not provided in the series arm resonator s1, and the film thickness of the Ksaw adjusting film (second adjusting film) of the series arm resonator s2 is about 25 nm.

Figure 9A:
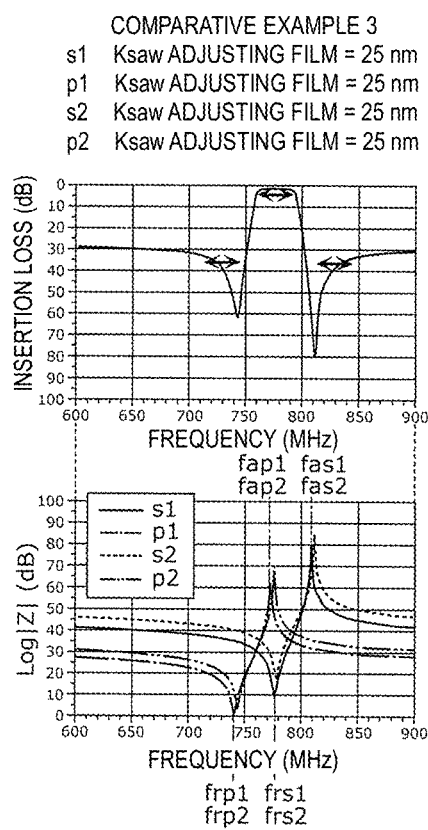
FIG. 9A shows graphs of the bandpass characteristics and resonant characteristics of an acoustic wave filter according to a Comparative Example 3.
Figure 9B:
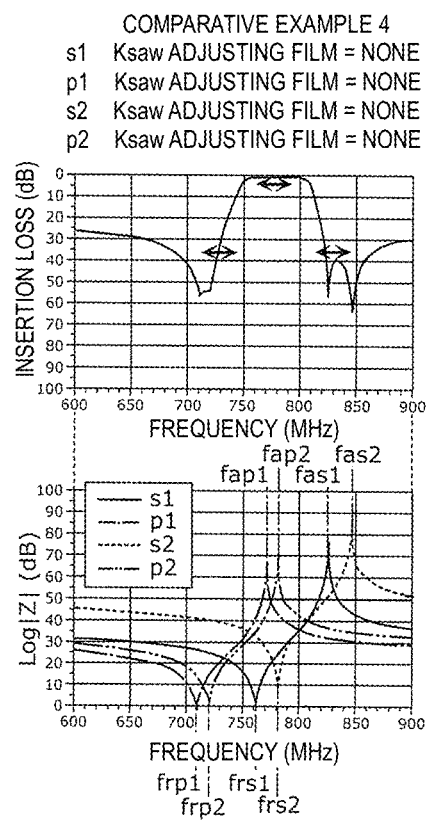
FIG. 9B shows graphs of the bandpass characteristics and resonant characteristics of an acoustic wave filter according to a Comparative Example 4.

FIG. 9A shows graphs of the bandpass characteristics and resonant characteristics of an acoustic wave filter according to the Comparative Example 3. FIG. 9B shows graphs of the bandpass characteristics and resonant characteristics of an acoustic wave filter according to the Comparative Example 4. On the other hand, FIG. 9C shows graphs of the bandpass characteristics and resonant characteristics of the acoustic wave filter 11 according to the second preferred embodiment.

In the acoustic wave filter according to the Comparative Example 3 shown in FIG. 9A, the film thicknesses of the Ksaw adjusting films of the series arm resonators s1, s2 and parallel arm resonators p1, p2 all are set to about 25 nm. In the acoustic wave filter according to the Comparative Example 4 shown in FIG. 9B, a Ksaw adjusting film is not provided in any of the series arm resonators s1, s2 and the parallel arm resonators p1, p2.

Figure 9C:
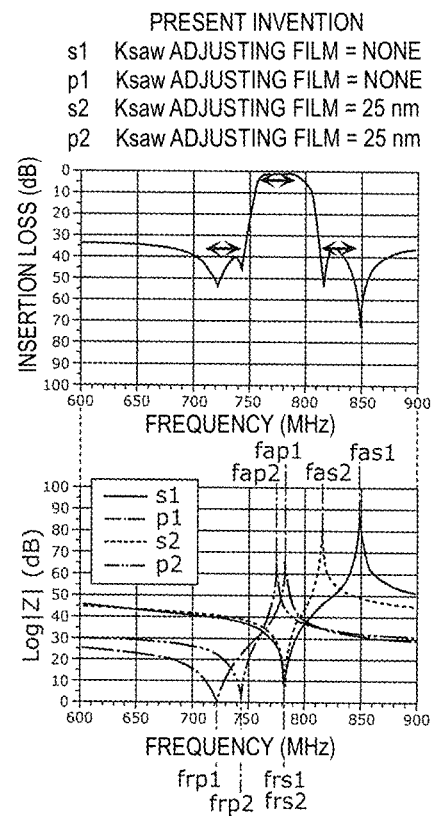
FIG. 9C shows graphs of the bandpass characteristics and resonant characteristics of the acoustic wave filter according to the second preferred embodiment of the present invention.

On the other hand, in the acoustic wave filter 11 according to this Example shown in FIG. 9C, a Ksaw adjusting film is not provided in any of the series arm resonator s1 and the parallel arm resonator p1 and the film thicknesses of the Ksaw adjusting films of the series arm resonator s2 and parallel arm resonator p2 are set to about 25 nm.

In the acoustic wave filter according to the Comparative Example 3, steepness (crispness) at the lower edge of a pass band is sufficiently ensured. However, there is a large rebound at frequencies lower than the attenuation pole on the lower side of the pass band, so sufficient stop band width and attenuation are not obtained. In addition, steepness (crispness) at the higher edge of the pass band is sufficiently ensured. However, there is a large rebound at frequencies higher than the attenuation pole on the higher side of the pass band, so sufficient stop band width and attenuation are not obtained.

In the acoustic wave filter according to the Comparative Example 4, the pass band width of the filter, including the pass band, is wide, and steepness (crispness) at each edge of the pass band is low, and sufficient attenuation is not obtained in stop bands.

In contrast to the Comparative Example 3 and the Comparative Example 4, in the acoustic wave filter 11 according to this Example, Ksaw of the series arm resonator s1 is greater than Ksaw of the series arm resonator s2, Ksaw of the parallel arm resonator p1 is greater than Ksaw of the parallel arm resonator p2, and, as shown in the bottom graph of FIG. 9C, the resonant frequency (frp1) of the parallel arm resonator p1 is lower than the resonant frequency (frp2) of the parallel arm resonator p2. Therefore, in a stop band on the lower side of the pass band, as shown in the top graph of FIG. 9C, by two attenuation poles, that is, the attenuation pole (lower side) that is determined by the resonant frequency (frp1) of the parallel arm resonator p1 and the attenuation pole (higher side) that is determined by the resonant frequency (frp2) of the parallel arm resonator p2, the stop band is widened, and sufficient attenuation is obtained.

Therefore, the stop band width is widened by increasing the difference between the frequencies of the attenuation poles on the higher side of the pass band, provided by the two series arm resonators having different Ksaw, steepness is ensured by the series arm resonator s2 having a smaller Ksaw, and, in addition, the stop band width and attenuation are improved by Δf and ΔZ characteristics of the series arm resonator s1 having a larger Ksaw. In addition, the stop band width is widened by increasing the difference between the frequencies of the attenuation poles on the lower side of the pass band, provided by the two parallel arm resonators having different Ksaw, steepness is ensured by the parallel arm resonator p2 having a smaller Ksaw, and, in addition, the stop band width and attenuation are improved by Δf and ΔZ characteristics of the parallel arm resonator p1 having a larger Ksaw.

Thus, the stop band width on the higher side of the pass band and the stop band width on the lower side of the pass band are widened, and attenuation in the desired stop bands is improved.

The film thickness of the Ksaw adjusting film (second adjusting film) of the series arm resonator s2 may be equal or substantially equal to the film thickness of the Ksaw adjusting film (fourth adjusting film) of the parallel arm resonator p2, and a Ksaw adjusting film need not be provided in any of the series arm resonator s1 and the parallel arm resonator p1 or the film thickness of the Ksaw adjusting film (first adjusting film) of the series arm resonator s1 may be equal or substantially equal to the film thickness of the Ksaw adjusting film (third adjusting film) of the parallel arm resonator p1.

With this configuration, adjusting films that are provided in the four resonators may include film thicknesses of less than or equal to two types, such that manufacturing process is simplified.

Third Preferred Embodiment

In an acoustic wave filter device according to a third preferred embodiment of the present invention, as compared to the acoustic wave filter device according to the second preferred embodiment, the coefficients Ksaw of the series arm resonators are not varied and only the coefficients Ksaw of the two parallel arm resonators are varied. Thus, the acoustic wave filter device according to the present preferred embodiment improves attenuation characteristics on the lower side of the pass band.

Figure 10A:
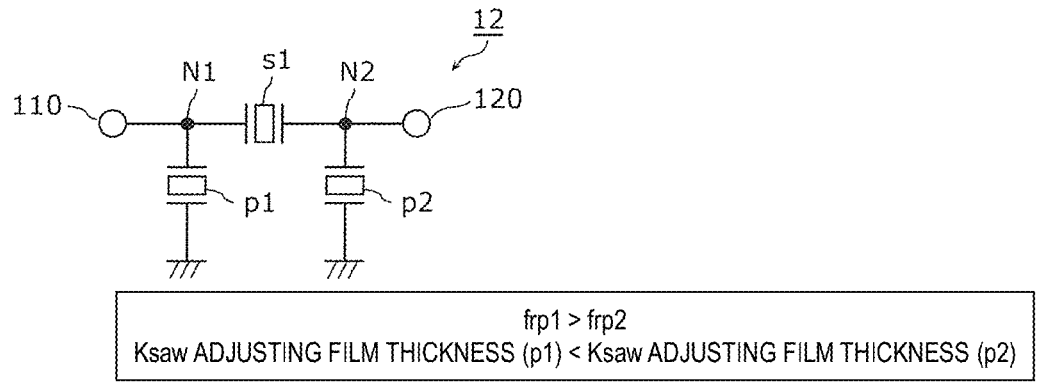
FIG. 10A is a basic circuit configuration diagram of the acoustic wave filter according to a third preferred embodiment of the present invention.

FIG. 10A is a basic circuit configuration diagram of an acoustic wave filter 12 according to the third preferred embodiment. As shown in FIG. 10A, the acoustic wave filter 12 includes the series arm resonator s1, the parallel arm resonators p1, p2, and the input/output terminals 110, 120.

The series arm resonator s1 is the first series arm resonator provided in the first path that connects the input/output terminals 110, 120. The first series arm resonator is preferably an acoustic wave resonator, for example.

The parallel arm resonator p1 is the first parallel arm resonator provided in the second path that connects the ground and the node N1 (first node). The node N1 connects the series arm resonator s1 and the input/output terminal 110.

The parallel arm resonator p2 is the second parallel arm resonator provided in the third path that connects the ground and the node N2 (second node). The node N2 connects the series arm resonator s1 and the input/output terminal 120.

Figure 10B:
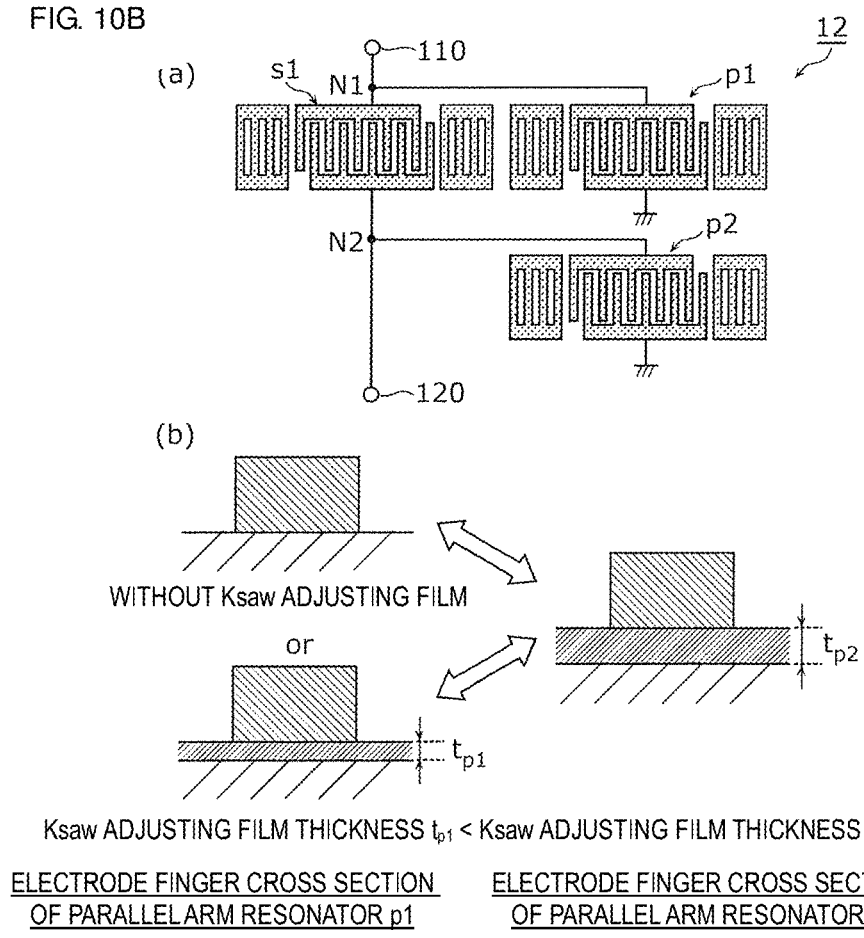
FIG. 10B is a plan view showing the electrode layout of the acoustic wave filter and an interdigital transducer electrode cross-sectional view according to the third preferred embodiment of the present invention.

FIG. 10B is a plan view showing the electrode layout of the acoustic wave filter and an interdigital transducer electrode cross-sectional view according to the third preferred embodiment. Part (a) of FIG. 10B is a schematic plan view of an interdigital transducer electrode and reflectors of each of resonators that make up the acoustic wave filter 12. Part (b) of FIG. 10B shows the schematic cross-sectional views of the parallel arm resonators p1, p2.

The parallel arm resonator p2 includes the fourth adjusting film that adjusts Ksaw and that is provided between the piezoelectric body and the interdigital transducer electrode. The resonant frequency (frp1) of the parallel arm resonator p1 is lower than the resonant frequency (frp2) of the parallel arm resonator p2 (frp1<frp2). In addition, as shown in FIG. 10B, an adjusting film that adjusts Ksaw is not provided between the piezoelectric body and interdigital transducer electrode of the parallel arm resonator p1 (without Ksaw adjusting film), or, when the third adjusting film that adjusts Ksaw is provided between the piezoelectric body and interdigital transducer electrode of the parallel arm resonator p1, the third adjusting film is thinner than the fourth adjusting film (the film thickness $t_{p1}$ of the third adjusting film is less than the film thickness $t_{p2}$ of the fourth adjusting film).

With this configuration, a wide stop band on the lower side of a pass band is ensured while steepness on the lower side of the pass band is ensured by the attenuation pole of the parallel arm resonator p2, and sufficient attenuation is obtained in the stop band.

Next, the filter characteristics of the acoustic wave filter 12 according to an Example of the present preferred embodiment will be described in comparison with a Comparative Example 5 and a Comparative Example 6.

In the acoustic wave filter 12 according to this Example, the resonant frequency (frp1) of the parallel arm resonator p1 is lower than the resonant frequency (frp2) of the parallel arm resonator p2 (frp1<frp2). In addition, a Ksaw adjusting film is not provided in the parallel arm resonator p1, and the film thickness of the Ksaw adjusting film (fourth adjusting film) of the parallel arm resonator p2 is about 25 nm.

Figure 11A:
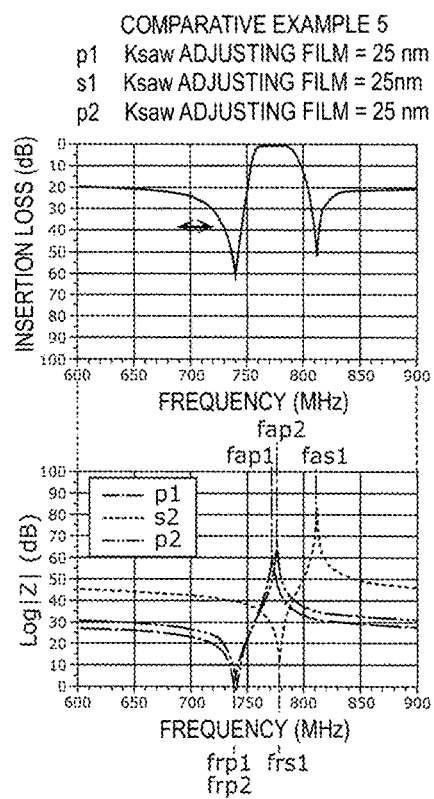
FIG. 11A shows graphs of the bandpass characteristics and resonant characteristics of an acoustic wave filter according to a Comparative Example 5.
Figure 11B:
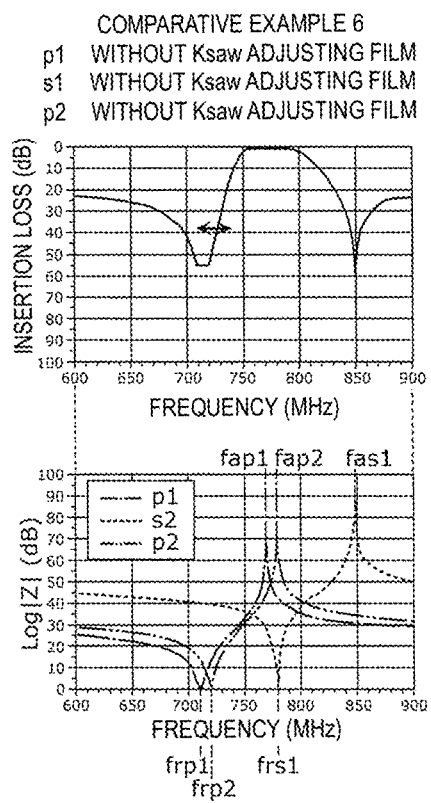
FIG. 11B shows graphs of the bandpass characteristics and resonant characteristics of an acoustic wave filter according to a Comparative Example 6.

FIG. 11A shows graphs of the bandpass characteristics and resonant characteristics of an acoustic wave filter according to the Comparative Example 5. FIG. 11B shows graphs of the bandpass characteristics and resonant characteristics of an acoustic wave filter according to the Comparative Example 6. On the other hand, FIG. 11C shows graphs of the bandpass characteristics and resonant characteristics of the acoustic wave filter 12 according to the third preferred embodiment.

In the acoustic wave filter according to the Comparative Example 5 shown in FIG. 11A, the film thicknesses of the Ksaw adjusting films of the series arm resonator s1 and parallel arm resonators p1, p2 all are set to about 25 nm. In the acoustic wave filter according to the Comparative Example 6 shown in FIG. 11B, a Ksaw adjusting film is not provided in any of the series arm resonator s1 and parallel arm resonators p1, p2.

Figure 11C:
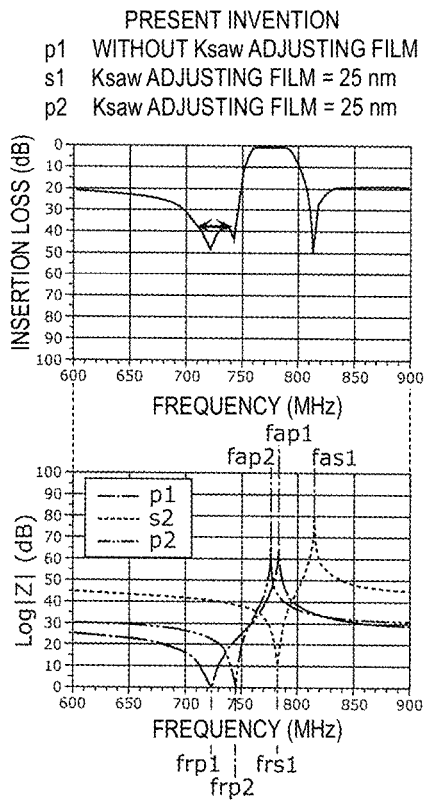
FIG. 11C shows graphs of the bandpass characteristics and resonant characteristics of an acoustic wave filter according to the third preferred embodiment of the present invention.

On the other hand, in the acoustic wave filter 12 according to this Example shown in FIG. 11C, a Ksaw adjusting film is not provided in the parallel arm resonator p1 and the film thicknesses of the Ksaw adjusting films of the series arm resonator s1 and parallel arm resonator p2 are set to about 25 nm.

In the acoustic wave filter according to the Comparative Example 5, steepness (crispness) at the lower edge of a pass band is sufficiently ensured. However, there is a large rebound at frequencies lower than the attenuation pole on the lower side of the pass band, so sufficient stop band width and attenuation are not obtained.

In the acoustic wave filter according to the Comparative Example 6, the pass band width of the filter, including the pass band, is wide, and steepness (crispness) at each edge of the pass band is low, and sufficient attenuation is not obtained in stop bands.

In contrast to the Comparative Example 5 and the Comparative Example 6, in the acoustic wave filter 12 according to this Example, Ksaw of the parallel arm resonator p1 is greater than Ksaw of the parallel arm resonator p2 and, as shown in the bottom graph of FIG. 11C, the resonant frequency (frp1) of the parallel arm resonator p1 is lower than the resonant frequency (frp2) of the parallel arm resonator p2. Therefore, in a stop band on the lower side of the pass band, as shown in the top graph of FIG. 11C, by two attenuation poles, that is, the attenuation pole (lower side) that is determined by the resonant frequency (frp1) of the parallel arm resonator p1 and the attenuation pole (higher side) that is determined by the resonant frequency (frp2) of the parallel arm resonator p2, the stop band is widened, and sufficient attenuation is obtained. Therefore, the stop band width is widened by increasing the difference between the frequencies of the attenuation poles on the lower side of the pass band, provided by the two parallel arm resonators having different Ksaw, steepness is ensured by the parallel arm resonator p2 having a smaller Ksaw, and, in addition, the stop band width and attenuation are improved by $\Delta f$ and $\Delta Z$ characteristics of the parallel arm resonator p1 having a larger Ksaw.

Thus, the stop band width on the lower side of the pass band is widened, and attenuation in the desired stop band (stop band on the lower side of the pass band) is improved.

The relationship in Ksaw adjusting films between the parallel arm resonators p1, p2 and the relationship in anti-resonant frequency between the parallel arm resonators p1, p2 may be inverted. That is, the parallel arm resonator p1 may include the fourth adjusting film, the resonant frequency (frp2) of the parallel arm resonator p2 may be lower than the resonant frequency (frp1) of the parallel arm resonator p1 (frp2<frp1), and an adjusting film that adjusts Ksaw need not be provided in the parallel arm resonator p2 or the third adjusting film of the parallel arm resonator p2 may be thinner than the fourth adjusting film (the film thickness of the third adjusting film may be less than the film thickness of the fourth adjusting film).

In this case, a wide stop band on the lower side of the pass band is ensured while steepness on the lower side of the pass band is ensured by the attenuation pole of the parallel arm resonator p1, and sufficient attenuation is obtained in the stop band.

Fourth Preferred Embodiment

In the present preferred embodiment, a multiplexer in which a plurality of filters each including the acoustic wave filter 10 according to the first preferred embodiment are connected to a common terminal will be described.

Figure 12:
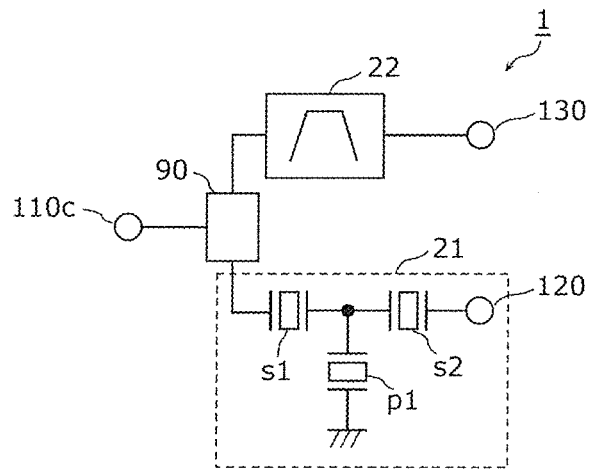
FIG. 12 is a basic circuit configuration diagram of a multiplexer according to a fourth preferred embodiment of the present invention.

FIG. 12 is a basic circuit configuration diagram of a multiplexer 1 according to the fourth preferred embodiment. The multiplexer 1 shown in the diagram includes an acoustic wave filter 21, a filter 22, a connection circuit 90, a common terminal 110c, the input/output terminal 120, and an input/output terminal 130.

The acoustic wave filter 21 is connected to the input/output terminal 120, and is also connected to the common terminal 110c via the connection circuit 90. The acoustic wave filter 21 is an acoustic wave filter device having the same or substantially the same configuration as the filter 10 according to the first preferred embodiment.

The filter 22 is connected to the input/output terminal 130, and is also connected to the common terminal 110c via the connection circuit 90. The filter 22 is a second filter having a pass band at higher frequencies than the pass band of the filter 10.

The connection circuit 90 connects the acoustic wave filter 21 and the filter 22 in common to the common terminal 110c, and may be omitted. In this case, the acoustic wave filter 21 and the filter 22 are directly connected to the common terminal 110c. Examples of the connection circuit 90 include a phase shifter, a switch that selects at least one of the acoustic wave filter 21 and the filter 22, and a circulator.

As shown in the diagram, the acoustic wave filter 21 includes the series arm resonators s1, s2, and the parallel arm resonator p1.

The series arm resonator s2 includes the second adjusting film. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided in the series arm resonator s1 or, when the first adjusting film is provided in the series arm resonator s1, the first adjusting film is thinner than the second adjusting film (the film thickness of the first adjusting film is less than the film thickness of the second adjusting film).

The series arm resonator s1 is connected closest to the connection circuit 90 and the common terminal 110c among the acoustic wave resonators of the acoustic wave filter 21. In other words, the input/output terminal 110 of the acoustic wave filter 10 according to the first preferred embodiment and the series arm resonator s1 are directly connected, and the input/output terminal 110 and the connection circuit 90 are connected.

The electrostatic capacitance of the series arm resonator s1 is less than the electrostatic capacitance of the series arm resonator s2. The acoustic wave filter 21 has a basic circuit configuration of an acoustic wave filter device according to the present embodiment, and may have the circuit configuration as shown in FIG. 2A or the circuit configuration as shown in FIG. 2B. In this case, when the acoustic wave filter 21 includes three or more series arm resonators, the electrostatic capacitance of the series arm resonator s1 is less than the electrostatic capacitance of any of the series arm resonators other than the series arm resonator s1.

Mathematical Expression 1

$$\text{ELECTROSTATIC CAPACITY} = \frac{\varepsilon_0 \cdot \varepsilon_r \cdot \text{NUMBER OF PAIRS} \cdot \text{OVERLAP WIDTH}}{2 \cdot (1 - \text{DUTY})} \quad (1)$$

$\varepsilon_0$ is the permittivity in a vacuum, and $\varepsilon r$ is the permittivity of the piezoelectric body.

With this configuration, while a bulk wave loss that arises in the acoustic wave filter 21 is reduced, a loss in the pass band of the filter 22 is effectively reduced.

The multiplexer according to the present preferred embodiment may include three or more filters having different pass bands that are connected in common to the common terminal 110c. In this case, the multiplexer only needs to include at least one filter whose pass band lies at higher frequencies than pass band of the acoustic wave filter 21 according to the present preferred embodiment.

When the connection circuit 90 is a switch, the multiplexer according to the present preferred embodiment may include two or more filters whose pass bands overlap each other among the plurality of filters connected in common to the common terminal 110c. In this case, the two or more filters only need to not be selected by the switch at the same time.

In the acoustic wave resonator defining each of the series arm resonators s1, s2 and the parallel arm resonator p1 of the acoustic wave filter 21, there is a loss that arises as a result of radiation (leakage) of bulk waves into the piezoelectric substrate (hereinafter, referred to as bulk wave loss) on the higher frequency side of the anti-resonant frequency (fa).

The acoustic wave resonator exhibits capacitive characteristics on the higher frequency side of the anti-resonant frequency (fa), and further includes a resistive component based on the bulk wave loss. For this reason, the acoustic wave resonator defines and functions as a capacitor having a low quality factor in a frequency band at which there is a bulk wave loss on the higher frequency side of the anti-resonant frequency (fa).

Therefore, in the filter 22 having a pass band that lies at higher frequencies than the pass band of the acoustic wave filter 21, a loss worsens in the pass band of the filter 22 under the influence of the low-quality-factor capacitor that is the capacitive component of the acoustic wave filter 21.

Although an equivalent circuit of the acoustic wave filter 21 in the pass band of the filter 22 varies depending on a circuit element (such as a filter selector switch and a power amplifier) that is connected to the input/output terminal 120 of the multiplexer 1, the acoustic wave filter 21 defines and functions as a capacitor as described above. Thus, when the quality factor of the capacitor defined by the acoustic wave filter 21 deteriorates from a bulk wave loss, the loss of the filter 22 is worsened.

First, the characteristics of the acoustic wave filter 21 alone that is a component of the multiplexer 1 according to an Example of the present preferred embodiment will be described in comparison with a Comparative Example 7 and a Comparative Example 8.

In the multiplexer 1 according to this Example, the anti-resonant frequency (fas1) of the series arm resonator s1 of the acoustic wave filter 21 is higher than the anti-resonant frequency (fas2) of the series arm resonator s2 (fas1>fas2). In addition, a Ksaw adjusting film is not provided in the series arm resonator s1 of the acoustic wave filter 21, and the film thickness of the Ksaw adjusting film (second adjusting film) of the series arm resonator s2 is about 25 nm.

Figure 13A:
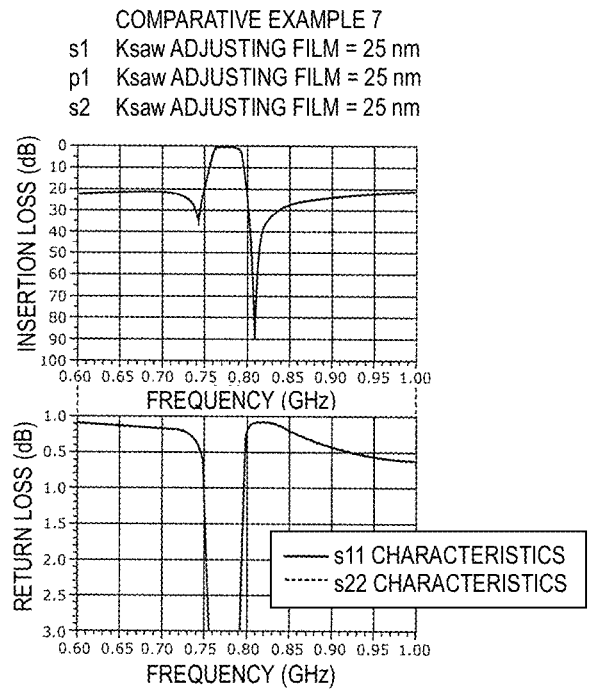
FIG. 13A shows graphs of the bandpass characteristics and reflection characteristics of a lower-frequency filter of a multiplexer according to a Comparative Example 7.
Figure 14A:
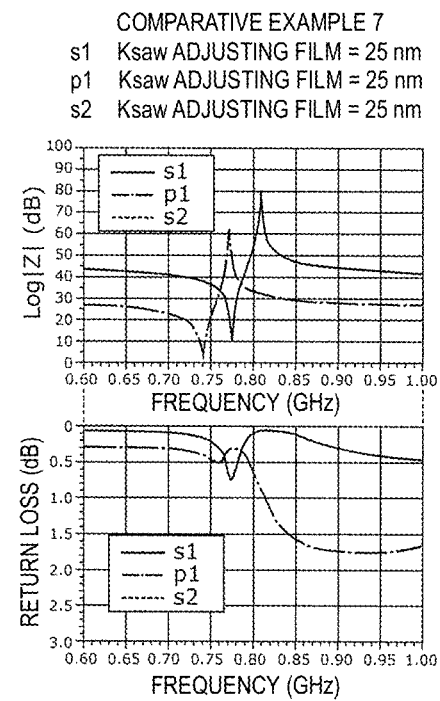
FIG. 14A shows a graph of the resonant characteristics of the lower-frequency filter of the multiplexer and a graph of the reflection characteristics of each resonator of the lower-frequency filter of the multiplexer according to the Comparative Example 7.

FIG. 13A shows graphs of the bandpass characteristics and reflection characteristics of a lower-frequency filter of a multiplexer according to the Comparative Example 7. FIG. 14A shows graphs of the resonant characteristics and reflection characteristics of each resonator of the lower-frequency filter of the multiplexer according to the Comparative Example 7.

Figure 13B:
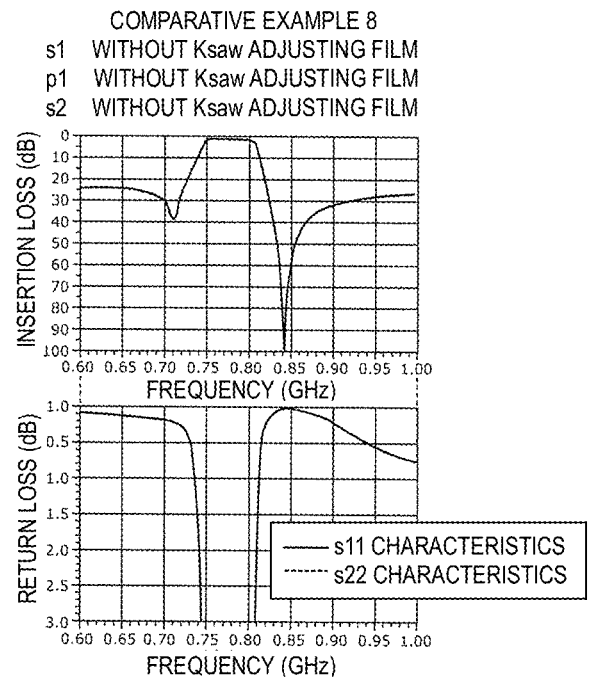
FIG. 13B shows graphs of the bandpass characteristics and reflection characteristics of a lower-frequency filter of a multiplexer according to a Comparative Example 8.
Figure 14B:
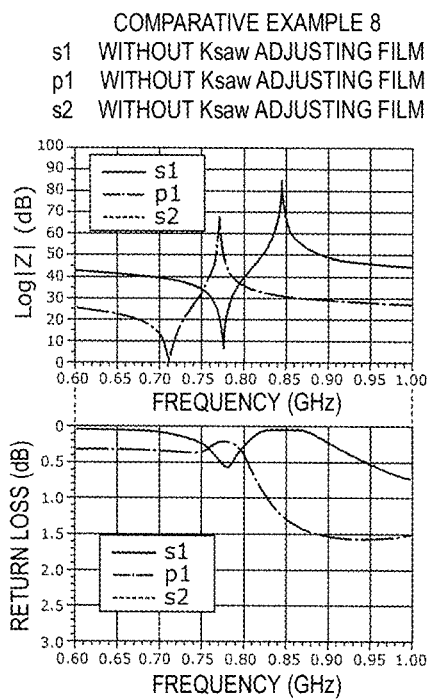
FIG. 14B shows a graph of the resonant characteristics of the lower-frequency filter of the multiplexer and a graph of the reflection characteristics of each resonator of the lower-frequency filter of the multiplexer according to the Comparative Example 8.

FIG. 13B shows graphs of the bandpass characteristics and reflection characteristics of a lower-frequency filter of a multiplexer according to the Comparative Example 8. FIG. 14B shows graphs of the resonant characteristics and reflection characteristics of each resonator of the lower-frequency filter of the multiplexer according to the Comparative Example 8.

Figure 13C:
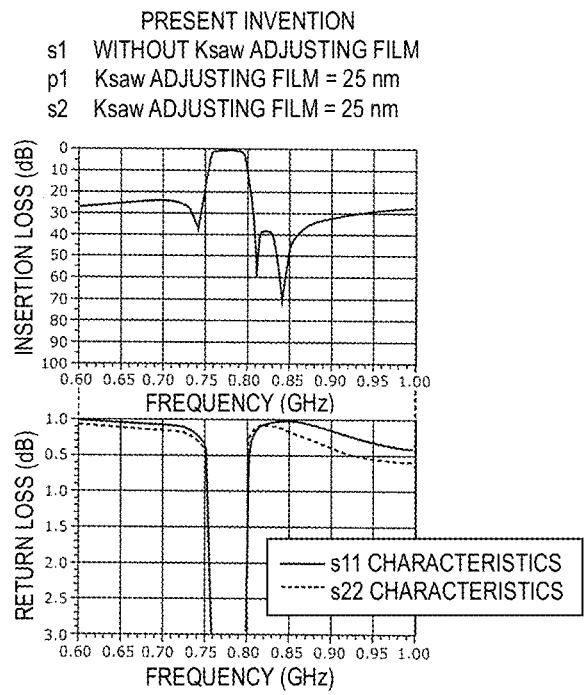
FIG. 13C shows graphs of the bandpass characteristics and reflection characteristics of a lower-frequency filter of the multiplexer according to the fourth preferred embodiment of the present invention.
Figure 14C:
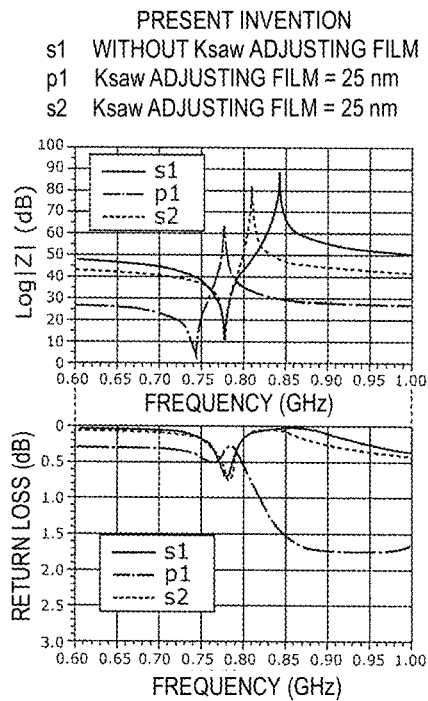
FIG. 14C shows a graph of the resonant characteristics of the lower-frequency filter of the multiplexer and the reflection characteristics of each resonator of the lower-frequency filter of the multiplexer according to the fourth preferred embodiment of the present invention.

FIG. 13C shows graphs of the bandpass characteristics and reflection characteristics of the acoustic wave filter 21 of the multiplexer 1 according to the fourth preferred embodiment. FIG. 14C shows graphs of the resonant characteristics and reflection characteristics of each resonator of the acoustic wave filter 21 of the multiplexer 1 according to the fourth preferred embodiment.

In the lower-frequency filter according to the Comparative Example 7 shown in FIG. 13A and FIG. 14A, the film thicknesses of all of the Ksaw adjusting films of the series arm resonators s1, s2 and parallel arm resonator p1 are set to about 25 nm. In the lower-frequency filter according to the Comparative Example 8 shown in FIG. 13B and FIG. 14B, a Ksaw adjusting film is not provided in any of the series arm resonators s1, s2 and the parallel arm resonator p1.

On the other hand, in the acoustic wave filter 21 according to this Example shown in FIG. 13C and FIG. 14C, a Ksaw adjusting film is not provided in the series arm resonator s1, and the film thicknesses of the Ksaw adjusting films of the series arm resonator s2 and parallel arm resonator p1 are set to about 25 nm. The series arm resonator s1 is disposed closest to the common terminal 110c. The electrostatic capacitance of the series arm resonator s1 is less than the electrostatic capacitance of the series arm resonator s2.

As shown at the bottom graphs of FIGS. 13A to 13C, return losses on the common terminal 110c side at frequencies (about 900 MHz to about 1000 MHz) that correspond to the higher frequency side of the anti-resonant frequency (fa) are as follows.

Comparative Example 7 about 0.6 dB (about 900 MHz to about 1000 MHz)

Comparative Example 8 about 0.7 dB (about 900 MHz to about 1000 MHz)

Example about 0.4 dB (about 900 MHz to about 1000 MHz)

As described above, it is clear that the acoustic wave filter 21 according to this Example is smaller in the return loss than the lower-frequency filters according to the Comparative Example 7 and the Comparative Example 8.

It is clear that, in the acoustic wave filter 21 according to this Example, when the acoustic wave resonator whose Ksaw adjusting film is thick and whose impedance is high is disposed on the common terminal 110c side, a return loss in a frequency band that corresponds to the higher frequency side of the anti-resonant frequency (fa) is small. As described above, when the acoustic wave resonator whose return loss is small is used on the common terminal 110c side, reflection characteristics in the frequency band that is the pass band of the filter 22 are suppressed, and the quality factor as a capacitor is improved.

Next, the impedance and return loss of an acoustic wave resonator will be more specifically described.

Figure 15A:
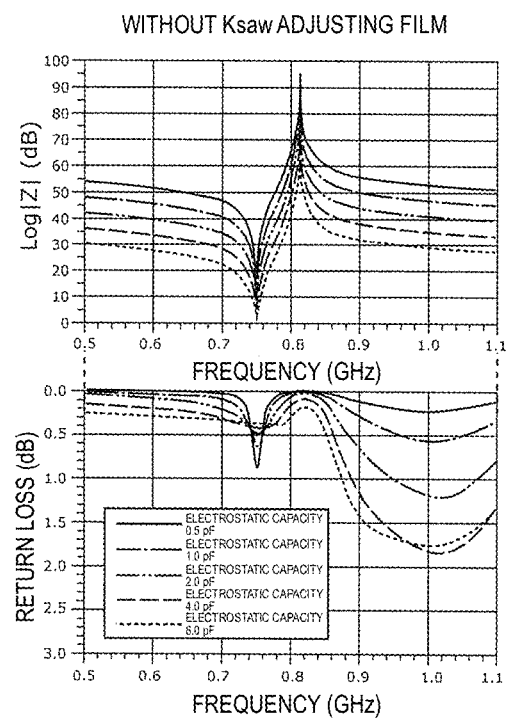
FIG. 15A shows a graph of the relationship between the electrostatic capacitance of an acoustic wave resonator without a Ksaw adjusting film and impedance and a graph of the relationship between the electrostatic capacitance of the acoustic wave resonator and reflection characteristics.
Figure 15B:
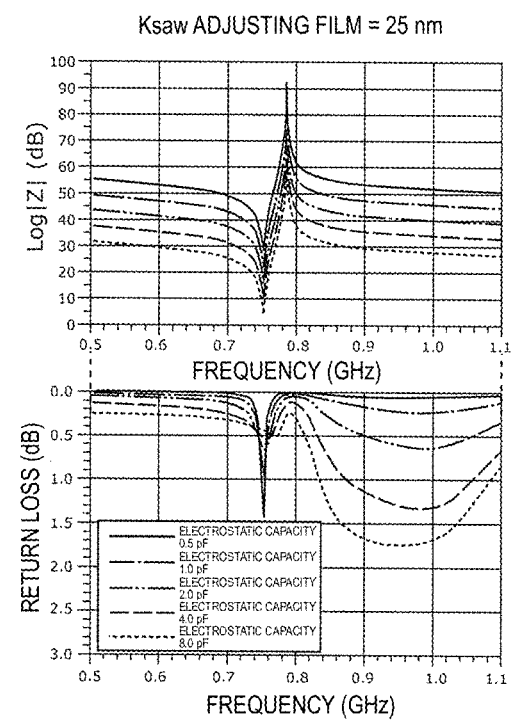
FIG. 15B shows a graph of the relationship between the electrostatic capacitance of an acoustic wave resonator whose Ksaw adjusting film has a film thickness of 25 nm and impedance and a graph of the relationship between the electrostatic capacitance of the acoustic wave resonator and reflection characteristics.

FIG. 15A shows a graph of the relationship between the electrostatic capacitance of an acoustic wave resonator without a Ksaw adjusting film and impedance and a graph of the relationship between the electrostatic capacitance of the acoustic wave resonator and reflection characteristics. FIG. 15B shows a graph of the relationship between the electrostatic capacitance of an acoustic wave resonator with a Ksaw adjusting film having a film thickness of about 25 nm and impedance and a graph of the relationship between the electrostatic capacitance of the acoustic wave resonator and reflection characteristics. FIGS. 15A and 15B show changes in characteristics when the resonant frequency fr of the acoustic wave resonator is fixed to about 750 MHz and only the impedance (here, electrostatic capacitance) is changed.

The relationship between the impedance Z and electrostatic capacitance C of the acoustic wave resonator is expressed by the following mathematical expression 2.

Mathematical Expression 2

$$Z = \frac{1}{j\omega C}(\Omega) \quad (2)$$

Figure 16A:
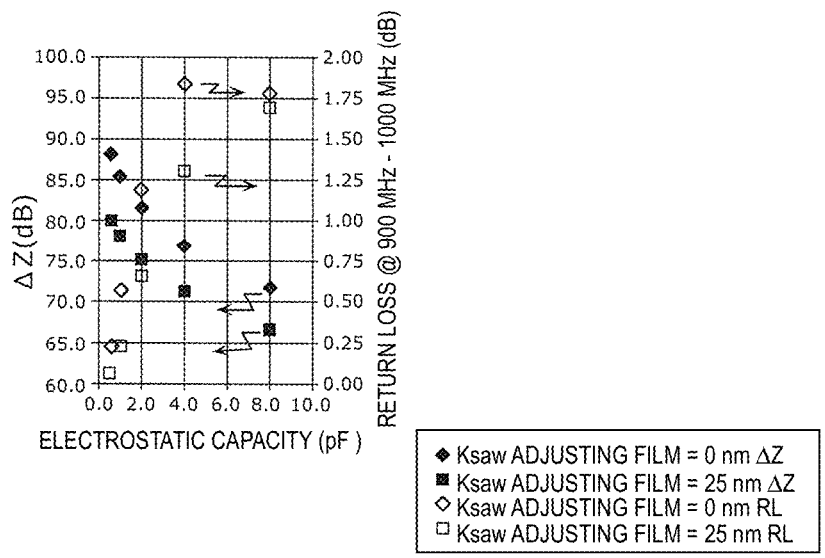
FIG. 16A shows a graph of the relationship between the electrostatic capacitance of an acoustic wave resonator with or without a Ksaw adjusting film and the impedance ratio between a resonant frequency and an anti-resonant frequency and a graph of the relationship between the electrostatic capacitance of the acoustic wave resonator and a return loss in a higher-frequency band.
Figure 16B:
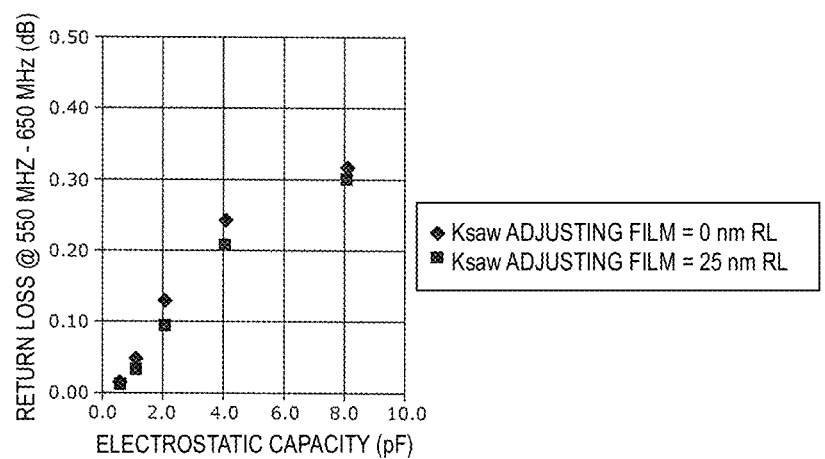
FIG. 16B shows a graph of the relationship between the electrostatic capacitance of an acoustic wave resonator with or without a Ksaw adjusting film and a return loss in a lower-frequency band.

FIG. 16A shows a graph of the relationship between the electrostatic capacitance C of an acoustic wave resonator with or without a Ksaw adjusting film and the impedance ratio (ΔZ) between the resonant frequency (fr) and the anti-resonant frequency (fa) and a graph of the relationship between the electrostatic capacitance C of the acoustic wave resonator and a return loss in a higher frequency band. FIG. 16B is a graph showing the relationship between the electrostatic capacitance C of an acoustic wave resonator with or without a Ksaw adjusting film and a return loss in a lower frequency band.

According to FIGS. 15A, 15B, and FIG. 16A, when the impedance Z of the acoustic wave resonator is increased (the electrostatic capacitance C is reduced), a bulk wave loss that arises in a frequency band corresponding to the higher frequency side of the anti-resonant frequency (fa) (a frequency band higher than or equal to about 850 MHz) is reduced, and a return loss reduces. On the other hand, when the film thickness of the Ksaw adjusting film is increased, Ksaw reduces, and the impedance ratio (ΔZ) also reduces.

As described above, when an acoustic wave resonator including a thinner Ksaw adjusting film is used as the series arm resonator s1 that is connected to the common terminal 110c side, the impedance ratio of which the impedance ratio (ΔZ) is large is increased, so a resonator is able to be designed to have a higher impedance (smaller electrostatic capacitance). It is ideally required for a series arm resonator that is a component of a filter that the impedance be infinite in a pass band, the impedance be infinitesimal at an attenuation pole, and the impedance ratio be infinite. Thus, to increase the impedance ratio, it is preferable to reduce the electrostatic capacitance. However, when the electrostatic capacitance is reduced, the impedance Zr at the resonant frequency that determines the pass band increases and a loss in the pass band is worsened.

In the series arm resonator, when a priority is given to low loss properties in the pass band, it is required to decrease the impedance Zr at the resonant frequency, such that it is effective to select a design with no Ksaw adjusting film or with a thin Ksaw adjusting film. For example, when the impedance Zr at the resonant frequency is about 5 dB, the electrostatic capacitance C may be about 1 pF when a Ksaw adjusting film is not provided. However, the electrostatic capacitance C needs to be about 2 pF when the film thickness of the Ksaw adjusting film is about 25 nm. A bulk wave loss in this case is about 0.58 dB when a Ksaw adjusting film is not provided and is about 0.66 dB when the film thickness of the Ksaw adjusting film is about 25 nm.

Therefore, when a resonator without a Ksaw adjusting film is selected as the series arm resonator s1, a design of a small electrostatic capacitance and a small bulk wave loss is possible, and a loss in the pass band is reduced.

When FIGS. 15A and 15B are compared with each other, the acoustic wave resonator including a thicker Ksaw adjusting film produces a smaller bulk wave loss in the frequency band (a smaller return loss), but has a higher impedance Z at the resonant frequency than the acoustic wave resonator including a thinner Ksaw adjusting film. To ensure low loss properties in a pass band for a filter, each acoustic wave resonator needs to be designed to have a lower impedance Zr (greater electrostatic capacitance). As a result, a bulk wave loss increases.

Thus, when the Ksaw adjusting film of the series arm resonator s1 disposed closest to the common terminal 110c is thinner than the Ksaw adjusting film of the other series arm resonator (series arm resonator s2) (or the Ksaw adjusting film of the series arm resonator s1 is omitted) and the electrostatic capacitance of the series arm resonator s1 is less than the electrostatic capacitance of the other series arm resonator (series arm resonator s2), a bulk wave loss in a frequency band on the higher frequency side of the anti-resonant point, which corresponds to the pass band of the filter 22, is reduced while the low loss properties of the acoustic wave filter 21 are ensured, and the quality factor of the capacitor in the frequency band is improved.

Figure 17:
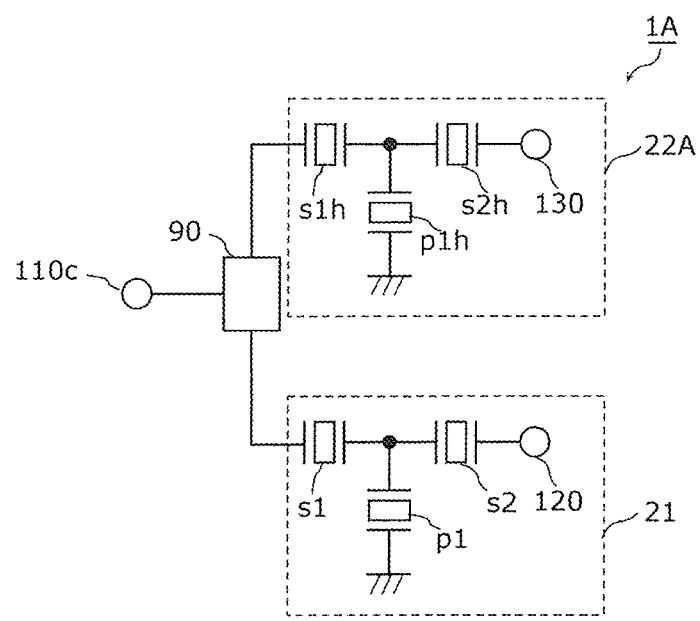
FIG. 17 is a basic circuit configuration diagram of a multiplexer according to a modification of the fourth preferred embodiment of the present invention.

FIG. 17 is a basic circuit configuration diagram of a multiplexer 1A according to a modification of the fourth preferred embodiment. The multiplexer 1A shown in the diagram includes the acoustic wave filter 21, an acoustic wave filter 22A, the connection circuit 90, the common terminal 110c, and the input/output terminals 120, 130. The multiplexer 1A according to this modification differs from the multiplexer 1 according to the fourth preferred embodiment only in the configuration of the filter 22A. Hereinafter, the multiplexer 1A according to this modification will be described focusing on the differences from the multiplexer 1.

As shown in FIG. 17, the filter 22A includes series arm resonators s1h, s2h, a parallel arm resonator p1h, and the input/output terminal 130, and is a second filter having a pass band at higher frequencies than the pass band of the acoustic wave filter 21.

The series arm resonators s1h, s2h are respectively a third series arm resonator and a fourth series arm resonator provided in a fourth path that connects the common terminal 110c (third input/output terminal) and the input/output terminal 130 (fourth input/output terminal). The third series arm resonator and the fourth series arm resonator are acoustic wave resonators.

The parallel arm resonator p1h is provided in a path that connects the ground and a node. The node connects the series arm resonators s1h, s2h.

The series arm resonator s1h is disposed closest to the connection circuit 90 and the common terminal 110c.

The electrostatic capacitance of the series arm resonator s1h is less than the electrostatic capacitance of the series arm resonator s2h. The filter 22A has a basic circuit configuration of the acoustic wave filter, and may have, for example, the circuit configuration as shown in FIG. 2A or the circuit configuration as shown in FIG. 2B. In this case, when the filter 22A includes three or more series arm resonators, the electrostatic capacitance of the series arm resonator s1h is less than the electrostatic capacitance of any of the series arm resonators other than the series arm resonator s1h.

FIG. 16B is a graph showing the relationship between the electrostatic capacitance C of an acoustic wave resonator with or without a Ksaw adjusting film and a return loss in a lower frequency band. The graph shown in the drawing depends on the data of the acoustic wave resonators by which the results of FIG. 16A are obtained, and shows reflection characteristics in a frequency band (about 550 MHz to about 650 MHz) on the lower side of the resonant frequency, which corresponds to the lower side of the pass band. The data is associated with the acoustic wave filter 21. However, the data is also applicable to the filter 22A when the frequencies are shifted. According to FIG. 16B, a return loss in the frequency band (about 550 MHz to about 650 MHz) on the lower side of the resonant frequency reduces as the impedance of the acoustic wave resonator is increased (the electrostatic capacitance is reduced).

Thus, in the filter 22A, when the series arm resonator s1h that is directly or indirectly connected to the common terminal 110c is designed to have a higher impedance (smaller electrostatic capacitance), a loss in the pass band of the acoustic wave filter 21 is reduced.

A return loss in the frequency band on the lower side of the resonant frequency varies not with a bulk wave loss of an acoustic wave resonator, but with the resistance of electrode fingers of the acoustic wave resonator. As the impedance of the acoustic wave resonator is increased (the electrostatic capacitance is reduced), the area (Number of pairs×Overlap width) of an interdigital transducer electrode that is a component of the acoustic wave resonator reduces, so the resistance of the electrode fingers reduces, and the quality factor of the capacitor improves.

From this viewpoint, in the filter 22A, it is preferable that the series arm resonator s1h that is directly or indirectly connected to the common terminal 110c is designed to have a higher impedance (smaller electrostatic capacitance). Even at the same impedance of the resonator, it is preferable that the number of pairs are increased and the overlap width is narrowed.

In the filter 22A, the presence or absence of a Ksaw adjusting film or the film thickness of the Ksaw adjusting film is not limited. All of the acoustic wave resonators may have the same film thickness or may include two or more types of film thicknesses.

Fifth Preferred Embodiment

The acoustic wave filter 10 according to the first preferred embodiment is also applicable to a tunable acoustic wave filter that is able to change the pass band through the on/off operation of a switch.

Figure 18A:
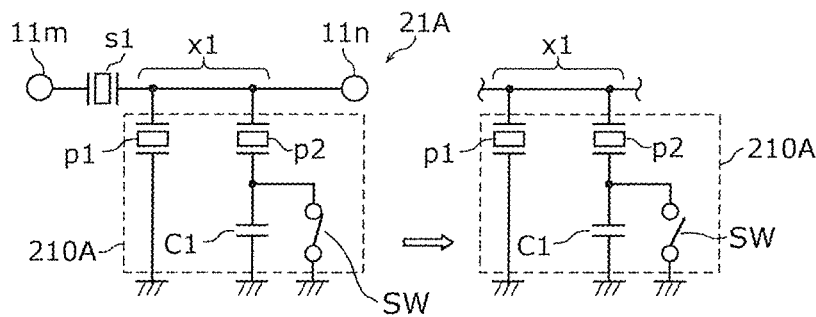
FIG. 18A is a circuit configuration diagram of an acoustic wave filter according to a fifth preferred embodiment of the present invention.

FIG. 18A is a circuit configuration diagram of an acoustic wave filter 21A according to a fifth preferred embodiment of the present invention. The acoustic wave filter 21A shown in FIG. 18A includes the series arm resonator s1, the parallel arm resonators p1, p2, a switch SW, and a capacitor C1.

The series arm resonator s1 is connected between an input/output terminal 11m and an input/output terminal 11n. That is, the series arm resonator s1 is provided in a series arm that connects the input/output terminal 11m and the input/output terminal 11n.

The parallel arm resonator p1 is connected between a ground (reference terminal) and a node (node x1 in FIG. 18A) in a path that connects the input/output terminal 11m and the input/output terminal 11n, and is a first parallel arm resonator having a first resonant frequency.

The parallel arm resonator p2 is connected between the ground (reference terminal) and the node (node x1 in FIG. 18A) in the path that connects the input/output terminal 11m and the input/output terminal 11n, and is a second parallel arm resonator having a second resonant frequency higher than the first resonant frequency.

Although not shown in FIG. 18A, the series arm resonator s2 is provided in a series arm that connects the node x1 and the input/output terminal 11n.

The capacitor C1 and the switch SW are each connected in series with at least one of the parallel arm resonator p1 and the parallel arm resonator p2 between the node x1 and the ground, and are connected in parallel with each other. In the present preferred embodiment, of the parallel arm resonators p1, p2, only the parallel arm resonator p2 is connected in series with the capacitor C1 and the switch SW.

That is, in the present preferred embodiment, the circuit (variable frequency circuit) in which the capacitor C1 and the switch SW are connected in parallel with each other is connected in series with the parallel arm resonator p2 between the node x1 and the ground, and is specifically connected in series between the ground and the parallel arm resonator p2. The capacitor C1 and the switch SW may be connected between the node x1 and the parallel arm resonator p2.

The capacitor C1 is an impedance element connected in series with the parallel arm resonator p2. The variable frequency width of the pass band of the acoustic wave filter 21A depends on the constant of the capacitor C1. For example, the variable frequency width widens as the constant of the capacitor C1 reduces. For this reason, the constant of the capacitor C1 is able to be determined depending on frequency specifications that are required of the acoustic wave filter 21A. The capacitor C1 may preferably be, for example, a variable capacitor, such as a varicap diode and a DTC (digitally tunable capacitor). Instead of the capacitor C1, a variable inductor defined by an inductor, a MEMS, or other suitable device, may be provided.

The switch SW is preferably, for example, an SPST (single pole single throw) switch element of which one terminal is connected to a connection node between the parallel arm resonator p2 and the capacitor C1 and the other terminal is connected to the ground. The switch SW establishes or interrupts continuity between the connection node and the ground when a conductive (on) state and a non-conductive (off) state are switched in response to a control signal from a controller (for example, an RFIC (described later)).

Examples of the switch SW include a diode switch or an FET (field effect transistor) switch made of GaAs or CMOS (complementary metal oxide semiconductor). With this configuration, the switch SW is preferably defined by a single FET switch or diode switch, for example, so the acoustic wave filter 21A is miniaturized.

The parallel arm resonators p1, p2, the capacitor C1, and the switch SW define a parallel arm circuit 210A connected between the ground and the node x1 in the path (series arm) that connects the input/output terminal 11m and the input/output terminal 11n. That is, the parallel arm circuit 210A is provided in a single parallel arm that connects the series arm and the ground. Thus, the acoustic wave filter 21A has a single-stage ladder filter structure including the series arm resonator s1 and the parallel arm circuit 210A.

In the parallel arm circuit 210A, the frequency at which the impedance is a minimum and the frequency at which the impedance is a maximum both shift toward the lower side or the higher side depending on the on state (conductive state) or off state (non-conductive state) of the switch SW. This will be described later together with the bandpass characteristics of the acoustic wave filter 21A.

In the present preferred embodiment, the resonators (the series arm resonators s1, s2, and the parallel arm resonators p1, p2) of the acoustic wave filter 21A are preferably surface acoustic wave resonators, for example.

Figure 18B:
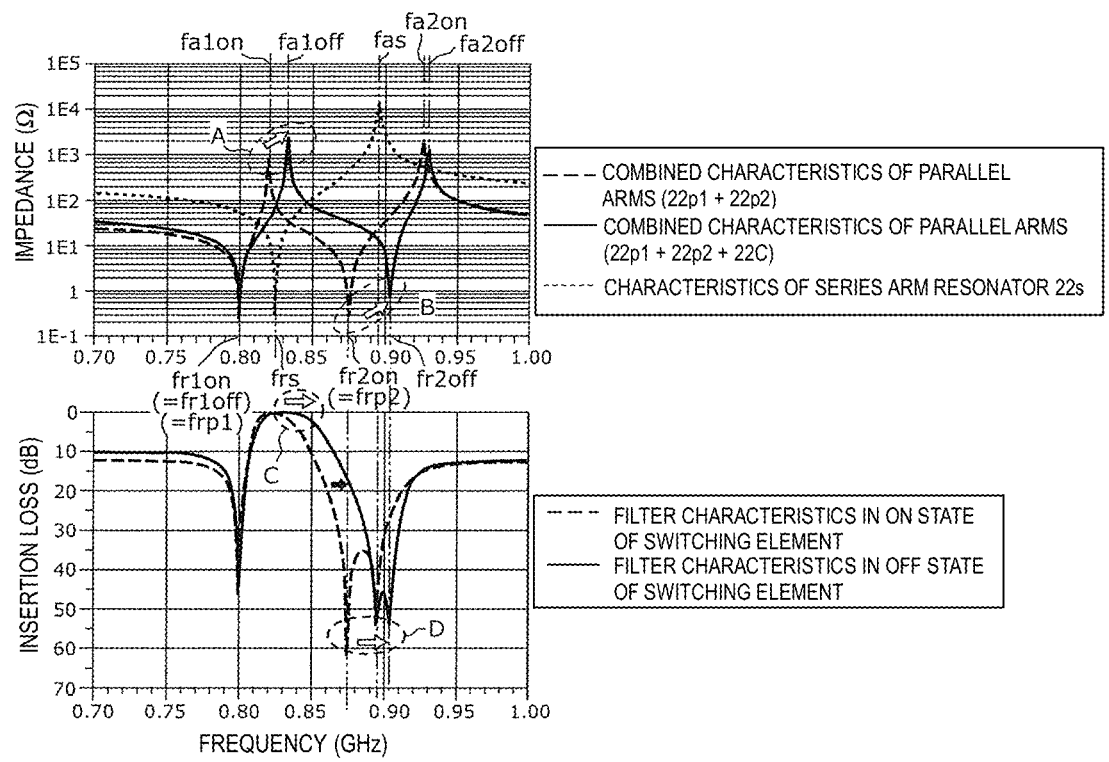
FIG. 18B shows graphs of the resonant characteristics and bandpass characteristics of the acoustic wave filter according to the fifth preferred embodiment of the present invention.

FIG. 18B shows graphs of the resonant characteristics and bandpass characteristics of the acoustic wave filter 21A according to the fifth preferred embodiment.

As shown in FIG. 18B, when the switch SW is changed from the on state to the off state, the impedance characteristics of the parallel arm circuit 210A change as follows. That is, in the parallel arm circuit 210A, a higher resonant frequency (fr2on) of the two resonant frequencies (fr1on, fr2on) and a lower anti-resonant frequency (fa1on) of the two anti-resonant frequencies (fa1on, fa2on) both shift toward the higher side (fr2off, fa1off). In the present preferred embodiment, since only the parallel arm resonator p2 is connected in series with the capacitor C1 and the switch SW, the higher resonant frequency of the two resonant frequencies shifts toward the higher side, that is, from fr2on to fr2off (portion B in the graph). The lower anti-resonant frequency shifts toward the higher side, that is, from fa1on to fa1off (portion A in the graph).

The lower anti-resonant frequency and higher resonant frequency of the parallel arm circuit 210A determine an attenuation slope on the higher side of the pass band of the acoustic wave filter 21A, and both shift toward the higher side as described above. Therefore, as shown in the bottom graph of FIG. 18B, when the switch SW changes from the on state to the off state, the attenuation slope on the higher side of the pass band shifts toward the higher side while maintaining steepness in the bandpass characteristics of the acoustic wave filter 21A (see the solid arrow in the graph). In other words, the acoustic wave filter 21A is able to shift the attenuation pole on the higher side of the pass band toward the higher side (portion D in the graph), and also shift the higher side of the pass band toward the higher side without dropping the shoulder of the higher side of the pass band (portion C in the graph).

The acoustic wave filter 10 according to the first preferred embodiment is applicable to the acoustic wave filter 21A having the above-described configuration and filter characteristics.

The acoustic wave filter 21A includes not only the circuit configuration shown in FIG. 18A but also the series arm resonator s2 provided in the series arm that connects the node x1 and the input/output terminal 11n.

The series arm resonator s2 includes the second adjusting film that adjusts Ksaw and that is provided between the piezoelectric body and the interdigital transducer electrode. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided between the piezoelectric body and interdigital transducer electrode of the series arm resonator s1 or, when the first adjusting film that adjusts Ksaw is provided between the piezoelectric body and interdigital transducer electrode of the series arm resonator s1, the first adjusting film is thinner than the second adjusting film (the film thickness of the first adjusting film is less than the film thickness of the second adjusting film).

With the above configuration, a tunable filter that is able to ensure a wide stop band on the higher side of a pass band while ensuring steepness on the higher side of the pass band with the attenuation pole of the series arm resonator s2 and to obtain sufficient attenuation in the stop band is provided.

The film thickness of the Ksaw adjusting film of the parallel arm resonator p1 may be equal or substantially equal to the film thickness of the Ksaw adjusting film of the series arm resonator s2, and an adjusting film need not be provided in any of the series arm resonator s1 and the parallel arm resonator p2 or the film thickness of the Ksaw adjusting film of the series arm resonator s1 may be equal or substantially equal to the film thickness of the Ksaw adjusting film of the parallel arm resonator p2.

With this configuration, a portion of the pass band and the attenuation pole near the pass band is defined by the combined characteristics of the two parallel arm resonators p1, p2 having different frequencies. Since the above-described combined characteristics have the characteristics of a resonant band (|fa*−fr*|) narrower than the resonant band width (fa−fr) of each of the two parallel arm resonators p1, p2, the two parallel arm resonators p1, p2 need to be designed to have a wider resonant band width defined. Thus, when the Ksaw adjusting film of the parallel arm resonator p2 in the parallel arm circuit 210A is set to the same or substantially the same Ksaw adjusting film as that of the series arm resonator s1, the two parallel arm resonators p1, p2 are designed to have a wide resonant band width for the combined characteristics of the two parallel arm resonators p1, p2.

A frequency change to narrow the resonant band width relative to the other SW operation is made by any one of the on/off operations of the switch SW. At this time, when the resonant band width is widened by designing the Ksaw adjusting film of the parallel arm resonator p2 with a reduced thickness, a wide variable frequency width is obtained.

Figure 18C:
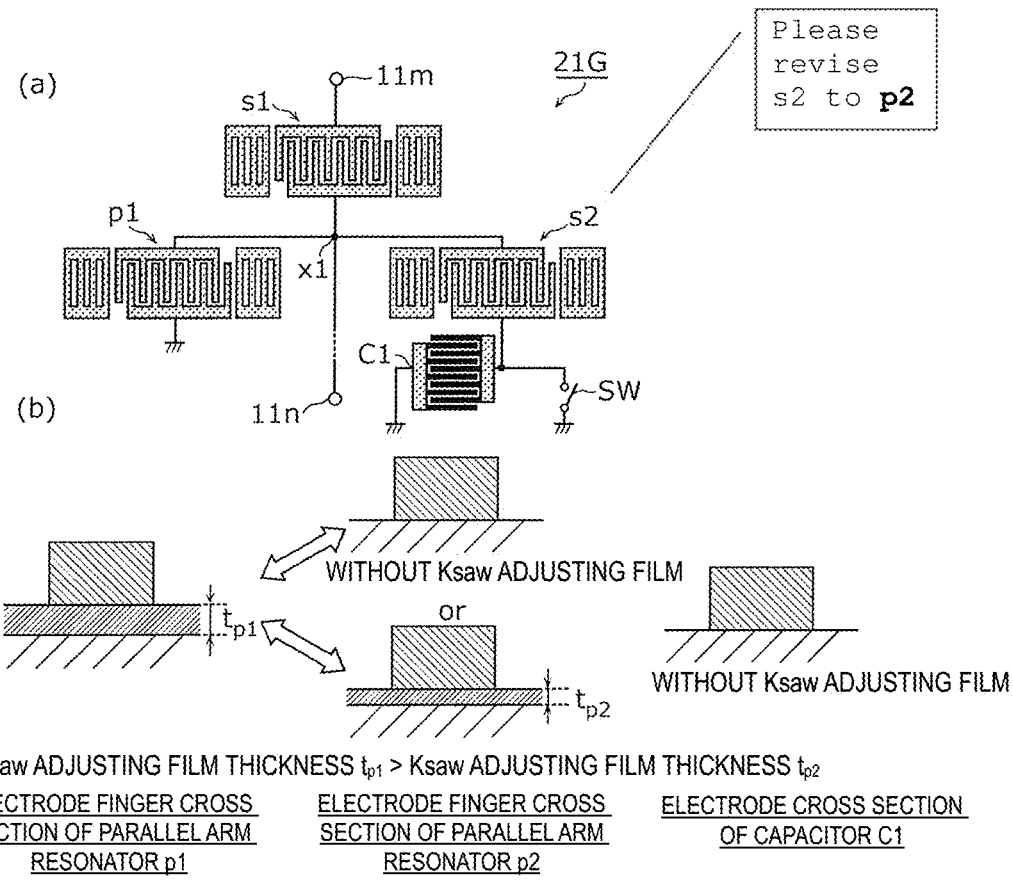
FIG. 18C shows the electrode configuration diagram and electrode cross-sectional view of an acoustic wave filter according to a sixth modification of the fifth preferred embodiment of the present invention.

FIG. 18C shows the electrode configuration diagram and electrode cross-sectional view of an acoustic wave filter 21G according to a sixth modification of the fifth preferred embodiment. The acoustic wave filter 21G shown in the diagram includes the series arm resonator s1, the parallel arm resonators p1, p2, the switch SW, and the capacitor C1.

The series arm resonator s1 is connected between the input/output terminal 11m and the input/output terminal 11n. That is, the series arm resonator s1 is the first series arm resonator provided in the series arm that connects the input/output terminal 11m and the input/output terminal 11n.

The parallel arm resonator p1 is connected between the ground (reference terminal) and the node (the node x1 in FIG. 18C) in the path that connects the input/output terminal 11m and the input/output terminal 11n. The parallel arm resonator p1 is the second parallel arm resonator having the second resonant frequency.

The parallel arm resonator p2 is connected between the ground (reference terminal) and the node (the node x1 in FIG. 18C) in the path that connects the input/output terminal 11m and the input/output terminal 11n. The parallel arm resonator p2 is the first parallel arm resonator having the first resonant frequency lower than the second resonant frequency.

The capacitor C1 and the switch SW are each connected in series with the parallel arm resonator p2 between the node x1 and the ground, and are connected in parallel with each other.

That is, in the present modification, the circuit (variable frequency circuit) in which the capacitor C1 and the switch SW are connected in parallel with each other is connected in series with the parallel arm resonator p2 between the node x1 and the ground, and is specifically connected in series between the ground and the parallel arm resonator p2.

The parallel arm resonator p1 includes the fourth adjusting film that adjusts Ksaw and that is provided between the piezoelectric body and the interdigital transducer electrode. The resonant frequency of the parallel arm resonator p2 is lower than the resonant frequency of the parallel arm resonator p1. In addition, an adjusting film that adjusts Ksaw is not provided between the piezoelectric body and interdigital transducer electrode of the parallel arm resonator p2, or, when the third adjusting film that adjusts Ksaw is provided between the piezoelectric body and interdigital transducer electrode of the parallel arm resonator p2, the third adjusting film is thinner than the fourth adjusting film (the film thickness of the third adjusting film is less than the film thickness of the fourth adjusting film).

With the above configuration, the electromechanical coupling coefficients of the two parallel arm resonators are varied with the third adjusting film and the fourth adjusting film having different film thicknesses. Therefore, when the anti-resonant frequencies of the two parallel arm resonators are coincident or substantially coincident with each other to ensure the bandpass characteristics, the resonant frequency of the parallel arm resonator p2 is able to be made lower than the resonant frequency of the parallel arm resonator p1. Thus, since two attenuation poles, that is, the attenuation pole that is provided by the parallel arm resonator p2 (on the lower side near a stop band) and the attenuation pole that is provided by the parallel arm resonator p1 (on the higher side near the stop band), are around the stop band on the lower side of the pass band, a wide stop band on the lower side of the pass band is ensured while steepness on the lower side of the pass band is ensured by the attenuation pole of the parallel arm resonator p1, and sufficient attenuation is obtained. In addition, the variable frequency circuit is connected to the parallel arm resonator p2 having a wide resonant band width ratio BWR without an adjusting film or with the third adjusting film, and, when the switch SW is in a conductive state, the series circuit including the parallel arm resonator p2 and the variable frequency circuit changes the frequency in a direction to narrow the resonant band width of the parallel arm resonator p2. Thus, a tunable filter that is able to ensure a large variation width of the resonant band width using the variable frequency circuit is provided.

The capacitor C1 may preferably include, for example, a comb electrode provided on the piezoelectric body, and an adjusting film made of an insulator or dielectric need not be provided between the piezoelectric body and the comb electrode. The comb electrode of the capacitor C1, as well as the interdigital transducer electrode of the resonator, is preferably made of an electrode film, for example. That is, the comb electrode that is a component of the capacitor C1 is provided on the same substrate as the interdigital transducer electrode that is a component of each resonator. The comb electrode and the interdigital transducer electrode may be provided on different substrates from each other. The comb electrode of the capacitor C1 includes a plurality of electrode fingers and a pair of busbar electrodes facing each other across the plurality of electrode fingers, and the plurality of electrode fingers are alternately connected to the pair of busbar electrodes. It is preferable that the plurality of electrode fingers extend along a propagation direction of acoustic waves and are periodically provided along a direction perpendicular or substantially perpendicular to the propagation direction. The permittivity of the adjusting film preferably made of, for example, $SiO_2$ or other suitable material, is less than the permittivity of the piezoelectric body. Thus, since an adjusting film is not provided between the capacitor and the piezoelectric body, a large capacitance value per unit area of the capacitor is ensured.

The acoustic wave filter 21G may further include the series arm resonator s2 provided in the series arm that connects the input/output terminals at both ends. In this case, the series arm resonator s1 may include the second adjusting film that adjusts Ksaw and that is provided between the piezoelectric body and the interdigital transducer electrode, and an adjusting film that adjusts Ksaw need not be provided between the piezoelectric body and interdigital transducer electrode of the series arm resonator s2 or, when the first adjusting film that adjusts Ksaw is provided between the piezoelectric body and interdigital transducer electrode of the series arm resonator s2, the first adjusting film may be thinner than the second adjusting film (the film thickness of the first adjusting film may be less than the film thickness of the second adjusting film).

Although not shown in the diagram, instead of the acoustic wave filter 21G in which a capacitor is disposed according to the present modification, an acoustic wave filter 21H in which an inductor is included may be provided. The acoustic wave filter 21H includes the series arm resonator s1, the parallel arm resonators p1, p2, the switch SW, and an inductor L1.

The series arm resonator s1 is connected between the input/output terminal 11m and the input/output terminal 11n. That is, the series arm resonator s1 is the first series arm resonator provided in the series arm that connects the input/output terminal 11m and the input/output terminal 11n.

The parallel arm resonator p1 is connected between the ground (reference terminal) and the node x1 in the path that connects the input/output terminal 11m and the input/output terminal 11n, and is the first parallel arm resonator having the first resonant frequency.

The parallel arm resonator p2 is connected between the ground (reference terminal) and the node x1 in the path that connects the input/output terminal 11m and the input/output terminal 11n, and is the second parallel arm resonator having the second resonant frequency lower than the first resonant frequency.

The inductor L1 and the switch SW are each connected in series with the parallel arm resonator p1 between the node x1 and the ground, and are connected in parallel with each other.

That is, in the present modification, the circuit (variable frequency circuit) in which the inductor L1 and the switch SW are connected in parallel with each other is connected in series with the parallel arm resonator p1 between the node x1 and the ground, and is specifically connected in series between the ground and the parallel arm resonator p1.

The parallel arm resonator p1 includes the fourth adjusting film that adjusts Ksaw and that is provided between the piezoelectric body and the interdigital transducer electrode. The resonant frequency of the parallel arm resonator p2 is lower than the resonant frequency of the parallel arm resonator p1. In addition, an adjusting film that adjusts Ksaw is not provided between the piezoelectric body and interdigital transducer electrode of the parallel arm resonator p2, or, when the third adjusting film that adjusts Ksaw is provided between the piezoelectric body and interdigital transducer electrode of the parallel arm resonator p2, the third adjusting film is thinner than the fourth adjusting film (the film thickness of the third adjusting film is less than the film thickness of the fourth adjusting film).

With the above configuration, the electromechanical coupling coefficients of the two parallel arm resonators are varied with the third adjusting film and fourth adjusting film having different film thicknesses. Therefore, when the anti-resonant frequencies of the two parallel arm resonators are brought into substantially coincidence with each other to ensure the bandpass characteristics, the resonant frequency of the parallel arm resonator p2 can be made lower than the resonant frequency of the parallel arm resonator p1. Thus, since the attenuation pole that is provided by the parallel arm resonator p2 (on the lower side near a stop band) and the attenuation pole that is provided by the parallel arm resonator p1 (on the higher side near the stop band) around the stop band on the lower side of the pass band, a wide stop band on the lower side of the pass band is ensured by the attenuation pole of the parallel arm resonator p2 while steepness on the lower side of the pass band is ensured by the attenuation pole of the parallel arm resonator p1, and sufficient attenuation is obtained. In addition, the variable frequency circuit is connected to the parallel arm resonator p1 having a wide resonant band width ratio BWR with the fourth adjusting film, and, when the switch SW is in a conductive state, the series circuit including the parallel arm resonator p1 and the variable frequency circuit changes the frequency in a direction to widen the resonant band width of the parallel arm resonator p1. Thus, a tunable filter that is able to ensure a large variation width of the resonant band width by using the variable frequency circuit is provided.

The acoustic wave filter 21H may further include the series arm resonator s2 provided in the series arm that connects the input/output terminals at both ends. In this case, the series arm resonator s1 may include the second adjusting film that adjusts Ksaw and that is provided between the piezoelectric body and the interdigital transducer electrode, and an adjusting film that adjusts Ksaw need not be provided between the piezoelectric body and interdigital transducer electrode of the series arm resonator s2 or, when the first adjusting film that adjusts Ksaw is provided between the piezoelectric body and interdigital transducer electrode of the series arm resonator s2, the first adjusting film may be thinner than the second adjusting film (the film thickness of the first adjusting film may be less than the film thickness of the second adjusting film).

Figure 19:
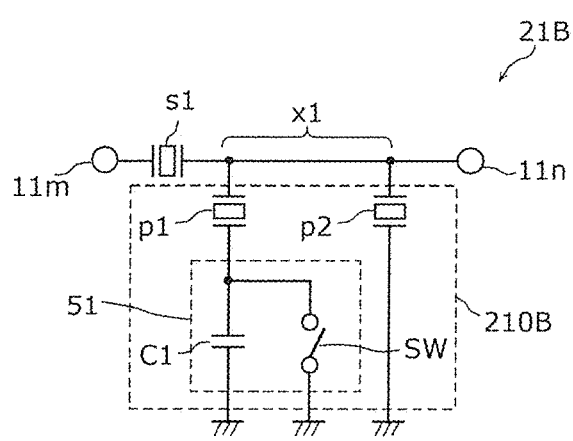
FIG. 19 is a circuit configuration diagram of an acoustic wave filter according to a first modification of the fifth preferred embodiment of the present invention.

FIG. 19 is a circuit configuration diagram of an acoustic wave filter 21B according to a first modification of the fifth preferred embodiment.

The acoustic wave filter 21B shown in the diagram includes a parallel arm circuit 210B instead of the parallel arm circuit 210A that the acoustic wave filter 21A shown in FIG. 18A includes. When the parallel arm circuit 210B is compared with the parallel arm circuit 210A, a variable frequency circuit 51 is connected to the parallel arm resonator p1.

Specifically, the parallel arm resonator p2 is higher in resonant frequency and anti-resonant frequency than the parallel arm resonator p1, and the variable frequency circuit 51 is connected in series with only the parallel arm resonator p1 of the parallel arm resonator p1 and the parallel arm resonator p2. That is, the parallel arm resonator p2 is connected in parallel with the circuit in which the parallel arm resonator p1 and the variable frequency circuit 51 are connected in series with each other.

The parallel arm circuit 210B has a minimum impedance at the frequency at the resonant point of each of the parallel arm resonators p1, p2. That is, the parallel arm circuit 210B has two resonant frequencies. The parallel arm circuit 210B has a maximum impedance in a frequency band between the two resonant frequencies and in a frequency band higher than the two resonant frequencies. That is, the parallel arm circuit 210B has two anti-resonant frequencies.

With the above configuration, in the present modification, the acoustic wave filter 21B is able to shift the attenuation pole on the lower side of the pass band toward the higher side and shift the pass band toward the higher side without dropping the shoulder of the lower side of the pass band when the switch SW changes from the on state to the off state.

The acoustic wave filter 10 according to the first preferred embodiment is applicable to the acoustic wave filter 21B having the above-described configuration and filter characteristics.

The acoustic wave filter 21B includes not only the circuit configuration shown in FIG. 19 but also the series arm resonator s2 provided in the series arm that connects the node x1 and the input/output terminal 11n.

The series arm resonator s2 includes the second adjusting film that adjusts Ksaw. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided in the series arm resonator s1 or, when the first adjusting film that adjusts Ksaw is provided in the series arm resonator s1, the first adjusting film is thinner than the second adjusting film (the film thickness of the first adjusting film is less than the film thickness of the second adjusting film).

With the above configuration, a tunable filter that is able to ensure a wide stop band on the higher side of the pass band while ensuring steepness on the higher side of the pass band with the attenuation pole of the series arm resonator s2 and to obtain sufficient attenuation in the stop band is provided.

The film thickness of the Ksaw adjusting film of the parallel arm resonator p2 may preferably be equal or substantially equal to the film thickness of the Ksaw adjusting film of the series arm resonator s2, and an adjusting film need not be provided in any of the series arm resonator s1 and the parallel arm resonator p1 or the film thickness of the Ksaw adjusting film of the series arm resonator s1 may preferably be equal or substantially equal to the film thickness of the Ksaw adjusting film of the parallel arm resonator p1.

With this configuration, a portion of the pass band and attenuation pole near the pass band is provided by the combined characteristics of the two parallel arm resonators p1, p2 having different frequencies. Since the combined characteristics have the characteristics of a resonant band ($|fa*-fr*|$) narrower than the resonant band width (fa−fr) of each of the two parallel arm resonators p1, p2, the two parallel arm resonators p1, p2 are preferably designed to have a wider resonant band width. Thus, when the Ksaw adjusting film of the parallel arm resonator p1 in the parallel arm circuit 210B is the same as the Ksaw adjusting film of the series arm resonator s1, the two parallel arm resonators p1, p2 are designed to have a wide resonant band width for the combined characteristics of the two parallel arm resonators p1, p2.

A frequency change to narrow the resonant band width relative to the other SW operation is made by any one of on/off operations of the switch SW. At this time, when the resonant band width is widened by designing the Ksaw adjusting film of the parallel arm resonator p1 with a reduced thickness, a wide variable frequency width is obtained.

Figure 20:
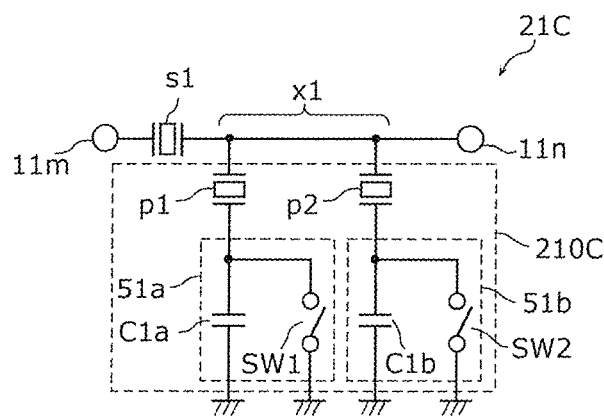
FIG. 20 is a circuit configuration diagram of an acoustic wave filter according to a second modification of the fifth preferred embodiment of the present invention.

FIG. 20 is a circuit configuration diagram of an acoustic wave filter 21C according to a second modification of the fifth preferred embodiment.

The acoustic wave filter 21C shown in the diagram includes a parallel arm circuit 210C instead of the parallel arm circuit 210A that the acoustic wave filter 21A shown in FIG. 18A includes. When the parallel arm circuit 210C is compared with the parallel arm circuit 210A, variable frequency circuits are respectively connected to both of the parallel arm resonators p1, p2.

In the present modification, a capacitive element C1a is added to the parallel arm resonator p1 only when a switch SW1 is in an off state. A capacitive element C1b is added to the parallel arm resonator p2 only when a switch SW2 is in an off state. Therefore, of the two resonant frequencies of the parallel arm circuit 210C, the lower resonant frequency shifts to the higher side than the resonant frequency of the parallel arm resonator p1 alone when the switch SW1 is in the off state. Of the two resonant frequencies of the parallel arm circuit 210C, the higher resonant frequency shifts to the higher side than the resonant frequency of the parallel arm resonator p2 alone when the switch SW2 is in the off state. When at least one of the switches SW1, SW2 is in the off state, the lower anti-resonant frequency of the parallel arm circuit 210C shifts to the higher side than that when both the switches SW1, SW2 are in an on state.

Thus, the acoustic wave filter 21C is able to shift the attenuation pole on the higher side of the pass band and the attenuation pole on the lower side of the pass band to the higher side and shift the pass band to the higher side without dropping the shoulders on the higher side of the pass band and on the lower side of the pass band when the switches SW1, SW2 both change from the on state to the off state. Therefore, the acoustic wave filter 21C is, for example, able to shift the center frequency while maintaining the band width.

The acoustic wave filter 10 according to the first preferred embodiment is applicable to the acoustic wave filter 21C having the above-described configuration and filter characteristics.

The acoustic wave filter 21C includes not only the circuit configuration shown in FIG. 20 but also the series arm resonator s2 provided in the series arm that connects the node x1 and the input/output terminal 11n.

The series arm resonator s2 includes the second adjusting film that adjusts Ksaw. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided in the series arm resonator s1 or, when the first adjusting film that adjusts Ksaw is provided in the series arm resonator s1, the first adjusting film is thinner than the second adjusting film (the film thickness of the first adjusting film is less than the film thickness of the second adjusting film).

With the above configuration, a tunable filter that is able to ensure a wide stop band on the higher side of the pass band while ensuring steepness on the higher side of the pass band with the attenuation pole of the series arm resonator s2 and to obtain sufficient attenuation in the stop band is provided.

The film thickness of the Ksaw adjusting film of the parallel arm resonator p2 may preferably be equal or substantially equal to the film thickness of the Ksaw adjusting film of the series arm resonator s2, and an adjusting film need not be provided in any of the series arm resonator s1 and the parallel arm resonator p1 or the film thickness of the Ksaw adjusting film of the series arm resonator s1 may preferably be equal or substantially equal to the film thickness of the Ksaw adjusting film of the parallel arm resonator p1.

With this configuration, a portion of the pass band and attenuation pole near the pass band is provided by the combined characteristics of the two parallel arm resonators p1, p2 having different frequencies. Since the above-described combined characteristics have the characteristics of a resonant band (|fa*−fr*|) narrower than the resonant band width (fa−fr) of each of the two parallel arm resonators p1, p2, the two parallel arm resonators p1, p2 need to be designed to have a wider resonant band width. Thus, when the Ksaw adjusting film of the parallel arm resonator p1 in the parallel arm circuit 210C is the same as the Ksaw adjusting film of the series arm resonator s1, the two parallel arm resonators p1, p2 are designed to have a wide resonant band width for the combined characteristics of the two parallel arm resonators p1, p2.

A frequency change to narrow the resonant band width relative to the other SW operation is made by any one of the on/off operations of the switch SW. At this time, when the resonant band width is widened by designing the Ksaw adjusting film of the parallel arm resonator p1 with a reduced thickness, a wide variable frequency width is obtained.

Figure 21:
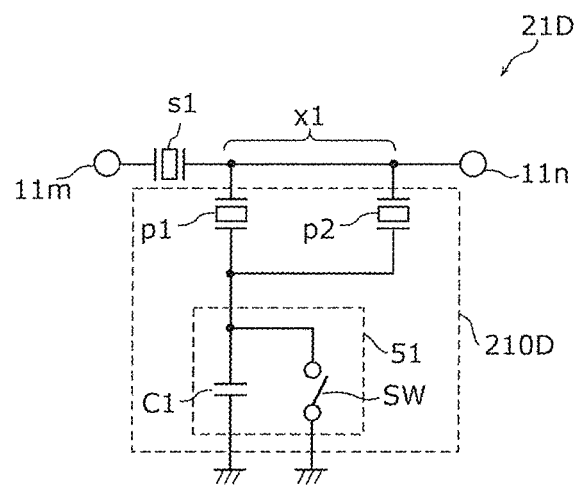
FIG. 21 is a circuit configuration diagram of an acoustic wave filter according to a third modification of the fifth preferred embodiment of the present invention.

FIG. 21 is a circuit configuration diagram of an acoustic wave filter 21D according to a third modification of the fifth preferred embodiment.

The acoustic wave filter 21D shown in the diagram includes a parallel arm circuit 210D, instead of the parallel arm circuit 210A that the acoustic wave filter 21A shown in FIG. 18A includes. When the parallel arm circuit 210D is compared with the parallel arm circuit 210A, a single variable frequency circuit is connected to both of the parallel arm resonators p1, p2.

In the present modification, the capacitive element C1 is added to both of the parallel arm resonators p1, p2 only when the switch SW is in the off state. Therefore, of the two resonant frequencies of the parallel arm circuit 210D, the lower resonant frequency shifts to the higher side than the resonant frequency of the parallel arm resonator p1 alone when the switch SW is in the off state. Of the two resonant frequencies of the parallel arm circuit 210D, the higher resonant frequency shifts to the higher side than the resonant frequency of the parallel arm resonator p2 alone when the switch SW is in the off state. However, the lower anti-resonant frequency of the parallel arm circuit 210D does not shift when the switch SW is in the off state because the variable frequency circuit 51 is connected in series with the circuit in which the parallel arm resonator p1 and the parallel arm resonator p2 are connected in parallel with each other. Thus, the acoustic wave filter 21D is able to shift the attenuation poles on both sides of the pass band to the higher side when the switch SW changes from the on state to the off state.

The acoustic wave filter 10 according to the first preferred embodiment is applicable to the acoustic wave filter 21D having the above-described configuration and filter characteristics.

The acoustic wave filter 21D includes not only the circuit configuration shown in FIG. 21, but also the series arm resonator s2 provided in the series arm that connects the node x1 and the input/output terminal 11n.

The series arm resonator s2 includes the second adjusting film that adjusts Ksaw. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided in the series arm resonator s1 or, when the first adjusting film that adjusts Ksaw is provided in the series arm resonator s1, the first adjusting film is thinner than the second adjusting film (the film thickness of the first adjusting film is less than the film thickness of the second adjusting film).

With the above configuration, a tunable filter that is able to ensure a wide stop band on the higher side of the pass band while ensuring steepness on the higher side of the pass band with the attenuation pole of the series arm resonator s2 and to obtain sufficient attenuation in the stop band is provided.

The film thickness of the Ksaw adjusting film of the parallel arm resonator p2 may preferably be equal or substantially equal to the film thickness of the Ksaw adjusting film of the series arm resonator s2, and an adjusting film need not be provided in any of the series arm resonator s1 and the parallel arm resonator p1 or the film thickness of the Ksaw adjusting film of the series arm resonator s1 may preferably be equal or substantially equal to the film thickness of the Ksaw adjusting film of the parallel arm resonator p1.

With this configuration, a portion of the pass band and attenuation pole near the pass band is provided by the combined characteristics of the two parallel arm resonators p1, p2 having different frequencies. Since the above-described combined characteristics have the characteristics of a resonant band (|fa*−fr*|) narrower than the resonant band width (fa−fr) of each of the two parallel arm resonators p1, p2, the two parallel arm resonators p1, p2 are preferably designed to have a wide resonant band width. Thus, when the Ksaw adjusting film of the parallel arm resonator p1 in the parallel arm circuit 210D is the same or substantially the same as Ksaw adjusting film of the series arm resonator s1, the two parallel arm resonators p1, p2 are designed to have a wide resonant band width for the combined characteristics of the two parallel arm resonators p1, p2.

A frequency change to narrow the resonant band width relative to the other SW operation is provided by any one of the on/off operations of the switch SW. At this time, when the resonant band width is widened by designing the Ksaw adjusting film of the parallel arm resonator p1 with a reduced thickness, a wide variable frequency width is obtained.

Figure 22:
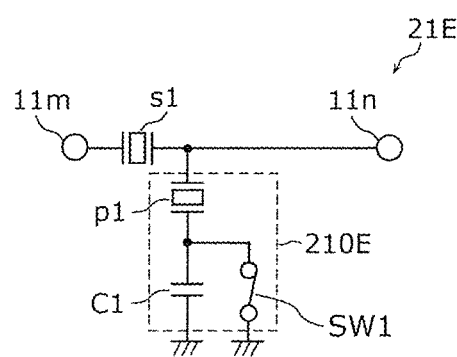
FIG. 22 is a circuit configuration diagram of an acoustic wave filter according to a fourth modification of the fifth preferred embodiment of the present invention.

FIG. 22 is a circuit configuration diagram of an acoustic wave filter 21E according to a fourth modification of the fifth preferred embodiment.

The acoustic wave filter 21E shown in the diagram includes a parallel arm circuit 210E, instead of the parallel arm circuit 210A that the acoustic wave filter 21A shown in FIG. 18A includes. When the parallel arm circuit 210E is compared with the parallel arm circuit 210A, only one parallel arm resonator is provided.

With the above configuration, in the acoustic wave filter 21E, when the switch SW1 is in the off state, the attenuation pole on the lower side of the pass band shifts to the higher side than that when the switch SW1 is in the on state. With this configuration, the acoustic wave filter 21E is a variable frequency filter whose lower edge of the pass band is variable.

The acoustic wave filter 10 according to the first preferred embodiment is applicable to the acoustic wave filter 21E having the above-described configuration and filter characteristics.

The acoustic wave filter 21E includes not only the circuit configuration shown in FIG. 22, but also the series arm resonator s2 provided in the series arm that connects the series arm resonator s1 and the input/output terminal 11n.

The series arm resonator s2 includes the second adjusting film that adjusts Ksaw. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided in the series arm resonator s1 or, when the first adjusting film that adjusts Ksaw is provided in the series arm resonator s1, the first adjusting film is thinner than the second adjusting film (the film thickness of the first adjusting film is less than the film thickness of the second adjusting film).

With the above configuration, a tunable filter that is able to ensure a wide stop band on the higher side of the pass band while ensuring steepness on the higher side of the pass band with the attenuation pole of the series arm resonator s2 and to obtain sufficient attenuation in the stop band is provided.

An adjusting film need not be provided in any of the series arm resonator s1 and the parallel arm resonator p1, or the film thickness of the Ksaw adjusting film of the series arm resonator s1 may preferably be equal or substantially equal to the film thickness of the Ksaw adjusting film of the parallel arm resonator p1.

With this configuration, a frequency change to narrow the resonant band width relative to the other SW operation is provided by any one of the on/off operations of the switch SW. At this time, when the resonant band width is widened by designing the Ksaw adjusting film of the parallel arm resonator p1 with a reduced thickness, a wide variable frequency width is obtained.

Figure 23:
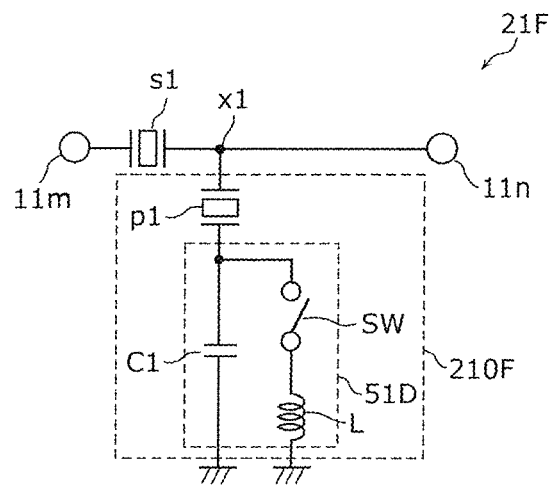
FIG. 23 is a circuit configuration diagram of an acoustic wave filter according to a fifth modification of the fifth preferred embodiment of the present invention.

FIG. 23 is a circuit configuration diagram of an acoustic wave filter 21F according to a fifth modification of the fifth preferred embodiment.

The acoustic wave filter 21F shown in the diagram includes a parallel arm circuit 210F, instead of the parallel arm circuit 210E that the acoustic wave filter 21E shown in FIG. 22 includes. The parallel arm circuit 210F differs from the parallel arm circuit 210E in that the inductor L is connected in series with the switch SW.

In this modification, the inductor L is added to the parallel arm resonator p1 when the switch SW is in the on state, and the capacitive element C1 is added to the parallel arm resonator p1 when the switch SW is in the off state. Therefore, the resonant frequency of the parallel arm circuit 210F shifts to the lower side than the resonant frequency of the parallel arm resonator p1 alone when the switch SW is in the off state, and shifts to the higher side than the resonant frequency of the parallel arm resonator p1 alone when the switch SW is in the off state. Thus, when the acoustic wave filter 21F according to the present modification is compared with the acoustic wave filter 21E according to the fourth modification, the variable frequency width of the pass band is widened.

The acoustic wave filter 10 according to the first preferred embodiment is applicable to the acoustic wave filter 21F having the above-described configuration and filter characteristics.

The acoustic wave filter 21F includes not only the circuit configuration shown in FIG. 23, but also the series arm resonator s2 provided in the series arm that connects the series arm resonator s1 and the input/output terminal 11n.

The series arm resonator s2 includes the second adjusting film that adjusts Ksaw. The anti-resonant frequency (fas1) of the series arm resonator s1 is higher than the anti-resonant frequency (fas2) of the series arm resonator s2 (fas1>fas2). In addition, an adjusting film that adjusts Ksaw is not provided in the series arm resonator s1 or, when the first adjusting film that adjusts Ksaw is provided in the series arm resonator s1, the first adjusting film is thinner than the second adjusting film (the film thickness of the first adjusting film is less than the film thickness of the second adjusting film).

With the above configuration, a tunable filter that is able to ensure a wide stop band on the higher side of the pass band while ensuring steepness on the higher side of the pass band with the attenuation pole of the series arm resonator s2 and to obtain sufficient attenuation in the stop band is provided.

An adjusting film need not be provided in any of the series arm resonator s1 and the parallel arm resonator p1, or the film thickness of the Ksaw adjusting film of the series arm resonator s1 may preferably be equal or substantially equal to the film thickness of the Ksaw adjusting film of the parallel arm resonator p1.

With this configuration, a frequency change to narrow the resonant band width relative to the other SW operation is provided by any one of the on/off operations of the switch SW. At this time, when the resonant band width is widened by designing the Ksaw adjusting film of the parallel arm resonator p1 with a reduced thickness, a wide variable frequency width is obtained.

Sixth Preferred Embodiment

In a sixth preferred embodiment of the present invention, a configuration in which the tunable acoustic wave filter according to the fifth preferred embodiment is applied to a multiplexer will be described.

In the multiplexer according to the present preferred embodiment, the tunable acoustic wave filter according to the fifth preferred embodiment is applied as the acoustic wave filter 21 of the multiplexer 1 according to the fourth preferred embodiment.

Figure 24A:
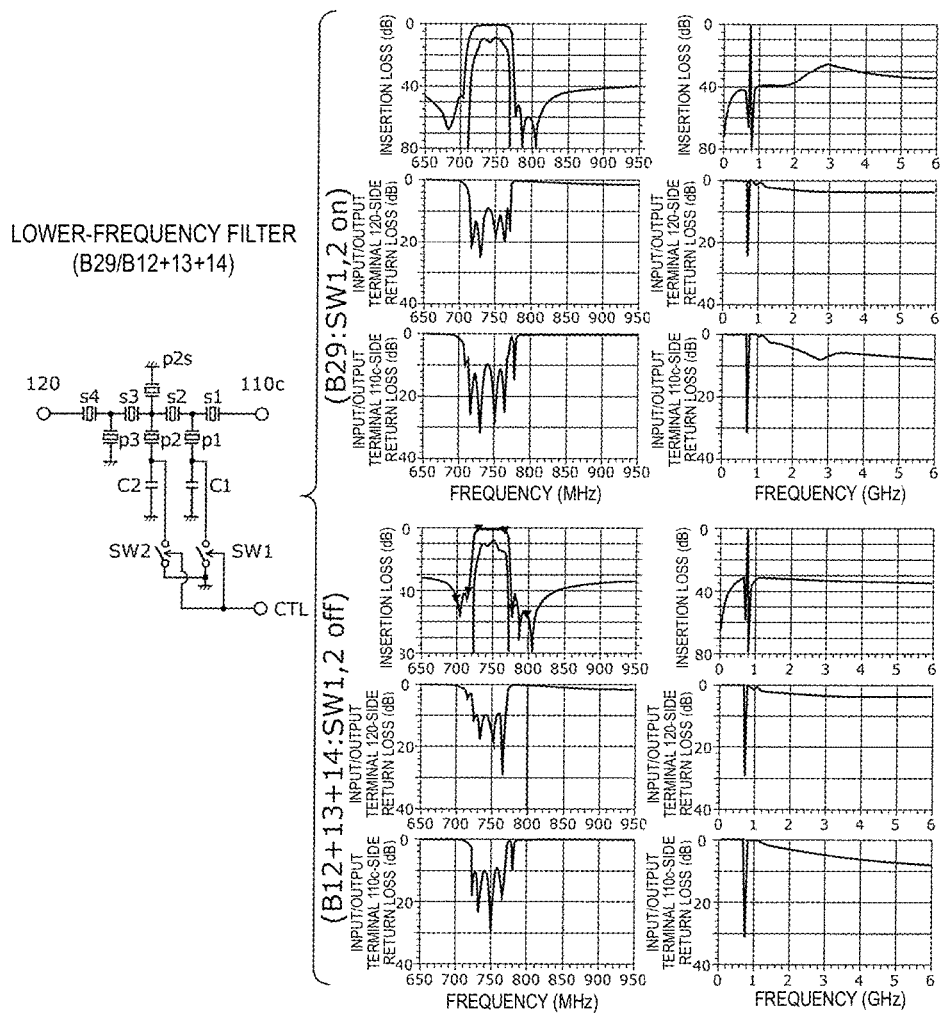
FIG. 24A shows graphs of the bandpass characteristics and reflection characteristics of a lower-frequency filter of a multiplexer according to a sixth preferred embodiment of the present invention.
Figure 24B:
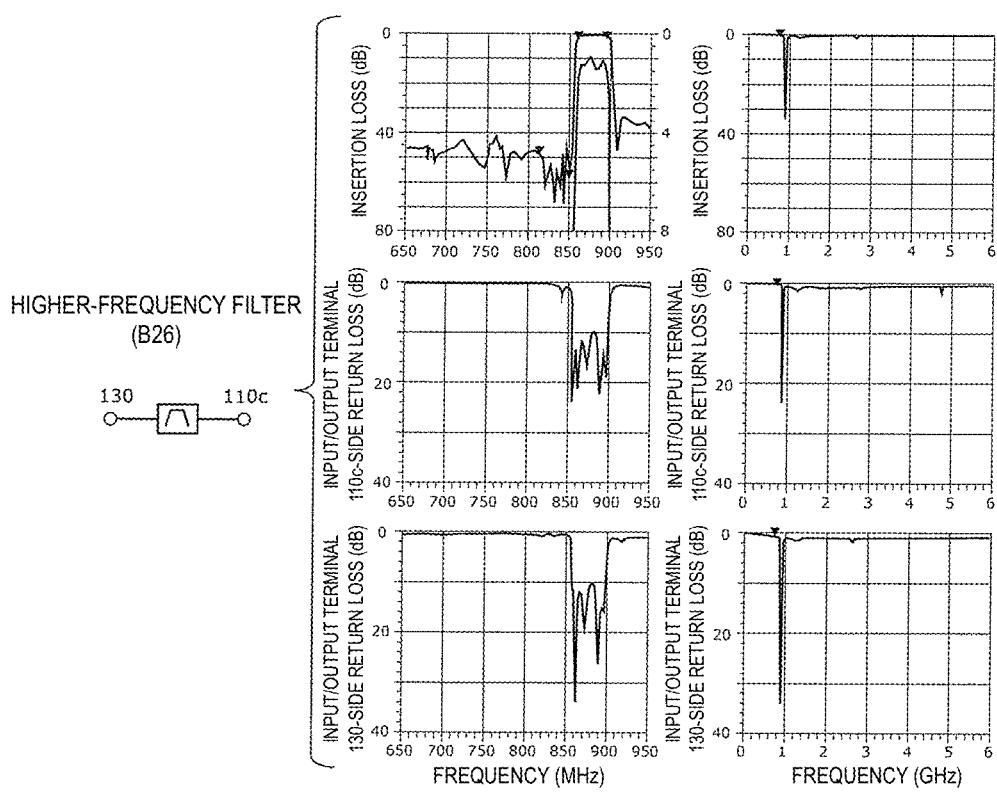
FIG. 24B shows graphs of the bandpass characteristics and reflection characteristics of a higher-frequency filter of the multiplexer according to the sixth preferred embodiment of the present invention.

FIG. 24A shows graphs of the bandpass characteristics and reflection characteristics of a lower-frequency filter alone of the multiplexer according to the sixth preferred embodiment. FIG. 24B shows graphs of the bandpass characteristics and reflection characteristics of a higher-frequency filter alone of the multiplexer according to the sixth preferred embodiment.

The acoustic wave filter 21 (lower-frequency filter) that is a component of the multiplexer according to the present preferred embodiment is preferably, for example, a tunable filter for Band 29Rx/Band 12Rx+13Rx+14Rx, as shown on the left side of FIG. 24A. The filter 22 (higher-frequency filter) is a bandpass filter for Band 26Rx, as shown on the left side of FIG. 24B.

The acoustic wave filter 21 (lower-frequency filter) includes the four series arm resonators s1 to s4, the three parallel arm resonators p1 to p3, a parallel arm resonator p2s connected in parallel with the parallel arm resonator p2, and variable frequency circuits respectively connected to the parallel arm resonators p1, p2. The variable frequency circuit connected to the parallel arm resonator p1 includes the capacitor C1 connected to the parallel arm resonator p1, and the switch SW1 connected in parallel with the capacitor C1. The variable frequency circuit connected to the parallel arm resonator p2 includes a capacitor C2 connected to the parallel arm resonator p2, and the switch SW2 connected in parallel with the capacitor C2.

With the above configuration, as shown in FIG. 24A, the acoustic wave filter 21 (lower-frequency filter) has preferably filter characteristics, for example, such that Band 29 is set for the pass band when the switches SW1, SW2 are in the on state, and preferably has filter characteristics, for example, such that Band 12+13+14 are set for the pass band when the switches SW1, SW2 are in the off state.

On the other hand, as shown in FIG. 24B, the filter 22 (higher-frequency filter) has preferably filter characteristics, for example, such that Band 26 is set for the pass band.

In the acoustic wave filter 21 (lower-frequency filter) according to the present preferred embodiment, the series arm resonators s2 to s4 include the second adjusting film that adjusts Ksaw. The anti-resonant frequency (fas1) of the series arm resonator s1 is higher than the anti-resonant frequencies (fas2, fas3, fas4) of the series arm resonators s2 to s4 (fas1>fas2, fas3, fas4). In addition, an adjusting film that adjusts Ksaw is not provided in the series arm resonator s1 or, when the first adjusting film that adjusts Ksaw is provided in the series arm resonator s1, the first adjusting film is thinner than the second adjusting film (the film thickness of the first adjusting film is less than the film thickness of the second adjusting film). In the acoustic wave filter 21 (lower-frequency filter) according to the present preferred embodiment, the acoustic wave resonator connected closest to the common terminal 110c is the series arm resonator s1.

In contrast, in an acoustic wave filter (lower-frequency filter) that is a multiplexer according to a Comparative Example 9 includes, the configuration of each of the series arm resonators s1 to s4 is the same or substantially the same as the configuration of each of the series arm resonators s1 to s4 that the acoustic wave filter 21 (lower-frequency filter) according to the present preferred embodiment includes. However, in the acoustic wave filter (lower-frequency filter) according to the Comparative Example 9, the acoustic wave resonator that is connected closest to the common terminal 110c is the series arm resonator s4.

Table 2 shows parameters of the series arm resonators s1 to s4, parallel arm resonators p1 to p3, p2s, and capacitors C1, C2.

TABLE 2

| | RESONANT FREQUENCY fr (MHz) | ANTI-RESONANT FREQUENCY fa (MHz) | ELECTRO-STATIC CAPACITANCE (pF) | Ksaw ADJUSTING FILM (nm) |
|---|---|---|---|---|
| SERIES ARM RESONATOR s1 | 741 | 803 | 1.61 | 0 |
| SERIES ARM RESONATOR s2 | 754 | 787 | 2.16 | 25 |
| SERIES ARM RESONATOR s3 | 746 | 778 | 2.39 | 25 |

TABLE 2-continued

| | RESONANT FREQUENCY fr (MHz) | ANTI-RESONANT FREQUENCY fa (MHz) | ELECTRO-STATIC CAPACITANCE (pF) | Ksaw ADJUSTING FILM (nm) |
|---|---|---|---|---|
| SERIES ARM RESONATOR s4 | 744 | 776 | 5.98 | 25 |
| PARALLEL ARM RESONATOR p1 | 685 | 743 | 6.98 | 0 |
| PARALLEL ARM RESONATOR p2 | 689 | 747 | 6.99 | 0 |
| PARALLEL ARM RESONATOR p3 | 702 | 732 | 4.7 | 25 |
| PARALLEL ARM RESONATOR p4 | 802 | 869 | 0.2 | 0 |
| CAPACITOR C1 | | | 6.3 | 0 |
| CAPACITOR C2 | | | 102 | 0 |

Figure 25A:
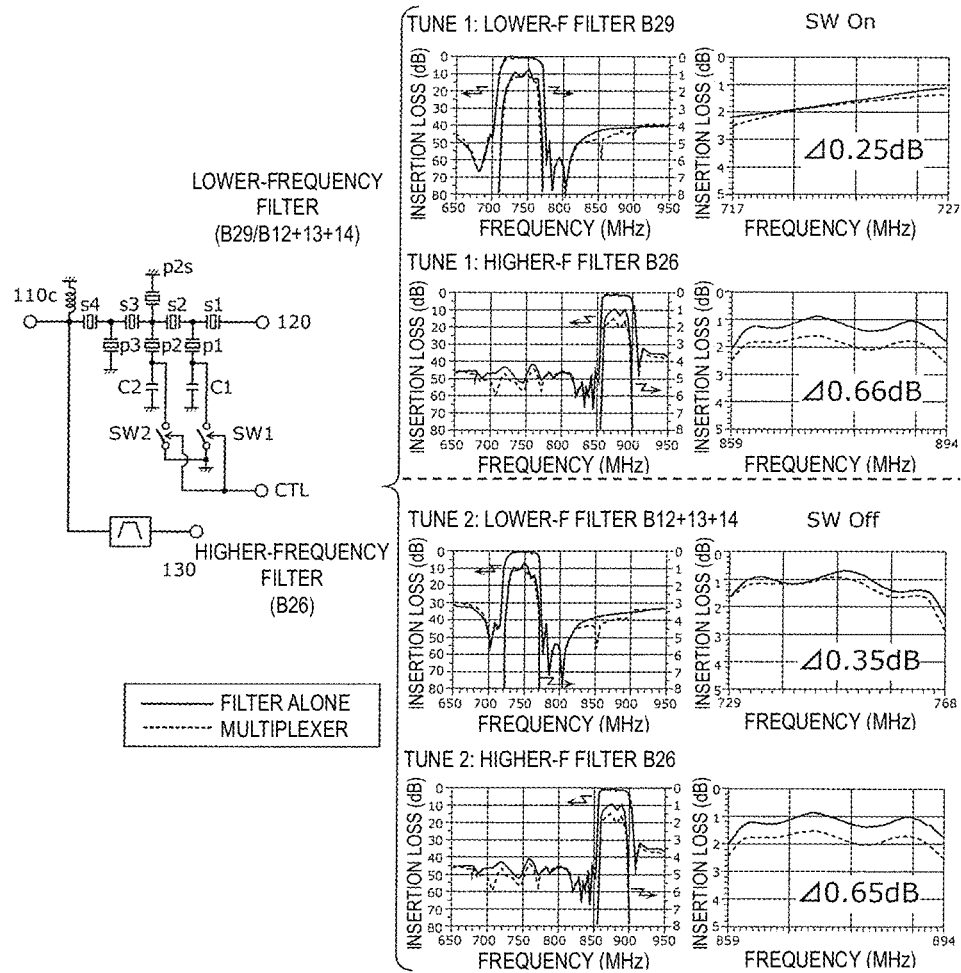
FIG. 25A shows graphs of the bandpass characteristics of a multiplexer according to a Comparative Example 9 of the sixth preferred embodiment of the present invention.
Figure 25B:
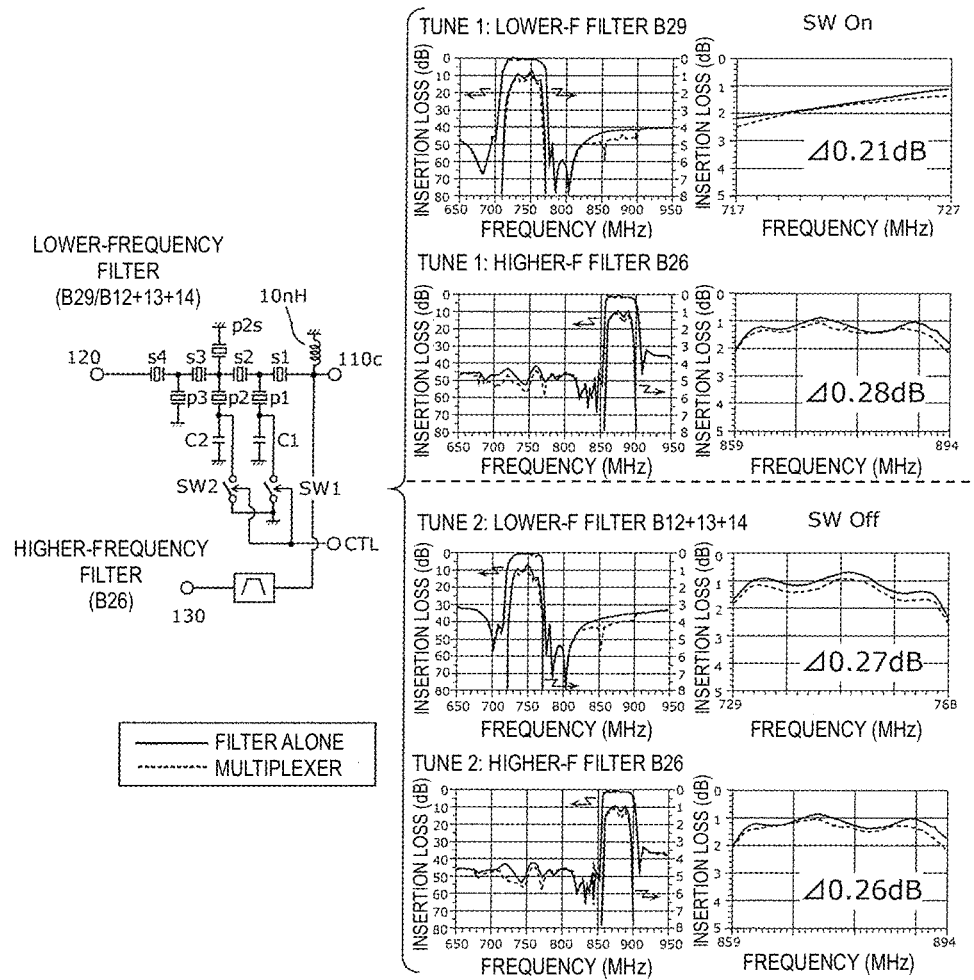
FIG. 25B shows graphs of the bandpass characteristics of a multiplexer according to an Example of the sixth preferred embodiment of the present invention.

FIG. 25A shows graphs of the bandpass characteristics of the multiplexer according to the Comparative Example 9. On the other hand, FIG. 25B shows graphs of the bandpass characteristics of the multiplexer according to the sixth preferred embodiment. The multiplexer according to the Comparative Example 9 and the multiplexer according to the sixth preferred embodiment each exhibit the characteristics of the multiplexer of Band 29Rx and Band 26Rx when SW1 and SW2 are in the on state (Tune1) and exhibit the characteristics of the multiplexer of Band 12Rx+13Rx+14Rx and Band 26Rx when the switches SW1, SW2 are in the off state (Tune2). When the characteristics of the acoustic wave filter (lower-frequency filter) alone shown in FIG. 24A and the characteristics of the acoustic wave filter (lower-frequency filter) as the multiplexer shown in FIGS. 25A and 25B are compared with each other, an insertion loss in the pass band gets worse in both the Comparative Example 9 and the present preferred embodiment. This may be caused by a loss due to an impedance matching inductor, which is inserted between the common terminal 110c and the ground (reference electrode).

However, in the Comparative Example 9, particularly, as for a loss in Band 26 in the filter 22, worsening of a loss by about 0.66 dB (Tune 1) and about 0.65 dB (Tune2) is seen as compared to the filter alone. This is caused by, as described above, a bulk wave loss of the acoustic wave filter 21 (lower-frequency filter).

On the other hand, in the present preferred embodiment, as for a loss in Band 26 in the filter 22, worsening of a loss by about 0.28 dB (Tune1) and about 0.26 dB (Tune 2) is seen as compared to the filter alone, and this is the same or substantially the same level as the amount of deterioration of about 0.27 dB in the acoustic wave filter 21 (lower-frequency filter). That is, this is the same or substantially the same level as a loss due to the impedance matching inductor, such that it is clear that the loss is not affected by the bulk wave loss that arises in the acoustic wave filter 21 (lower-frequency filter).

With this configuration, for example, when a carrier aggregation of Band 29Rx and Band 26Rx, a carrier aggregation of Band 12Rx+13Rx+14Rx and Band 26Rx, or other suitable carrier aggregation, is performed, good communication characteristics are obtained.

Seventh Preferred Embodiment

The acoustic wave filters described in the first to third, and fifth preferred embodiments and the multiplexers described the fourth and sixth preferred embodiments are applicable to a radio-frequency front-end circuit, or other devices.

In a seventh preferred embodiment of the present invention, such a radio-frequency front-end circuit will be described.

Figure 26:
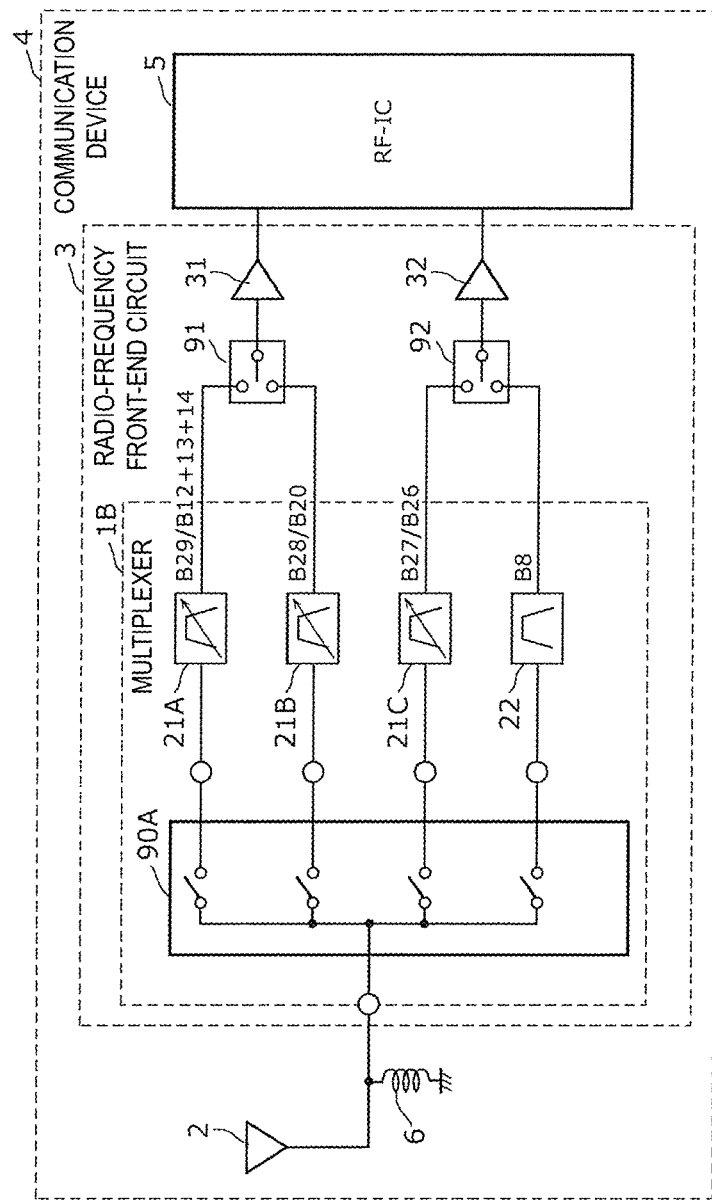
FIG. 26 is a configuration diagram of a communication device according to a seventh preferred embodiment of the present invention.

FIG. 26 is a configuration diagram of a communication device 4 according to the seventh preferred embodiment. The communication device 4 shown in the diagram includes a radio-frequency front-end circuit 3, an antenna element 2, an RF signal processing circuit (RFIC) 5, and a matching inductor 6. The antenna element 2, the radio-frequency front-end circuit 3, and the RFIC 3 are preferably, for example, disposed at a front-end portion of a cellular phone that supports multiband/multimode functionality.

The antenna element 2 is an antenna that supports multiband functionality compliant with communication standards, such as LTE, and that transmits or receives radio-frequency signals. The antenna element 2, for example, does not need to support all of the bands of the communication device 4, and may support only a band of a lower-frequency band group or a higher-frequency band group. The antenna element 2 need not be incorporated in the communication device 4.

The RFIC 5 is an RF signal processing circuit that processes radio-frequency signals that are transmitted or received by the antenna element 2. Specifically, the RFIC 5 performs signal processing on a radio-frequency signal (here, radio-frequency reception signal) input from the antenna element 2 via a reception signal path of the radio-frequency front-end circuit 3 by down conversion, for example, and outputs the signal-processed and generated reception signal to a base band signal processing circuit (not shown). The RFIC 5 also performs signal processing on a transmission signal input from the base band signal processing circuit by up conversion, for example, and outputs the signal-processed and generated radio-frequency signal (here, radio-frequency transmission signal) to a transmission signal path (not shown) of the radio-frequency front-end circuit 3.

The radio-frequency front-end circuit 3 transfers radio-frequency signals between the antenna element 2 and the RFIC 5. Specifically, the radio-frequency front-end circuit 3 transfers a radio-frequency signal (here, radio-frequency transmission signal) output from the RFIC 5 to the antenna element 2 via the transmission signal path (not shown). The radio-frequency front-end circuit 3 transfers a radio-frequency signal (here, radio-frequency reception signal) received by the antenna element 2 to the RFIC 5 via the reception signal path. In the present preferred embodiment, the configuration in which the acoustic wave filters according to the first to third, and fifth preferred embodiments are provided in the reception signal path of the radio-frequency front-end circuit 3 will be described. However, the variable filters may be provided in the transmission signal path of the radio-frequency front-end circuit 3.

The radio-frequency front-end circuit 3 includes, in order from the antenna element 2 side, a switch group 90A including a plurality of switches, the acoustic wave filters 21A, 21B, 21C, 22, switches 91, 92, and amplifier circuits 31, 32.

The switch group 90A includes one or more switches (preferably a plurality of switches in the present preferred embodiment) that connect the antenna element 2 to a signal path that supports a predetermined band in response to a control signal from a control unit (not shown). The number of signal paths that are connected to the antenna element 2 is not limited to one, and may be a plurality. That is, the radio-frequency front-end circuit 3 may support carrier aggregation.

The acoustic wave filter 21A is preferably, for example, a tunable filter that supports Band 29Rx/Band 12Rx+13Rx+14Rx, a tunable filter that supports Band 28Rx/Band 20Rx, a tunable filter that supports Band 27Rx/Band 26Rx, or a filter that supports Band 8Rx.

The switch 91 connects the amplifier circuit 31 to the signal path that supports the predetermined band in response to a control signal from the controller (not shown). The switch 92 connects the amplifier circuit 32 to the signal path that supports the predetermined band in response to a control signal from the controller (not shown). The number of signal paths that are connected to the antenna element 2 is not limited to one, and may be a plurality. That is, the radio-frequency front-end circuit 3 may support carrier aggregation. With this configuration, a radio-frequency signal (here, radio-frequency reception signal) input from the antenna element 2 is passed through any one of the acoustic wave filters 21A, 21B, 21C, 22, amplified by the amplifier circuit 31 or the amplifier circuit 32, and output to the RFIC 5. An RFIC that supports a low band and an RFIC that supports a high band may preferably be provided separately.

The amplifier circuit 31 is preferably, for example, a low-noise amplifier that amplifies the electric power of a radio-frequency reception signal input from the switch 91. The amplifier circuit 32 is preferably, for example, a low-noise amplifier that amplifies the electric power of a radio-frequency reception signal input from the switch 92.

The radio-frequency front-end circuit 3 and communication device 4 include any one of the acoustic wave filters in the first to third, and fifth preferred embodiments. With this configuration, a wide stop band width near a pass band is ensured while high steepness at the lower edge or higher edge of the pass band is ensured, and sufficient attenuation is obtained.

The acoustic wave filter devices, multiplexers, radio-frequency front-end circuits, and communication devices according to the preferred embodiments of the present invention are described by way of the first to seventh preferred embodiments. However, the present invention is not limited to the above-described preferred embodiments. The present invention also encompasses other preferred embodiments provided by combining selected elements of the above-described preferred embodiments, modifications obtained by applying various alterations that are conceived of by persons skilled in the art to the above-described preferred embodiments without departing from the scope of the present invention, and various devices that include the acoustic wave filter devices, multiplexers, radio-frequency front-end circuits, or communication devices according to preferred embodiments of the present invention.

For example, in the acoustic wave filter devices, the multiplexers, the radio-frequency front-end circuits, or the communication devices, an inductor or a capacitor may be connected between elements. The inductor may include a wiring inductor provided by a wire that connects elements.

Preferred embodiments of the present invention are widely usable, for example, in communication equipment, such as cellular phones, as acoustic wave filter devices, multiplexers, radio-frequency front-end circuits, and communication devices having excellent higher-frequency attenuation characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
    a first input/output terminal and a second input/output terminal;
    a first series arm resonator and a second series arm resonator provided in a first path connecting the first input/output terminal and the second input/output terminal, the first series arm resonator and the second series arm resonator being acoustic wave resonators;
    a first parallel arm resonator provided in a second path connecting a ground and a first node connecting the first series arm resonator and the second series arm resonator; and
    a second parallel arm resonator provided in a third path connecting the ground and a second node in the first path; wherein
    each of the first series arm resonator and the second series arm resonator includes a piezoelectric body and an interdigital transducer electrode;
    of the first series arm resonator and the second series arm resonator, the second series arm resonator includes a second adjusting film between the piezoelectric body and the interdigital transducer electrode, the second adjusting film adjusts an electromechanical coupling coefficient;
    an anti-resonant frequency of the first series arm resonator is higher than an anti-resonant frequency of the second series arm resonator;
    an adjusting film that adjusts an electromechanical coupling coefficient is not provided between the piezoelectric body and interdigital transducer electrode of the first series arm resonator, or a first adjusting film that adjusts an electromechanical coupling coefficient and that is thinner than the second adjusting film is provided between the piezoelectric body and interdigital transducer electrode of the first series arm resonator;
    each of the first parallel arm resonator and the second parallel arm resonator includes a piezoelectric body and an interdigital transducer electrode;
    one of the first parallel arm resonator and the second parallel arm resonator includes a fourth adjusting film between the piezoelectric body and the interdigital transducer electrode, the fourth adjusting film adjusts an electromechanical coupling coefficient;
    a resonant frequency of another one of the first parallel arm resonator and the second parallel arm resonator is lower than a resonant frequency of the one of the first parallel arm resonator and the second parallel arm resonator;
    an adjusting film that adjusts an electromechanical coupling coefficient is not provided between the piezoelectric body and interdigital transducer electrode of the another one of the first parallel arm resonator and second parallel arm resonator, or a third adjusting film that adjusts an electromechanical coupling coefficient and that is thinner than the fourth adjusting film is provided between the piezoelectric body and interdigital transducer electrode of the other one of the first parallel arm resonator and the second parallel arm resonator;

a film thickness of the second adjusting film is equal or substantially equal to a film thickness of the fourth adjusting film; and the adjusting film is not provided in any of the first series arm resonator and the other one of the first parallel arm resonator and the second parallel arm resonator, or a film thickness of the first adjusting film is equal or substantially equal to a film thickness of the third adjusting film.

2. The acoustic wave filter device according to claim 1, wherein the first series arm resonator or the second series arm resonator is disposed between the first node and the second node.

3. The acoustic wave filter device according to claim 1, further comprising:
a variable frequency circuit connected to the first parallel arm resonator and configured to change a pass band provided by at least the first series arm resonator and the first parallel arm resonator; wherein
the variable frequency circuit includes:
an impedance element connected to the first parallel arm resonator; and
a switch configured to switch a conduction path of the variable frequency circuit.

4. The acoustic wave filter device according to claim 1, wherein
an adjusting film that adjusts an electromechanical coupling coefficient is not provided between the piezoelectric body and interdigital transducer electrode of the first parallel arm resonator, or the first parallel arm resonator includes the third adjusting film between the piezoelectric body and the interdigital transducer electrode;
the acoustic wave filter device further comprises a variable frequency circuit connected to the first parallel arm resonator and configured to change a pass band provided by at least the first series arm resonator and the first parallel arm resonator;
the variable frequency circuit is connected in series with the first parallel arm resonator; and
the variable frequency circuit includes:
a capacitor; and
a switch connected in parallel with the capacitor and configured to switch a conduction path of the variable frequency circuit.

5. The acoustic wave filter device according to claim 4, wherein
the capacitor includes a comb electrode provided on the piezoelectric body; and
an adjusting film made of an insulator or a dielectric is not provided between the piezoelectric body and comb electrode of the capacitor.

6. The acoustic wave filter device according to claim 1, wherein
the first parallel arm resonator includes the fourth adjusting film between the piezoelectric body and the interdigital transducer electrode, the fourth adjusting film adjusts the electromechanical coupling coefficient;
the acoustic wave filter device further comprises a variable frequency circuit connected to the first parallel arm resonator and configured to change a pass band provided by at least the first series arm resonator and the first parallel arm resonator;
the variable frequency circuit is connected in series with the first parallel arm resonator; and
the variable frequency circuit includes:
an inductor; and
a switch connected in parallel with the inductor and configured to switch a conduction path of the variable frequency circuit.

7. A multiplexer comprising:
a common terminal;
the acoustic wave filter device according to claim 1; and
a second filter whose pass band is at higher frequencies than a pass band of the acoustic wave filter device; wherein
the first input/output terminal and the second filter are connected to the common terminal;
the first series arm resonator is connected to the first input/output terminal; and
an electrostatic capacitance of the first series arm resonator is less than an electrostatic capacitance of the second series arm resonator.

8. The multiplexer according to claim 7, wherein
the second filter includes:
a third input/output terminal and a fourth input/output terminal; and
a third series arm resonator and a fourth series arm resonator provided in a fourth path connecting the third input/output terminal and the fourth input/output terminal, the third series arm resonator and the fourth series arm resonator being acoustic wave resonators;
the third input/output terminal is connected to the common terminal;
the third series arm resonator is connected to the third input/output terminal; and
an electrostatic capacitance of the third series arm resonator is less than an electrostatic capacitance of the fourth series arm resonator.

9. A radio-frequency front-end circuit comprising:
the acoustic wave filter device according to claim 1; and
an amplifier circuit connected to the acoustic wave filter device.

10. A communication device comprising:
an RF signal processing circuit configured to process a radio-frequency signal that is transmitted or received by an antenna element; and
the radio-frequency front-end circuit according to claim 9, the radio-frequency front-end circuit being configured to transfer the radio-frequency signal between the antenna element and the RF signal processing circuit.

* * * * *